US012593393B2

(12) United States Patent (10) Patent No.: US 12,593,393 B2
McKee et al. (45) Date of Patent: Mar. 31, 2026

(54) SELF-CONTAINED BALLAST DRIVER FOR RETROFITTING A LIGHTING SYSTEM WITH LED LIGHTS

(71) Applicant: Musco Corporation, Oskaloosa, IA (US)

(72) Inventors: Luke C. McKee, Oskaloosa, IA (US); Chris P. Lickiss, Newton, IA (US); Philip D. Hol, New Sharon, IA (US); Aric D. Klyn, Pella, IA (US); David J. Van Ee, Oskaloosa, IA (US); Kenneth G. Lewis, Jr., New Sharon, IA (US)

( * ) Notice: Subject to any disclaimer, the term of this patent is extended or adjusted under 35 U.S.C. 154(b) by 136 days.

(21) Appl. No.: 18/417,023

(22) Filed: Jan. 19, 2024

(65) Prior Publication Data

US 2024/0247795 A1 Jul. 25, 2024

Related U.S. Application Data

(60) Provisional application No. 63/520,133, filed on Aug. 17, 2023, provisional application No. 63/440,456, filed on Jan. 23, 2023.

(51) Int. Cl.
F21V 21/30 (2006.01)
F21K 9/20 (2016.01)
(Continued)

(52) U.S. Cl.
CPC .............. F21V 21/116 (2013.01); F21K 9/20 (2016.08); F21K 9/23 (2016.08); F21K 9/237 (2016.08);
(Continued)

(58) Field of Classification Search
CPC ........ F21V 21/30; F21V 29/508; F21V 29/70; F21V 15/01; F21V 17/10; F21V 23/008; F21V 23/026; F21K 9/20; F21K 9/275; F21K 9/278; F21K 9/238; F21K 9/235; F21K 9/237; F21K 9/69; F16C 11/103;
(Continued)

(56) References Cited

U.S. PATENT DOCUMENTS 6,601,975 B1 * 8/2003 Haugaard ............. F21V 23/026
362/265
D808,052 S 1/2018 Gordin et al.
(Continued)

OTHER PUBLICATIONS

Written Opinion of the International Searching Authority in PCT/US2024/012573, mailed Jun. 28, 2024, 9 pages.
(Continued)

*Primary Examiner* — Sagar Shrestha
*Assistant Examiner* — Peter Krim
(74) *Attorney, Agent, or Firm* — Kurt J. Fugman

(57) ABSTRACT

An apparatus for retrofitting a HID lighting system includes using existing components of previously installed HID lighting systems such as its ballasts while replacing some capacitors to adjust the power supplied to a retrofit LED luminaire. Unused ballast drivers are removed, and a self-contained ballast driver assembly is mounted into the electronic control enclosure of the previously installed lighting system. Some of the retrofit LED luminaires include an uplighting lens, an optic, or a diffuser for providing uplight. An aiming bracket and an aiming plate allow for the horizontal aiming angle of a light luminaire to be set.

16 Claims, 55 Drawing Sheets

(51) Int. Cl.

| | |
|---|---|
| *F21V 15/01* | (2006.01) |
| *F21V 21/116* | (2006.01) |
| *F21V 23/06* | (2006.01) |
| *H02G 3/08* | (2006.01) |
| *F21K 9/23* | (2016.01) |
| *F21K 9/237* | (2016.01) |
| *F21K 9/238* | (2016.01) |
| *F21K 9/278* | (2016.01) |
| *H02G 3/14* | (2006.01) |
| *H02G 3/16* | (2006.01) |
| *H05K 1/02* | (2006.01) |
| *H05K 1/14* | (2006.01) |
| *H05K 1/16* | (2006.01) |

(52) U.S. Cl.
CPC .............. *F21K 9/238* (2016.08); *F21K 9/278* (2016.08); *H02G 3/14* (2013.01); *H02G 3/16* (2013.01); *H05K 1/021* (2013.01); *H05K 1/144* (2013.01); *H05K 1/162* (2013.01)

(58) Field of Classification Search
CPC ...... F16M 11/2064; H02G 3/081; H02G 3/14; H02G 3/16; H05K 1/021; H05K 1/0306; H05K 1/144; H05K 1/162; H05K 1/181; H05K 5/02; H05K 5/0217; H05K 5/0221
See application file for complete search history.

(56) References Cited

U.S. PATENT DOCUMENTS

| | | | |
|---|---|---|---|
| D841,854 S | 2/2019 | Gordin et al. | |
| D841,855 S | 2/2019 | Gordin et al. | |
| D841,856 S | 2/2019 | Gordin et al. | |
| 10,337,693 B1 | 7/2019 | Gordin et al. | |
| 10,344,948 B1 | 7/2019 | Gordin et al. | |
| D873,462 S | 1/2020 | Gordin et al. | |
| D880,035 S | 3/2020 | Gordin et al. | |
| D882,141 S | 4/2020 | Gordin et al. | |
| D882,850 S | 4/2020 | Gordin et al. | |
| D892,375 S | 8/2020 | Gordin et al. | |
| D892,376 S | 8/2020 | Gordin et al. | |
| 11,262,036 B1 | 3/2022 | Hein et al. | |
| 11,306,861 B1 | 4/2022 | Drost et al. | |
| 2010/0195284 A1* | 8/2010 | Zheng | H01L 23/467 |
| | | | 361/697 |
| 2017/0125991 A1* | 5/2017 | Korcz | H02G 3/083 |
| 2021/0156533 A1 | 5/2021 | Bai | |
| 2021/0278062 A1 | 9/2021 | Gromotka et al. | |
| 2022/0049825 A1 | 2/2022 | Cai | |
| 2022/0285926 A1* | 9/2022 | Korcz | H02G 15/007 |
| 2022/0416530 A1 | 12/2022 | Gordin et al. | |
| 2024/0186911 A1* | 6/2024 | Kawashima | H02M 7/48 |

OTHER PUBLICATIONS

International Search Report in PCT/US2024/012573, mailed Jun. 28, 2024, 5 pages.

\* cited by examiner

644a

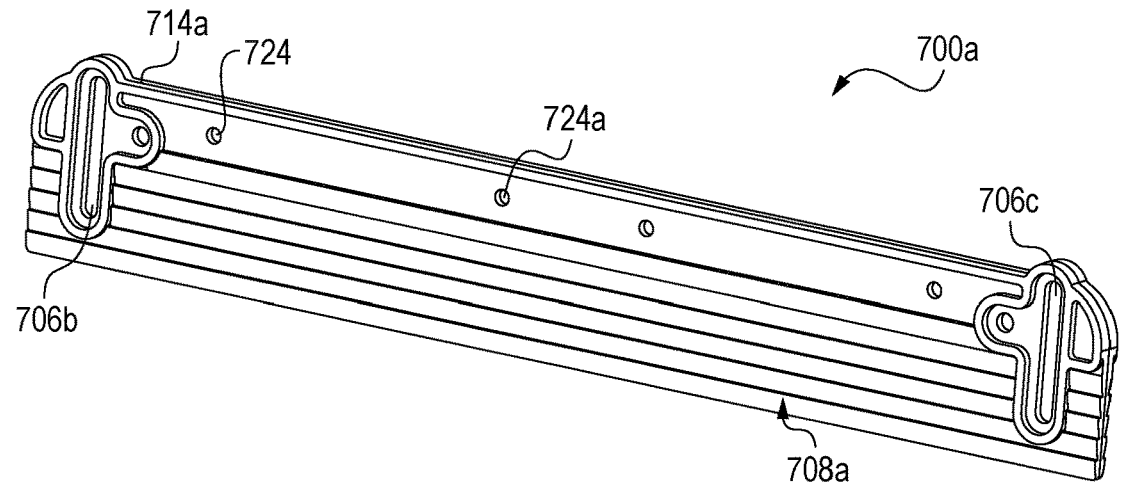
FIG. 48
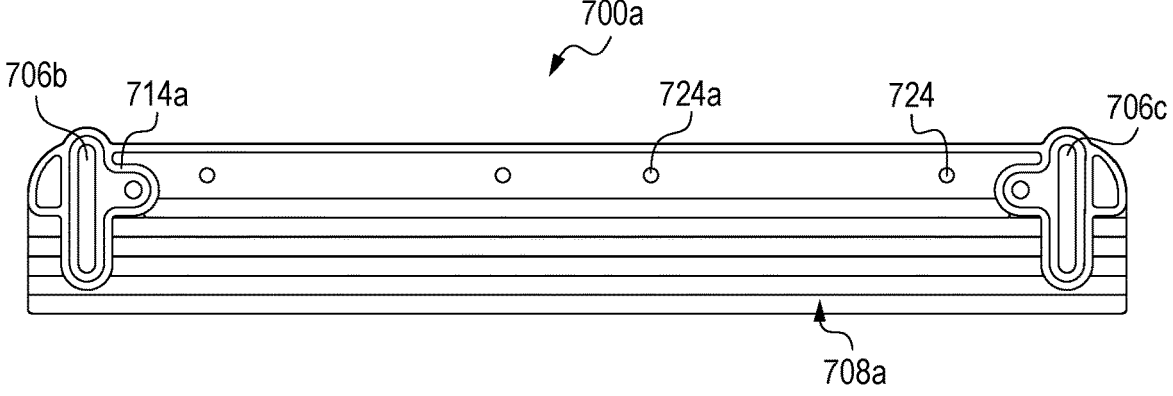
FIG. 49
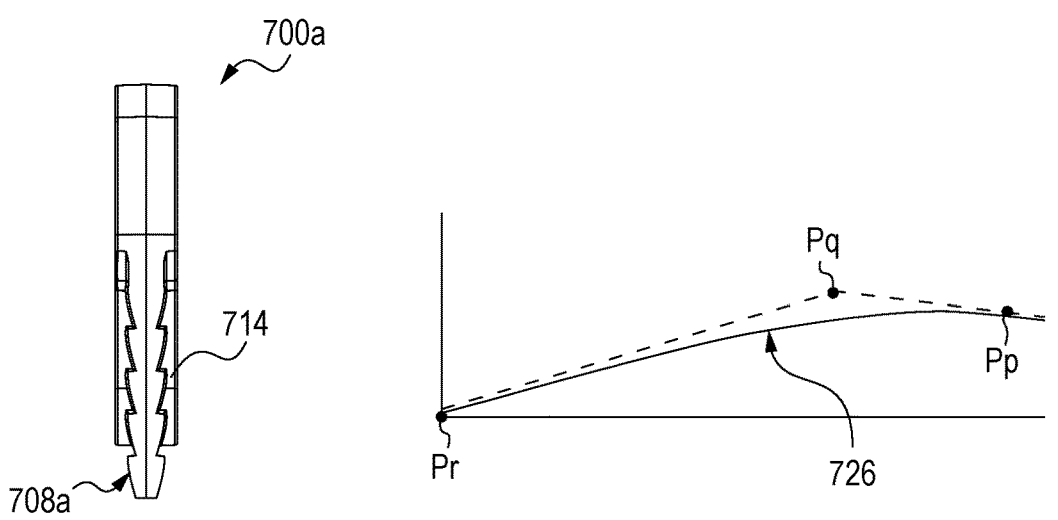
FIG. 50          FIG. 51

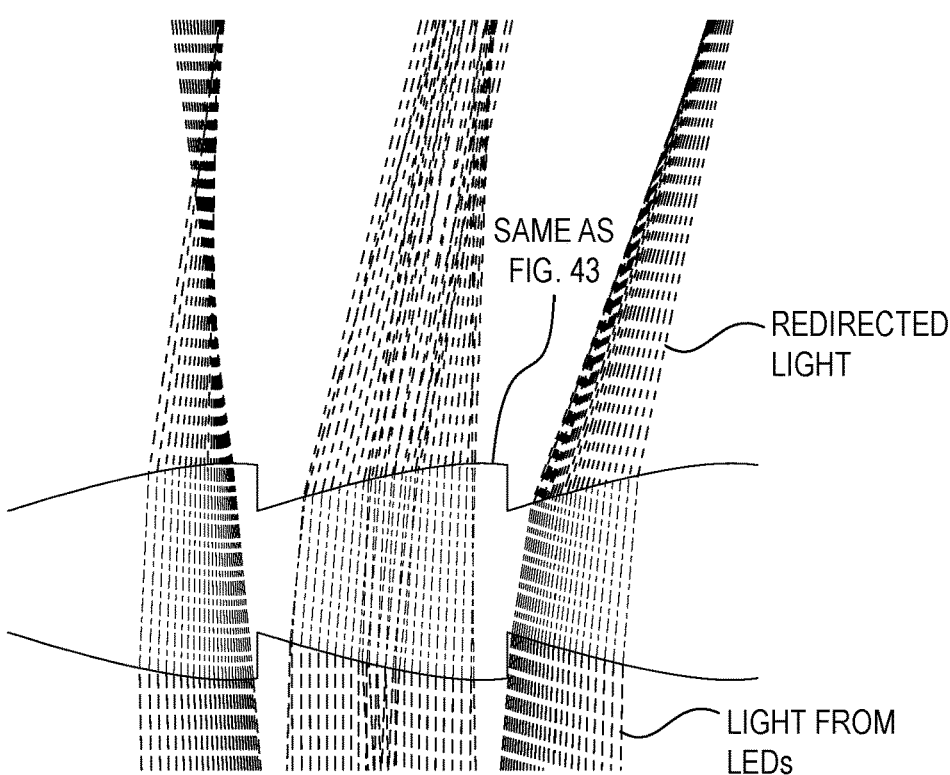
SAME AS
FIG. 43
REDIRECTED
LIGHT
LIGHT FROM
LEDs
FIG. 52
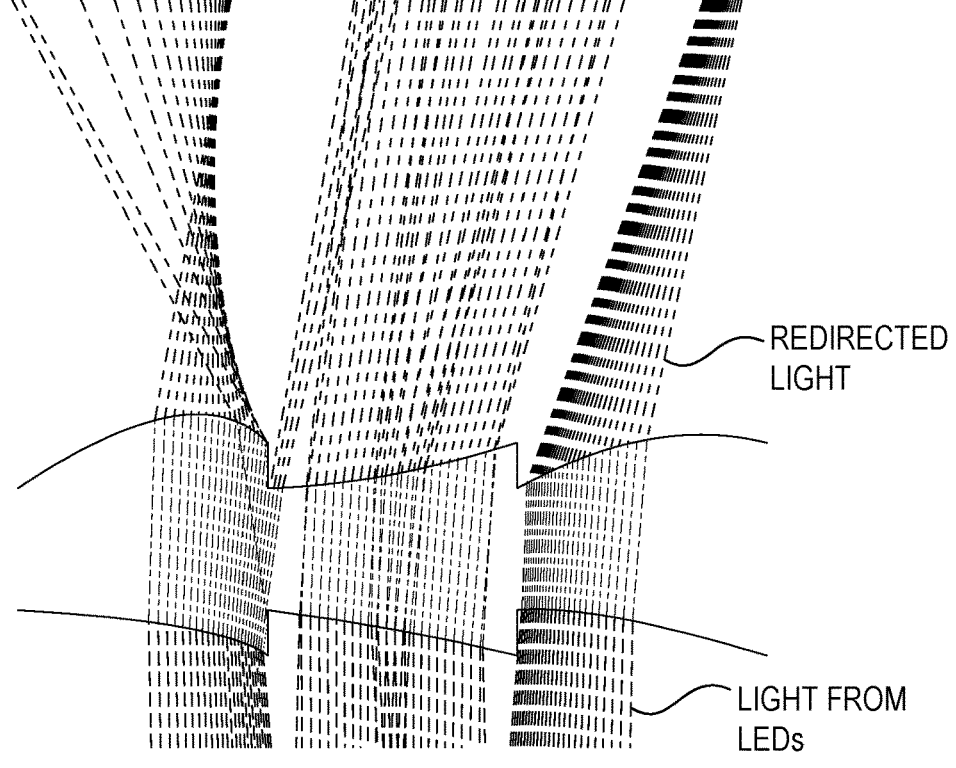
REDIRECTED
LIGHT
LIGHT FROM
LEDs
FIG. 53

FIRST
AXIS

SECOND
AXIS

CENTRAL
AXIS

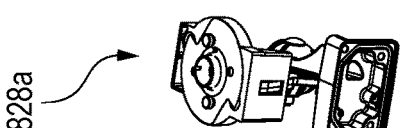
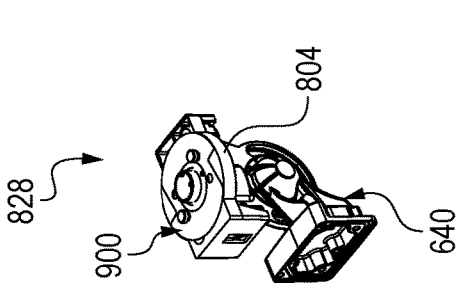
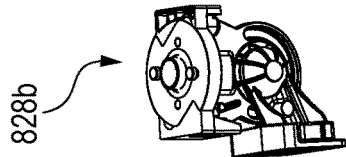
*FIG. 60*

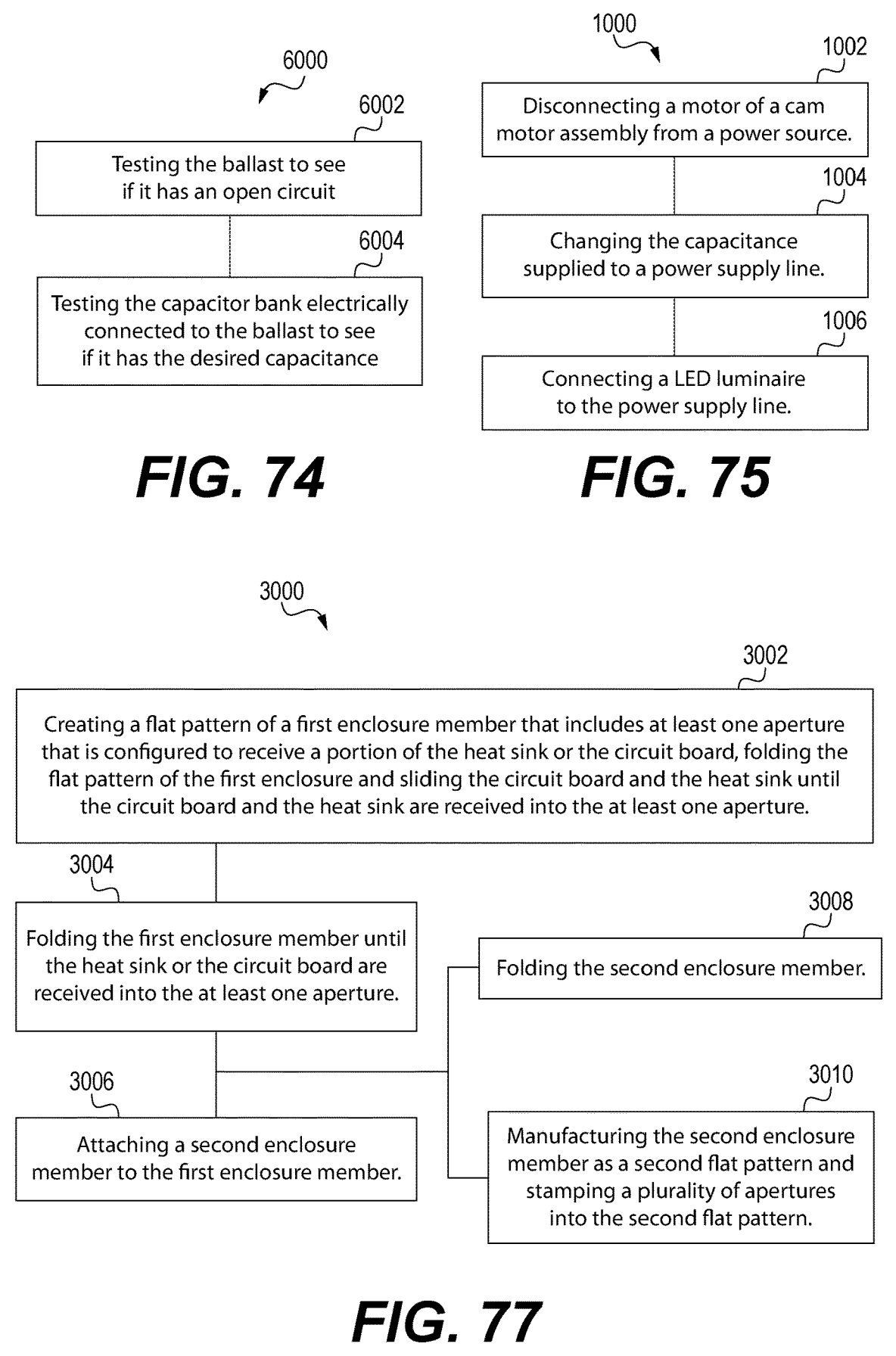

6000

6002

Testing the ballast to see
if it has an open circuit

6004

Testing the capacitor bank electrically
connected to the ballast to see
if it has the desired capacitance

Disconnecting a motor of a cam
motor assembly from a power source.

1004

Changing the capacitance
supplied to a power supply line.

1006

Connecting a LED luminaire
to the power supply line.

Creating a flat pattern of a first enclosure member that includes at least one aperture
that is configured to receive a portion of the heat sink or the circuit board, folding the
flat pattern of the first enclosure and sliding the circuit board and the heat sink until
the circuit board and the heat sink are received into the at least one aperture.

3004

Folding the first enclosure member until
the heat sink or the circuit board are
received into the at least one aperture.

3008

Folding the second enclosure member.

3006

Attaching a second enclosure
member to the first enclosure member.

3010

Manufacturing the second enclosure
member as a second flat pattern and
stamping a plurality of apertures
into the second flat pattern.

FIG. 77

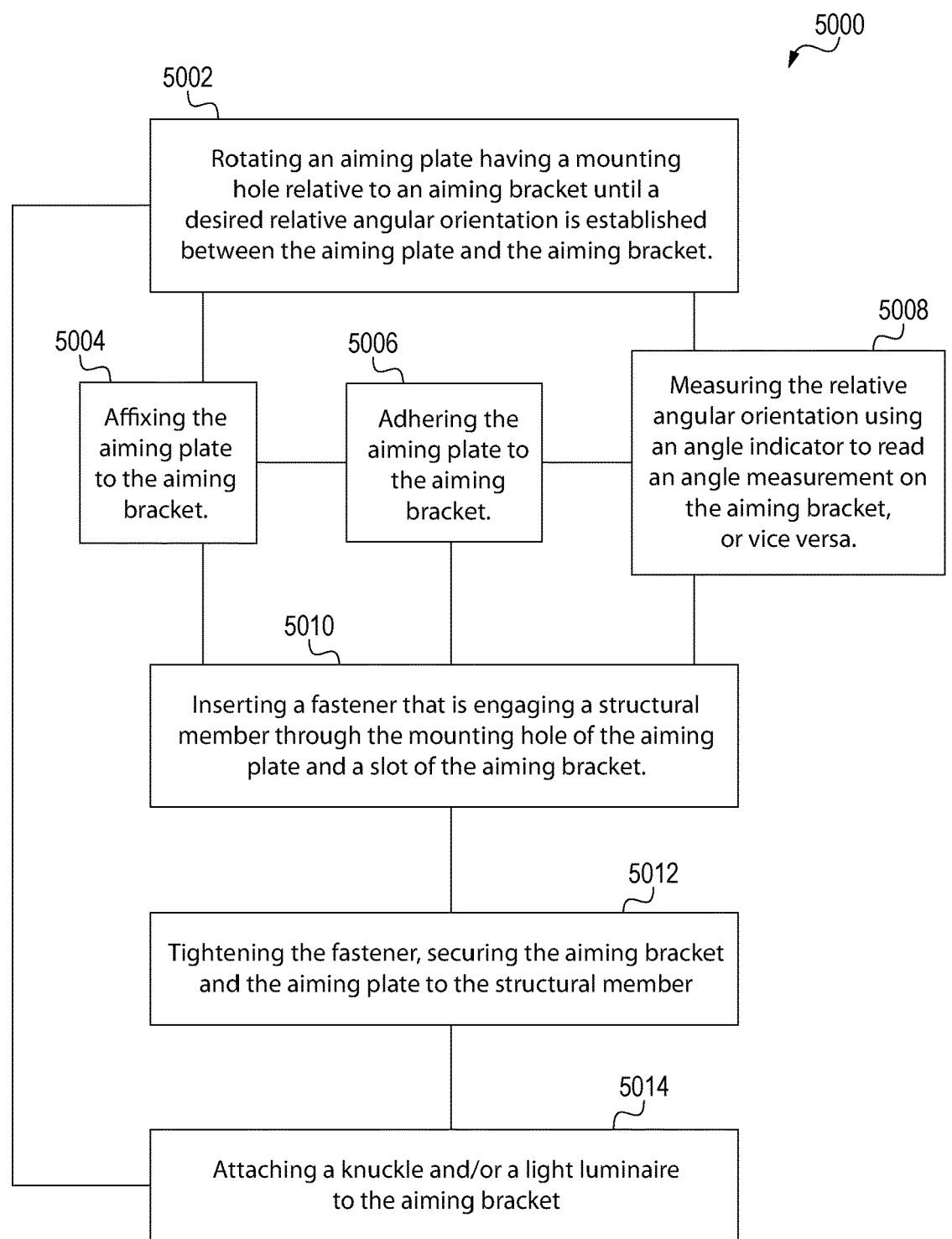

5000

5002

Rotating an aiming plate having a mounting hole relative to an aiming bracket until a desired relative angular orientation is established between the aiming plate and the aiming bracket.

5004

Affixing the aiming plate to the aiming bracket.

5006

Adhering the aiming plate to the aiming bracket.

5008

Measuring the relative angular orientation using an angle indicator to read an angle measurement on the aiming bracket, or vice versa.

5010

Inserting a fastener that is engaging a structural member through the mounting hole of the aiming plate and a slot of the aiming bracket.

5012

Tightening the fastener, securing the aiming bracket and the aiming plate to the structural member

5014

Attaching a knuckle and/or a light luminaire to the aiming bracket

SELF-CONTAINED BALLAST DRIVER FOR RETROFITTING A LIGHTING SYSTEM WITH LED LIGHTS

CROSS-REFERENCE TO RELATED APPLICATIONS

This application is related to and claims benefit of U.S. Provisional Applications Ser. No. 63/440,456, filed Jan. 23, 2023, and Ser. No. 63/520,133, filed Aug. 17, 2023, all of the content of which are hereby incorporated herein by reference in their entireties.

TECHNICAL FIELD

The disclosure generally relates to a system for replacing HID (high intensity discharge) lamps of a lighting system with LED (light emitting diodes). More specifically, the disclosure enables such a system that may be cost effective to install, that may use existing components of a lighting system previously installed, that may provide energy cost savings in use, that may provide comparable or better lighting, and that may provide possible uplighting.

BACKGROUND

Direct replacement of a light source generally occurs when an existing—usually failed—light source is replaced with another having similar power regulating and connection means. For example, the light source of a residential lighting fixture (e.g., a table lamp) may include a failed 60 W incandescent bulb which is replaced with a 100 W incandescent bulb. This is not a typical retrofit situation. A typical retrofit situation occurs when the light source being replaced is somehow different from the light source replacing it, usually in terms of power requirements.

If, for example, that same table lamp in which the failed 60 W incandescent bulb is instead replaced with a 15 W LED bulb (which has a comparable light output to a 100 W incandescent bulb), this would be a typical retrofit situation. The latter requires an onboard driver system so as to adapt the available AC to the DC power requirements of the LED source. However, it should be noted that the above example is a simple retrofit situation—the disparate power requirements are resolved without any other modification to the rest of the lighting system—as compared to other more complex lighting retrofit situations which lack such an elegant solution widely embraced by the market.

On the other hand, specialized lighting systems such as sports or wide area lighting systems require much more thought to replace. Unlike the example of a table lamp, there are no standard bulb shapes or sizes, no standard bulb base, and no standard incoming power. To the contrary, all of these features can differ from site to site and manufacturer to manufacturer. For example, a site might have 480 incoming voltage or 240 incoming voltage, or the incoming power might be three-phase or one-phase, or the existing lighting system might be a mix of HID lamps and sodium lamps of varying sizes and shapes, and the like. Lighting technology aside, power regulating means, connection means, and the aforementioned non-lighting technology portions of the existing lighting system such as poles, enclosures, wiring, and crossarms could also differ. As one example, an existing lighting system could include a solid wood pole with exposed wiring or a hollow steel pole with internal wiring. As another example, poles might be bolted to a plate on the ground, buried in the ground, or attached to some other feature in the lighting system (e.g., a truss system).

Therefore, a one-for-one replacement approach in the residential lighting retrofit market such as taking an old light source out and placing a new light source in with no other changes required is impractical for the specialized lighting retrofit market.

That being said, to date some manufacturers have attempted to take the one-for-one replacement approach in specialized lighting system retrofits. These efforts have largely been met with serious issues. For example, some manufacturers attempt to retain existing crossarms-even when one-for-one retrofit fixtures do not fit in the existing crossarm footprint. Doing so restricts the range of achievable horizontal and vertical aiming of retrofit fixtures, and often results in dark spots at the target area. This may compromise lighting uniformity. Some manufacturers drill new holes in existing crossarms to accommodate the footprint of one-for-one retrofit fixtures. Doing so often results in weakening of the crossarm, as well as introducing additional locations for moisture ingress, thereby compromising wiring and potentially increasing corrosion.

Thus, the art lacks a system for suitably retrofitting specialized lighting systems such as those that cover large exterior areas such as sports fields, ports, airports, railroads, or the like.

SUMMARY

A self-contained ballast driver assembly according to an embodiment of the present disclosure may comprise a circuit board, and an enclosure surrounding the circuit board that includes a five-sided cover, and a three-part mounting bracket.

A method for assembling an enclosure about a circuit board with a heat sink according to an embodiment of the present disclosure may comprise creating a flat pattern of a first enclosure member that includes at least one aperture that is configured to receive a portion of the heat sink or the circuit board, folding the first enclosure member and sliding the circuit board and the heat sink until the circuit board and the heat sink are received into the at least one aperture.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

The following drawings are illustrative of particular examples of the present disclosure and therefore do not limit the scope of the disclosure. The drawings are not necessarily to scale, though examples can include the scale illustrated, and are intended for use in conjunction with the explanations in the following detailed description wherein like reference characters denote like elements. Examples of the present disclosure will hereinafter be described in conjunction with the appended drawings.

FIGS. 3 and 4 also illustrate possible physical or photometric interference between fixtures on a common pole (represented by lines A and B), which may be avoided during the retrofit design process so as to permit full horizontal and vertical pivoting as well as avoiding producing light that is not useful, etc.

FIG. 48 is a perspective view of a lens configured according to another embodiment of the present disclosure shown in isolation.

FIG. 49 is a front view of the lens of FIG. 48.

FIG. 50 is a side view of the lens of FIG. 48.

FIG. 51 is a graph showing the curve forming a side surface of the light redirecting portion of the lens of FIG. 50.

FIG. 52 shows the incoming light to the lens of FIG. 50, the refraction of the light in the lens, and the redirection of the light as it exits the lens.

FIG. 53 shows the incoming light to a lens with a different profile with the same incoming light as shown in FIG. 52, the resulting different refraction of the light in the lens, and the resulting different redirection of the light as it exits the lens.

FIG. 60 is perspective view the aiming brackets, knuckles, aiming plates, and mounting hardware of FIG. 58 with the crossbeams removed.

FIG. 74 is a flow chart depicting a method for determining if a HID lighting system and some of its components are suitable or ready for retrofitting with a LED lighting system.

FIG. 75 contains a method for adjusting the capacitance supplied to a power line and the resulting power supplied to a LED luminaire using Smart Lamp® technology or a similar technology according to an embodiment of the present disclosure.

FIG. 77 contains a method for assembling an enclosure about a circuit board with a heat sink according to another embodiment of the present disclosure.

FIG. 79 depicts a method for aiming the horizontal direction of a knuckle that may be attached to a light luminaire such as a LED luminaire, a HID luminaire, etc.

DETAILED DESCRIPTION

Figure 1:
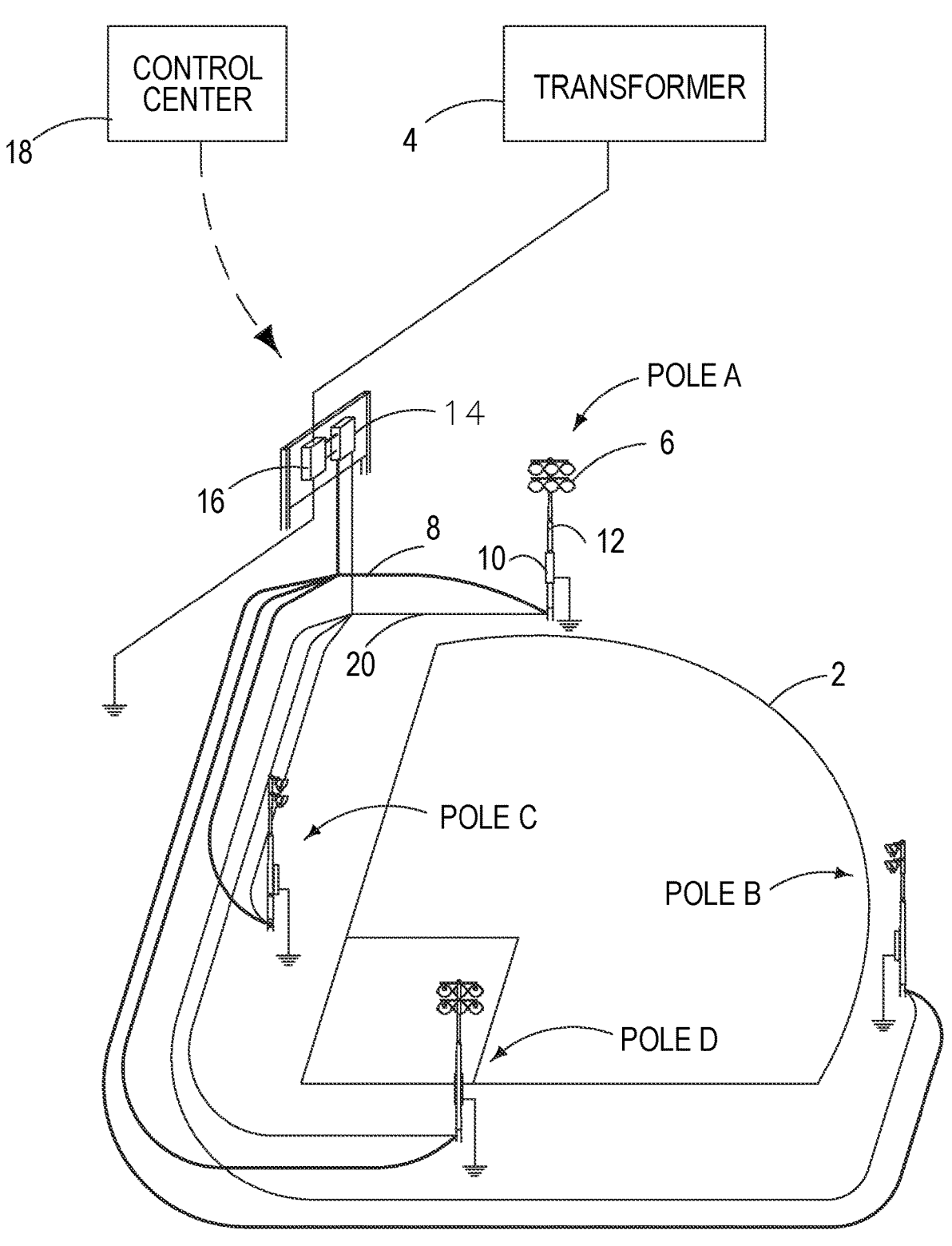
FIG. 1 illustrates a prior art system of an exterior lighting system that includes poles with HID (high intensity discharge) lamps attached thereto for lighting a sports field, and the area above the sports field. As shown, a baseball field or other sports field may be illuminated by the prior art system.

The following detailed description is exemplary in nature and is not intended to limit the scope, applicability, or configuration of the techniques or systems described herein in any way. Rather, the following description provides some practical illustrations for implementing examples of the techniques or systems described herein. Those skilled in the art will recognize that many of the noted examples have a variety of suitable alternatives.

To further an understanding of the present disclosure, specific exemplary embodiments according to the present disclosure will be described in detail. Frequent mention will be made in this description to the drawings. Reference numbers will be used to indicate certain parts in the drawings. Unless otherwise stated, the same reference numbers will be used to indicate the same parts throughout the drawings. Further, similar reference numbers (e.g., 702, 802, 902, 1002, 1102) will be used to indicate similar parts or functionality between embodiments. Reference numbers followed by letters (e.g., 100, 100*a*) may denote the same or similar features that may be symmetrical to each other, etc.

Regarding terminology, terms such as "means", "devices", "elements", "parts", "portions", "structure", "components", and "members" may be used interchangeably herein, in the singular or plural, by way of convenience and not depart from aspects of the present disclosure, nor place limiting effects on aspects of the present disclosure unless explicitly stated otherwise.

Also, terms such as "having", "including", "with", etc. or forms thereof are to be interpreted as being open, not limiting the parts of a structure that may be added to that structure. The term "generally linear", "linear array" or forms thereof are to be interpreted to include arrays of items such as LEDs that follow a sweep path that is at least partially straight or is slightly curved so that a tangent at one end of the array forms an angle with a tangent at another end of the array that is less than 40 degrees.

Also, a number of terms have been used for reasons of convenience or explanation that should not be considered limiting beyond that which is presented herein. For example, the terms "luminaire(s)" and "fixture(s)" are used interchangeably herein, as they often are in the lighting industry. Neither term is intended to purport any specific limitations beyond those which are described herein.

As another example, reference is given herein to "ballast(s)" and "driver(s)"; while both are power regulating means for lighting technology, the former is used herein with respect to HID light sources and the latter is used with respect to LED light sources. However, it should be noted that where aspects of the disclosure applied to other kinds of light source (e.g., laser diodes), the corresponding terminology for the power regulating means may differ. It should be generally understood that various embodiments of the present disclosure are directed to lighting system retrofits and so any specific reference to a type of light source or power regulating means should be given its broadest interpretation.

For example, a ballast could encompass magnetic ballasts, electronic ballasts, and generally any AC power conditioning means, whereas a driver could encompass generic drivers (i.e., simple DC power conditioning means), so-called smart drivers (i.e., complex DC power conditioning means that may include programmable features, self-healing components, active feedback loops, etc.), or something in between. All of the aforementioned possibilities are contemplated to be within the scope of the present disclosure.

Lastly regarding terminology, reference may be given herein to terms such as "ray(s)", "beam(s)", "beam pattern(s)", "beam shape(s)", "composite beam(s)", "beam design(s)", or the like. All of these terms make reference to light projected from a lighting fixture. It is to be understood that the nature of light is complex and that the terms herein may generally describe the shape of light as projected onto a target area from a lighting fixture, or the intensity in an aerial space above a target area, or the general direction of light as it leaves a luminaire, or the like. While specific descriptions and illustrations are provided herein, it is to be understood that none of these terms, descriptions, or illustrations are to be considered all-encompassing of lighting concerns one may encounter during a retrofit situation;

however, it should also be noted that all are commonly known terms and understood well in the art of lighting.

Overview

As previously stated herein, the present disclosure is directed to lighting system retrofits. More specifically, retrofits for specialized lighting systems are disclosed.

One such specialized lighting system is illustrated in FIGS. 1 thru 4. Here, a sports lighting system designed to illuminate a sports field 2 and some portion of the aerial space above the field is depicted. As can be seen from FIG. 1, site power is delivered via a transformer 4 or another device. Delivery of said power to HID fixtures 6 along power lines 8 is regulated and/or controlled at multiple points in the circuit (here, at a pole cabinet 10 (referred to later herein as an electrical component enclosure or ECE) on pole 12, at a control cabinet 14, and at a distribution cabinet 16).

If desired, additional control can be facilitated from an offsite control center 18 (e.g., via wireless communications to an antenna and control module located in control cabinet 14) such as is described in U.S. Pat. No. 7,209,958, or otherwise. Most sports lighting systems operate on three-phase power and require dedicated grounding 20, though as has been discussed, this varies widely from site to site. Power wiring is typically isolated from ground wiring (at least a portion of which may be integral to base 22) and, to the extent possible, internally routed to prevent theft and exposure to environmental effects.

Figures 2, 3, 4:
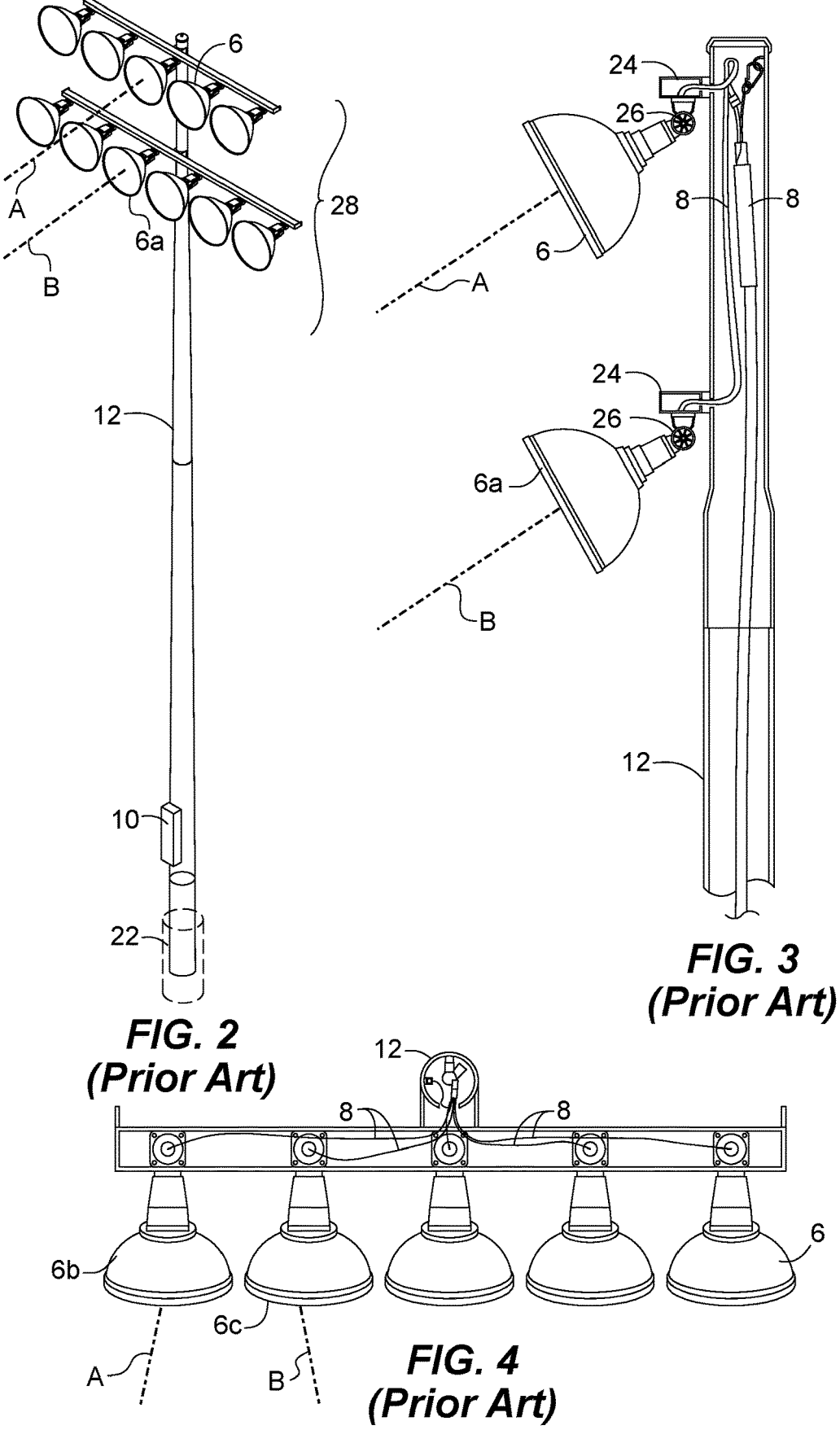
FIG. 2 depicts a pole, and its crossarms with the HID lamps attached thereto that are used in the prior art system of FIG. 1. Also, an electrical component enclosure and a grounding apparatus are also more clearly shown.
FIG. 3 is a side sectional view of the top portion of FIG. 2, revealing the wiring within the pole and the crossarms leading to the lamps.
FIG. 4 is a top sectional view of the top portion of FIG. 3, revealing more clearly the wiring within the top crossarm.

In FIGS. 2 thru 4, the wiring 8 is internally routed through pole 12, into crossarm 24, through adjustable armature 26, and to each HID fixture 6 that may be arranged in an array 28. This is adequate description of a specialized lighting system which may be retrofitted according to and benefit from aspects according to the present disclosure, though additional background information is available in U.S. Pat. Nos. 6,250,596, 7,600,901, 8,163,993, 8,337,058, and 8,770,796, etc.

Figures 5, 6:
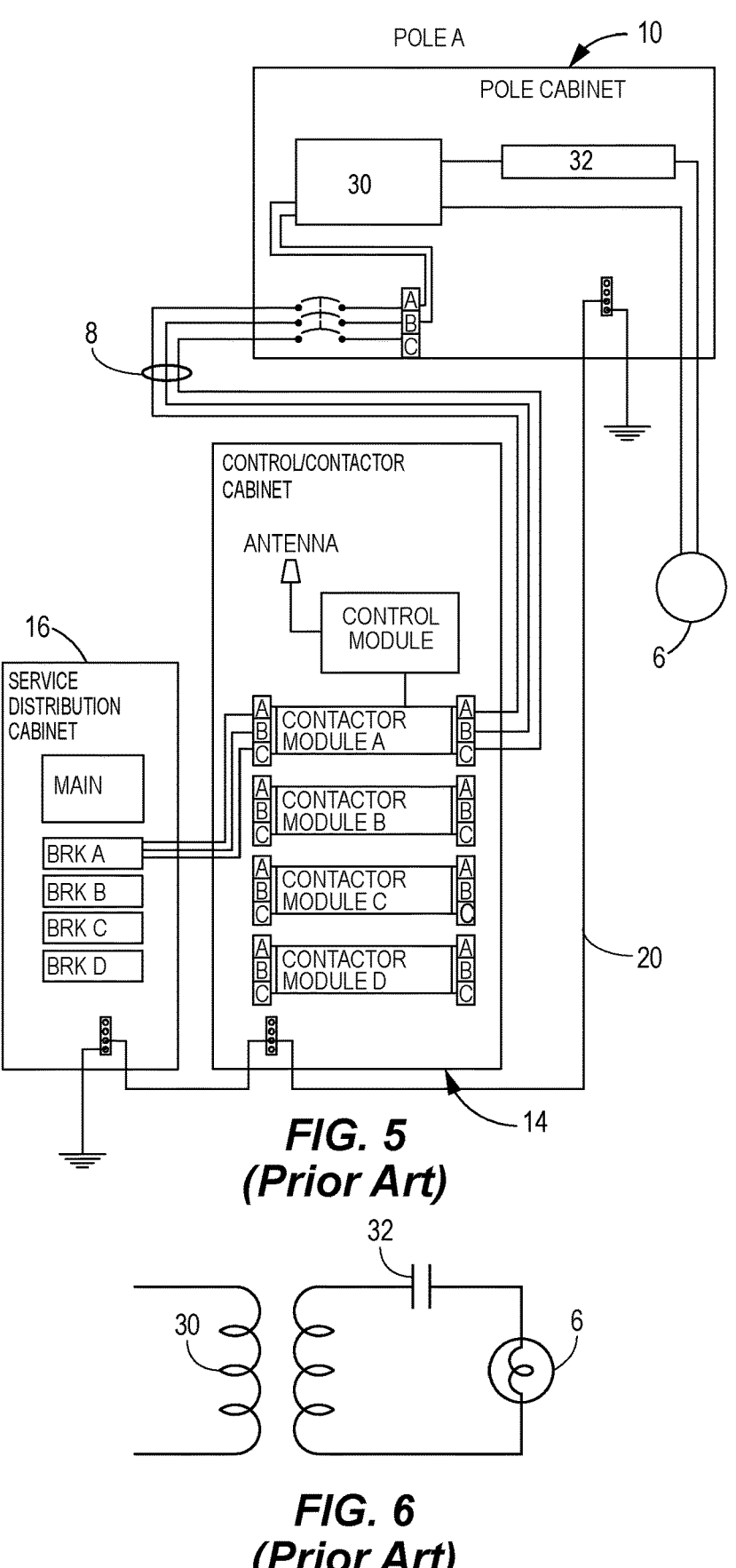
FIG. 5 is a schematic of the components contained in the electrical component enclosure of FIG. 2. The components form a circuit for running a single HID lamp shown in FIGS. 2 thru 4.
FIG. 6 is a schematic of a prior power supply circuit of FIG. 5 that is used to energize a single HID lamp.

As has been discussed earlier herein, a retrofit situation occurs when the light source being replaced is somehow different from the light source replacing it. Typically, LED lights have different power requirements as compared to HID lights. In the context of retrofitting the sports lighting system of FIGS. 1 thru 4 from HID to LED, this translates to some sort of change to power regulating means at a pole cabinet 10. While power is distributed at the pole cabinet 10 and controlled (e.g., turned on and off in accordance with a preset schedule) at the control cabinet 14, power is ultimately conditioned and regulated for the particular load (i.e., one or more HID sources 6) at the pole cabinet 10 via ballast 30 and capacitor bank 32, and therefore is an aspect of the present disclosure as shown in FIGS. 5 and 6.

Another aspect of the present disclosure is at the top of the pole; namely, at a fixture level. Ideally, retrofit fixtures will fit in the existing crossarm footprint such that they may be pivoted left or right (sometimes referred to as panning) or pivoted up or down (sometimes referred to as tilting) without photometric or physical interference. Photometric interference occurs when light from one fixture (see light rays A and B in FIGS. 3 and 4) strikes another fixture in the system and causes onsite glare or other adverse lighting effects. This would occur, for example, if the topmost fixture 6 of FIG. 3 was pivoted downwardly such that light ray A struck the top of lowermost fixture 6*a* of FIG. 3 (i.e., the fixture associated with light ray B).

Physical interference occurs when certain aiming angles are precluded because fixtures would strike each other or some other portion of the lighting system. This would occur, for example, if the leftmost fixture 6b of FIG. 4 (i.e., the fixture associated with light ray A) was pivoted sideways into the next fixture 6c (i.e., the fixture associated with light ray B). Both photometric and physical interference reduces useful light-namely, light that is useful for the particular application (here, the illumination of sports field 2 and the aerial space above field 2).

It may be tempting to assume that photometric and physical interference in a retrofit system is simply a matter of poor aiming or lighting design, but it is important to note that if the retrofit fixture itself is not matched well to the application in terms of needed light levels, needed glare control, and existing pole location/weight loading limits, then extreme aiming is sometimes the only recourse to produce the needed lighting design. Other times, despite exceptional luminaire design, wiring is too degraded or crossarms are warped, or existing light levels grandfathered in are too low for a retrofit situation, and so the best recourse is retrofitting a full array of LED luminaires on a new crossarm with a new wiring harness-which has the added benefit of being tested for photometric and physical interference at the factory. All of this is addressed in some of the embodiments set forth herein.

Further, existing specialized lighting systems such as that just described which are retrofitted to include LED luminaires on a one-for-one basis—as is currently being done in the industry—often result in a significant loss of glare control (onsite and/or offsite). To combat the increase in glare, state-of-the-art LED retrofit fixtures are often capped, blackened, coupled with light blocking devices, etc.—which can be effective means of reducing glare—but also reduces overall light output, which necessitates more fixtures to get light levels comparable to the former HID lighting system. This can create an issue with respect to the weight the existing poles or crossarms can withstand, and the available space on the crossarm (as discussed for FIGS. 3 and 4). It may be tempting to believe that LEDs are always a better choice than an older lighting technology—they do indeed have exceptionally long life when operated properly—but this can come at the cost of glare control (which is often not even understood to be an issue until a sub-par retrofit system is installed). This too is addressed in some of the embodiments set forth herein.

The exemplary embodiments envision apparatuses and methods for designing specialized LED retrofit lighting systems in a manner which resolves disparate power requirements, addresses needed lighting conditions, preserves most of the existing lighting system, and is more cost effective and customizable than that which is currently available in the art. These exemplary embodiments, utilizing aspects of the generalized examples already described, will now be described herein.

Retrofit Electronic Component Enclosure

Turning now to FIGS. 7 thru 26 and 47, various embodiments associated with adjusting the power supplied by a previously installed lighting system utilizing HID lamps using some of the existing components of that system will now be discussed.

Figure 7:
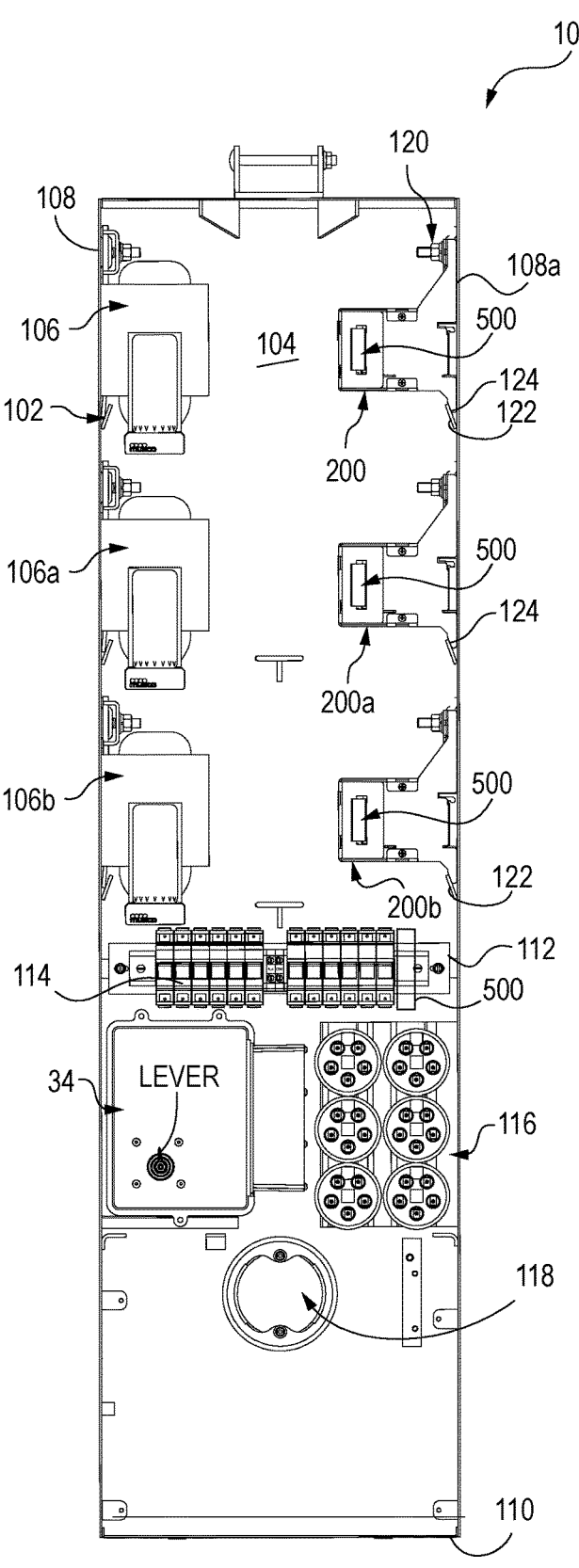
FIG. 7 illustrates the interior of an electrical component enclosure (ECE) according to an embodiment of the present disclosure where ballasts have been removed, and one or more self-contained ballast driver assemblies have been installed in the ECE for supplying power to one or more LEDs. The front cover of the ECE has been removed to show these internal components and assemblies.
Figure 8:
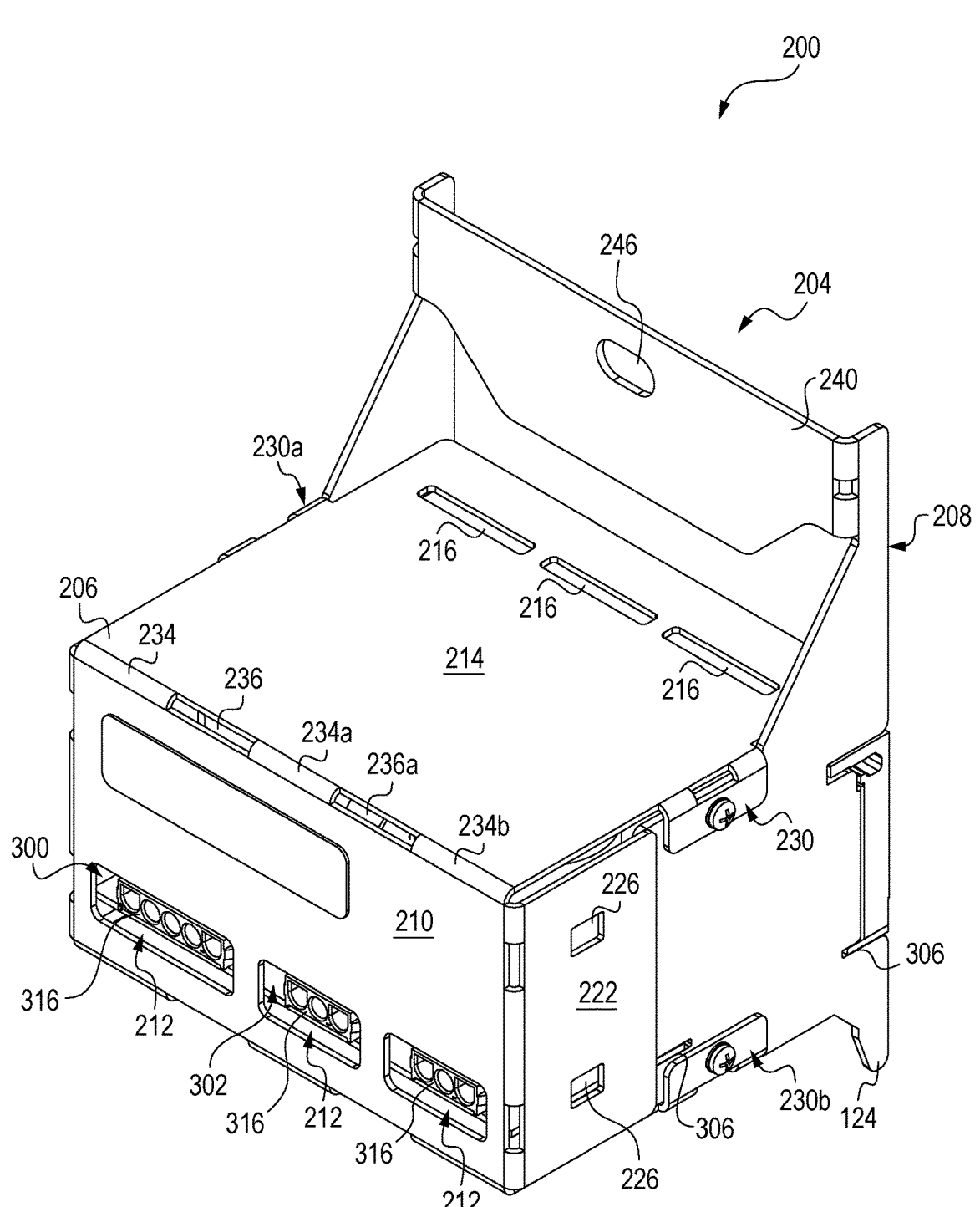
FIG. 8 is a perspective view of the self-contained ballast driver assembly of FIG. 7 shown in isolation.

Starting with FIGS. 7 and 8, a modified ECE is shown where some of the ballasts previously used to power HID lamps have been removed and replaced by a self-contained ballast driver assembly that is in communication with at least one of the remaining ballasts. In some applications, one such driver assembly and associated ballast will power two LED fixtures, but not necessarily so. In certain embodiments, three ballasts may be removed, and three ballast drivers may be installed into the ECE in their place. Three existing ballasts and the existing capacitors may still be used. In yet further embodiments, the number of ballasts, capacitors, and ballast drivers may be reduced since LED lighting is inherently more efficient than HID lighting. Conversely, a dedicated or new ECE may be supplied with more ballasts and ballast drivers to increase the amount of lighting in terms of luminosity levels or area covered at a site with a previously installed HID lighting system, etc.

Such an ECE 100 includes one or more ballasts 30 as previously alluded to herein and one or more self-contained ballast drive assemblies 200 that are in electrical communication with the ballast(s) 30 for supplying (DC) direct current to an LED. More specifically, the self-contained ballast drive assembly 200 may comprise a circuit board 302, as well as a circuit board enclosure 204 (may be fabricated from sheet metal) surrounding the circuit board 302 for its protection and reliable mounting in the ECE 100.

Focusing on FIG. 7 by itself, the ECE may be described as follows as a separate and sellable item. The ECE 100 may comprise a sidewall 102, a bottom wall 104, a first ballast 106 attached to the sidewall 102 as shown or the bottom wall, and a first ballast driver (e.g., a self-contained ballast drive assembly) attached to the sidewall 102 as shown, or the bottom wall adjacent to the first ballast 106.

Similarly, a second ballast 106a may be attached to the sidewall 102 as well as a third ballast 106b, while a second ballast driver 200a as well as a third ballast driver 200b may be attached to the sidewall 102 as shown or the bottom wall. The first, second, and third ballasts may be arranged in a linear array, while the first, second, and third ballast drivers may form a linear array next to that of the ballasts.

In a retrofit application, the first ballast driver, the second ballast driver, and/or the third ballast driver may occupy space vacated by removed a plurality of previously installed ballasts. This may not be the case when the ECE is supplied as a new assembly.

More specifically, the ECE may take the form of a polygonal sheet metal enclosure (e.g., may be rectangular) such that the sidewall 102 includes a plurality of panels 108, 108a forming a polygonal perimeter 110, and the bottom wall 104 is adjacent to or even attached to the plurality of panels 108 such as when the ECE is folded into shape.

As shown in FIG. 7, the plurality of panels may include a first panel 108, and a second panel 108a that is parallel to the first panel 108, and the first ballast 106, the second ballast 106a, and the third ballast 106b may be attached to the first panel 108, while the first ballast driver (e.g., see 200), the second ballast driver 200a, and the third ballast driver 200b may be attached to the second panel 108a. Also, the first ballast driver, the second ballast driver, and the third ballast driver may be identically configured (i.e., within manufacturing tolerances of +/−0.020 of an inch). Other configurations and arrangements of the ECE and these components are possible in other embodiments of the present disclosure.

As alluded to earlier herein, the first ballast may in electrical communication with the first ballast driver, the second ballast may be in electrical communication with the second ballast driver, and the third ballast may in electrical communication with the third ballast driver e.g., via wires (not shown).

The first and second panels 108, 108a may be parallel to each other but not necessarily so. The ballasts may be attached to the first panel, while the ballast drivers may be attached to the second panel. This may not be the case in other embodiments of the present disclosure. For example, the ballasts and ballast drivers may alternate along one of the panels, etc.

Still referring to FIG. 7, a DIN (Deutsche Institut fir Normung) rail 112 may extend from panel 108, 108*a* below the third ballast 106*b* and the third ballast driver 200*b*. A plurality of fuses 114 or circuit breakers may be attached to the DIN rail 112. Those fuses or circuit breakers no longer being used when ballasts are removed may also be removed, but not necessarily so.

As will be discussed in further detail later herein, a cam motor assembly 34 associated with Smart Lamp® technology, or a manual cam assembly may be disposed beneath the DIN rail 112 adjacent to panel 108, and a bank of capacitors 116 may be disposed beneath the DIN rail 112 adjacent to the panel 108*a*, and adjacent to the cam motor assembly 34 or the manual cam assembly. The cam motor assembly 34 or the manual cam assembly may include a lever configured to rotate one or more cams so that different selected capacitors of the bank of capacitors is connected to the power line going to the ballast(s), etc. A wire entrance and a wire exit (may be supplied by a single aperture 118) may be formed in the bottom wall 104. The number and placement of the capacitors, the cam assembly, the wire entrance, and the wire exit may differ in other embodiments of the present disclosure.

The self-contained ballast driver assembly(s) 200 may be attached via fastener and bracket combination 120 and a toe 124 that mates with a flange 122 that is used in previous ECEs for attaching ballasts to the sidewall. Other methods of attachment are possible in other embodiments of the present disclosure.

Figure 15:
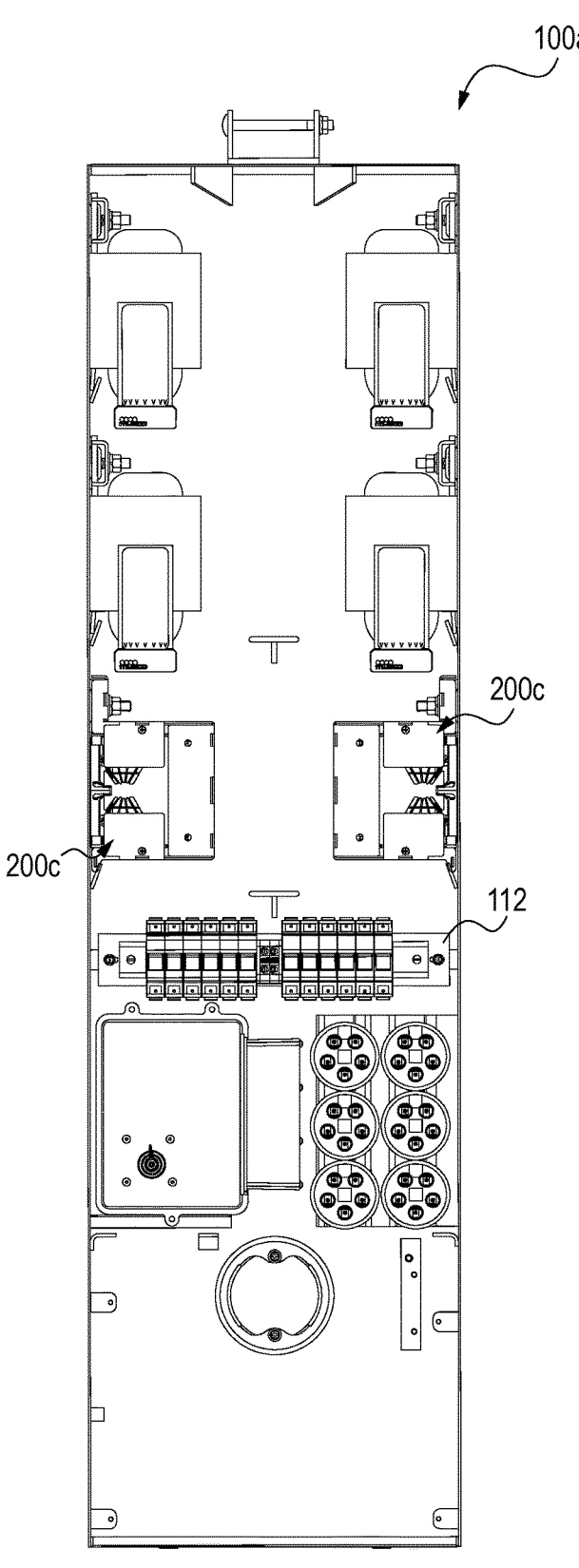
FIG. 15 is an alternate ECE to that disclosed in FIG. 7 that has a dual self-contained ballast driver assembly.
Figure 16:
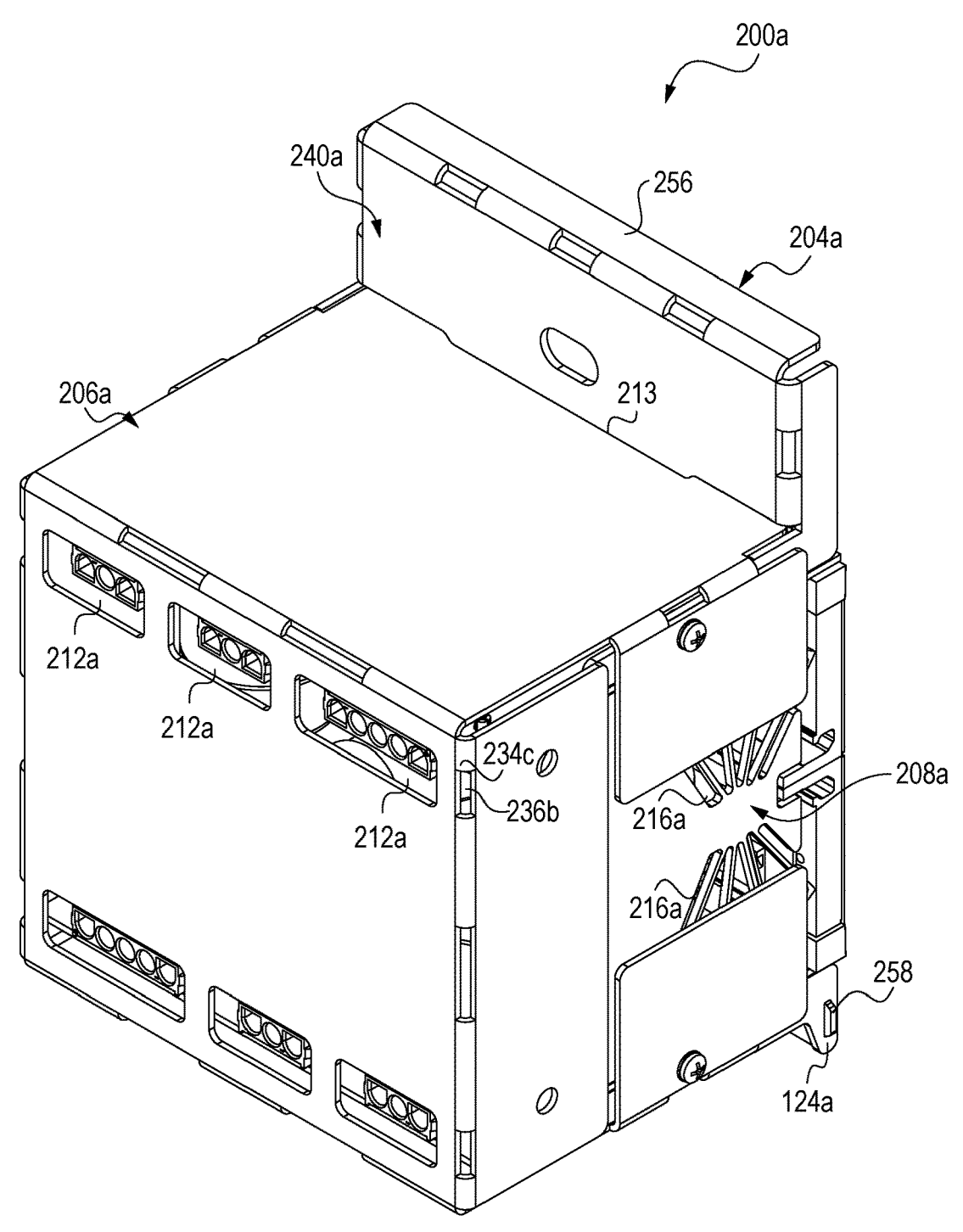
FIG. 16 is a perspective view of a self-contained ballast driver assembly similar to that of FIG. 8 that may be used in the ECE of FIG. 15 except that it has two PCBs and associated circuitry for driving more luminaires than the driver of FIG. 8.
Figure 17:
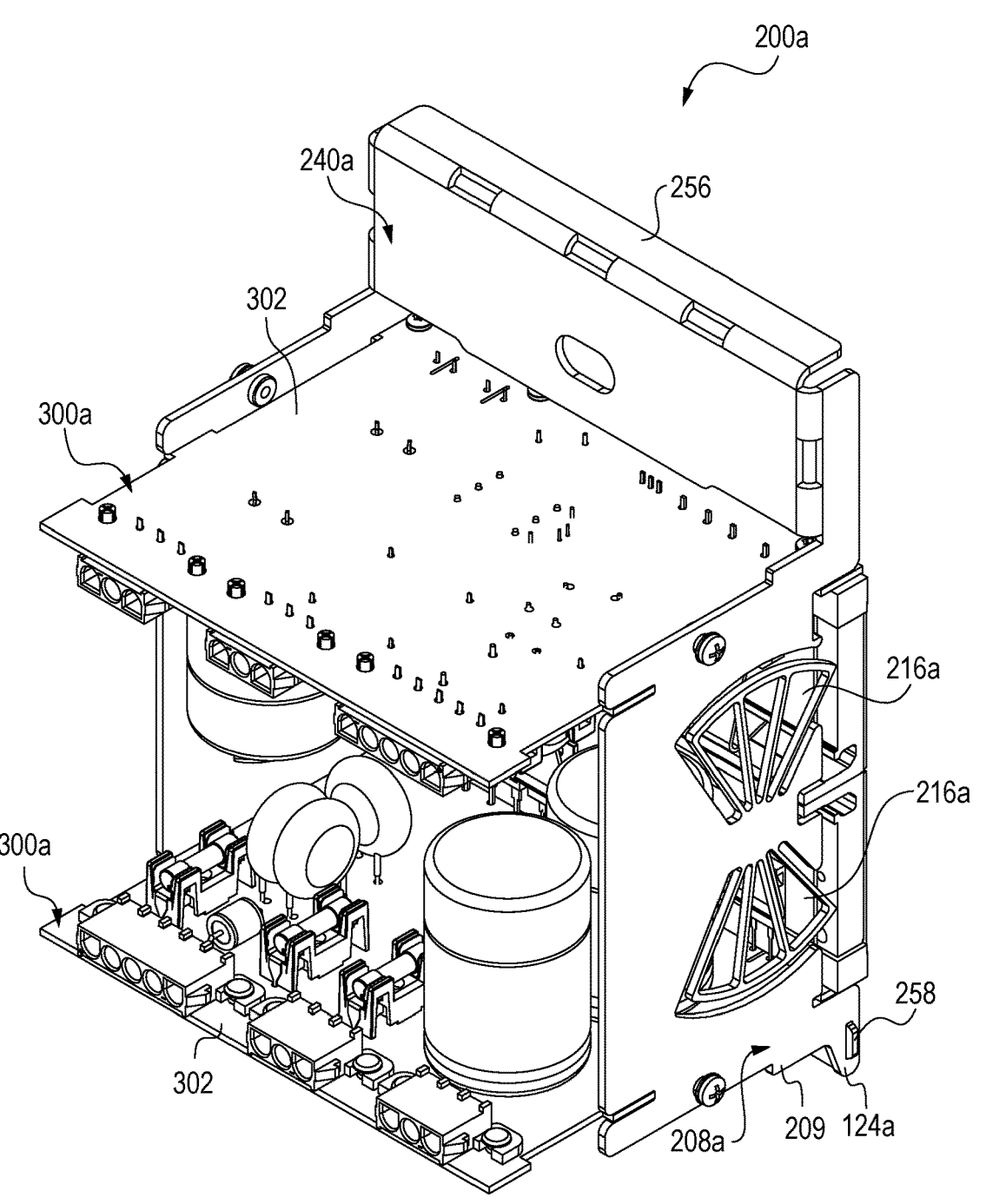
FIG. 17 shows the self-contained ballast driver assembly of FIG. 16 with the cover removed, revealing two PCBs (printed circuit board(s)) facing each other.
Figure 18:
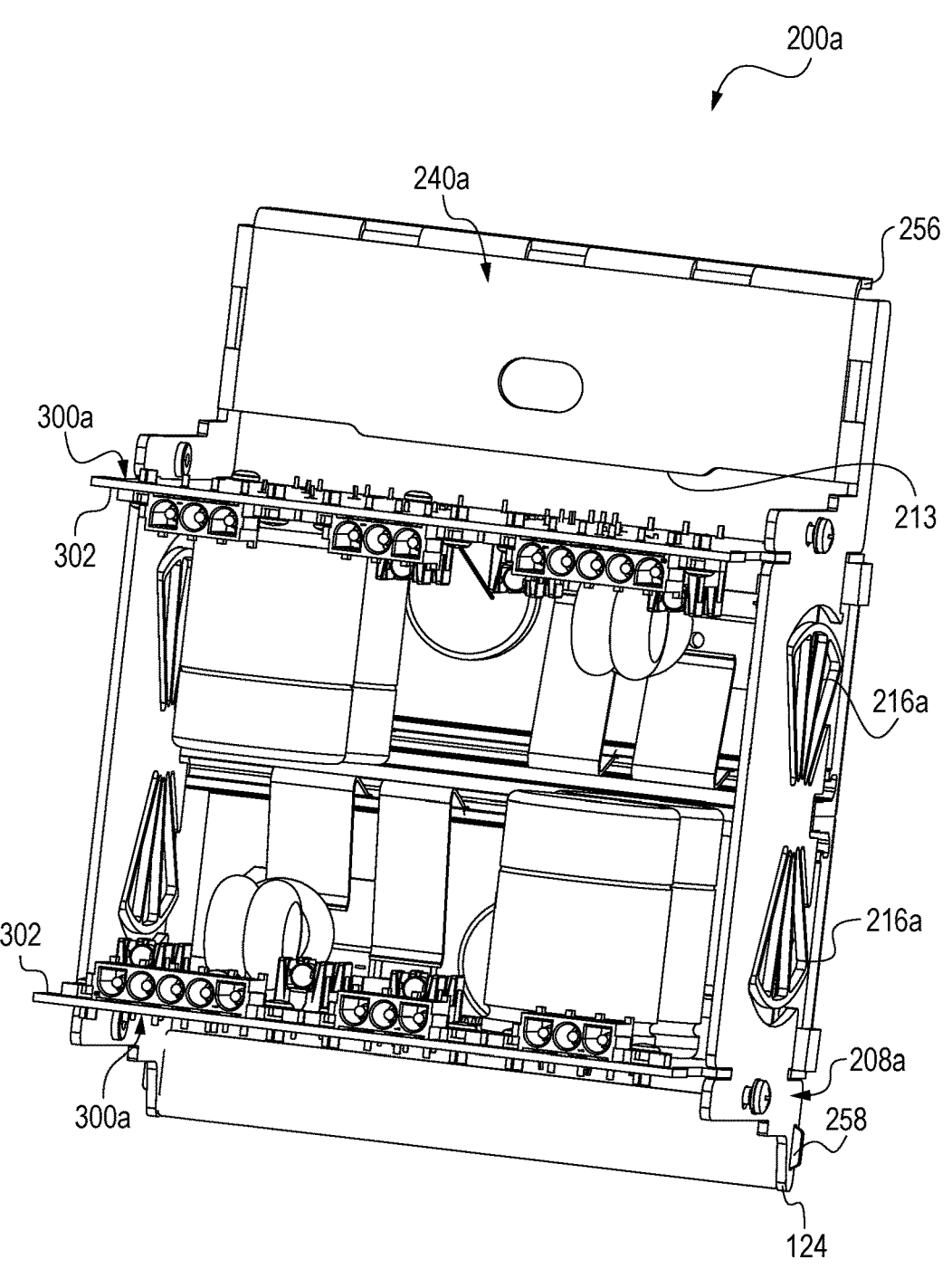
FIG. 18 is an alternate perspective view of the self-contained ballast driver of FIG. 17 showing the clips holding some of the components attached to the PCB against a thermally conductive and electrically insulating sheet more clearly.
Figure 19:
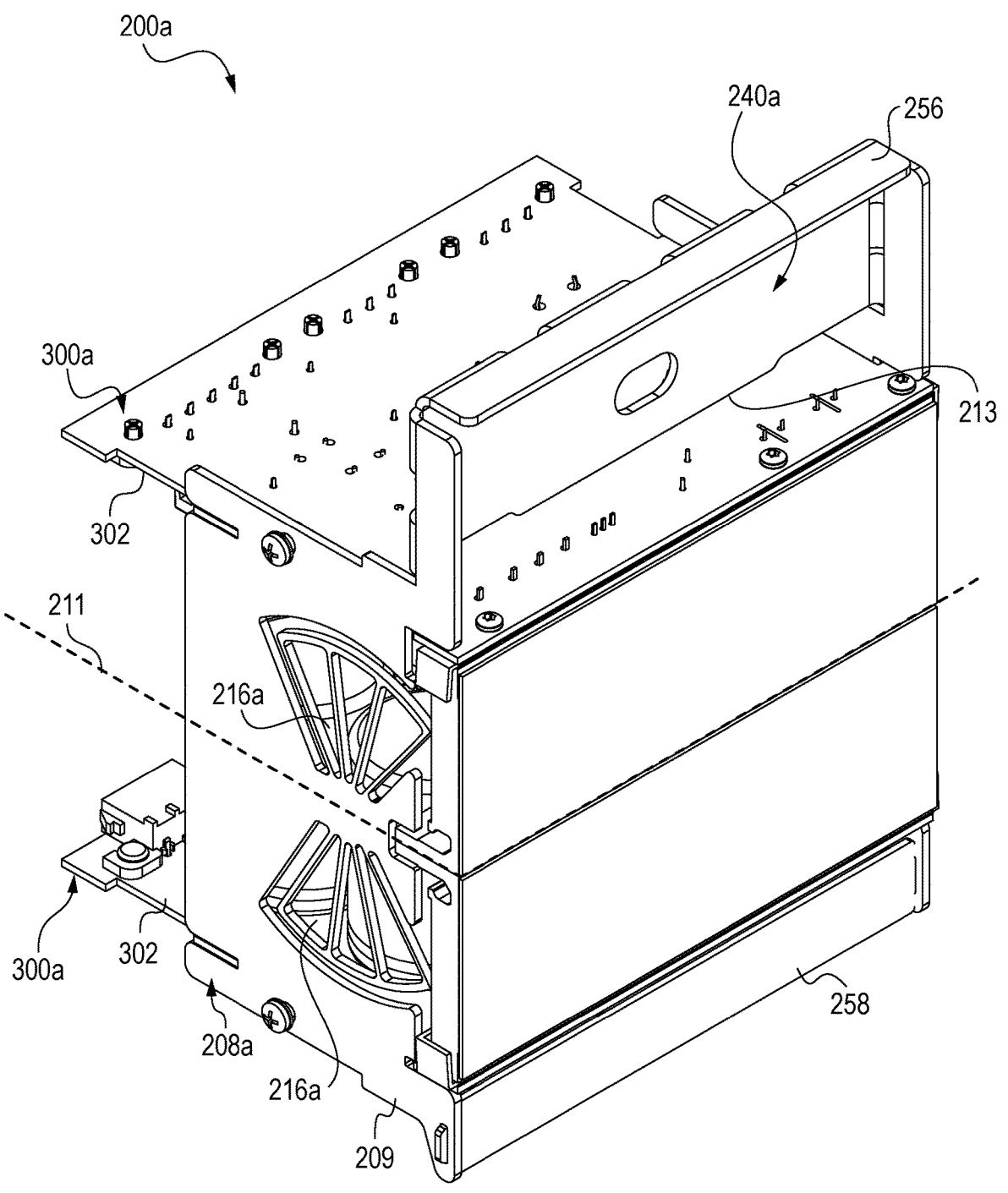
FIG. 19 is a rear perspective view of the self-contained ballast driver assembly of FIG. 18 depicting the heat sinks of the PCBs vertically adjacent to each other.

Looking now at FIG. 15, an alternate ECE 100*a* that is similarly or identically configured as ECE 100 is shown except that uses self-contained ballast driver assembly(s) 200*c* that have dual PCBs to power more luminaires as will be described in further detail later herein. Also, the driver assemblies 200*c* are disposed lower in the ECE on either side (e.g., immediately approximate the DIN rail 112 on a first sidewall or the bottom wall, and on a second sidewall or the bottom wall a across from each other) to promote efficient cooling of the PCBs. For example, the heat from one driver does not rise through natural convection to the next driver. In addition to or in lieu of this effect, the driver assemblies may be further away from the traditional ballasts that create heat that rises away from the now lower disposed driver assemblies. The fact that the driver assemblies 200*c* have two PCBs instead of only one allows the elimination of the two higher placed driver assemblies 200, 200*a* in FIG. 7.

Circuit Board Enclosure

Referring now to FIGS. 8 thru 12, the circuit board enclosure 204 may include a five-sided cover 206, and a three-part mounting bracket 208. The five-sided cover 206 may include a front panel 210 defining a plurality of connector receiving windows 212, a top panel 214 defining a plurality of vent openings 216, and a bottom panel 218 defining a plurality of vent apertures 220. The five-sided cover 206 may also have a first side panel 222, and a second side panel 224. The first side panel 222 may define a plurality of first side apertures 226, while the second side panel 224 may define a plurality of second side apertures 228. These apertures may allow a wire end keeper to be attached to this enclosure as will be described in more detail later herein.

Figure 11:
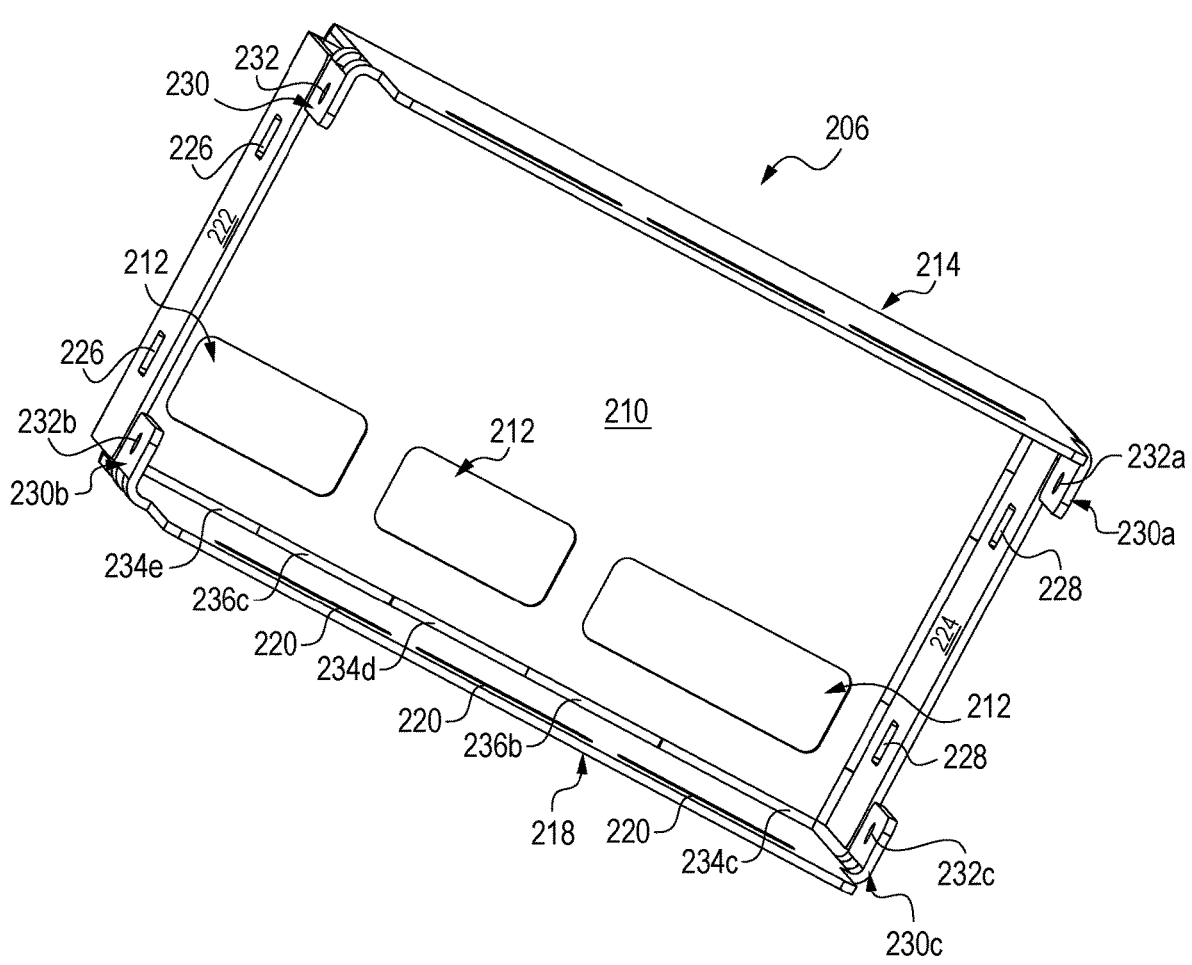
FIG. 11 is a bottom oriented perspective view of the cover of the self-contained ballast driver assembly of FIG. 9 shown in isolation.

As best seen in FIGS. 8 and 11, the top panel 214 may include a first pair of attachment flanges 230, 230*a* extending down from the top panel 214 defining a first pair of attachment apertures 232, 232*a*, and the bottom panel 218 may include a second pair of attachment flanges 230*b*, 230*c* extending upwardly from the bottom panel 218 defining a second pair of attachment apertures 232*b*, 232*c*.

Also, the top panel 214 may be connected to the front panel 210 by a plurality of top bends 234, 234*a*, 234*b* that are each separated by a top cutout 236, 236*a*. Likewise, the bottom panel 218 may be connected to the front panel 210 by a plurality of bottom bends 234*c*, 234*d*, 234*e* that are each separated by a bottom cutout 236*b*, 236*c*. These cutouts may facilitate bending of the panels without tearing or the use of too much force. These cutouts may be omitted in other embodiments of the present disclosure.

Figure 9:
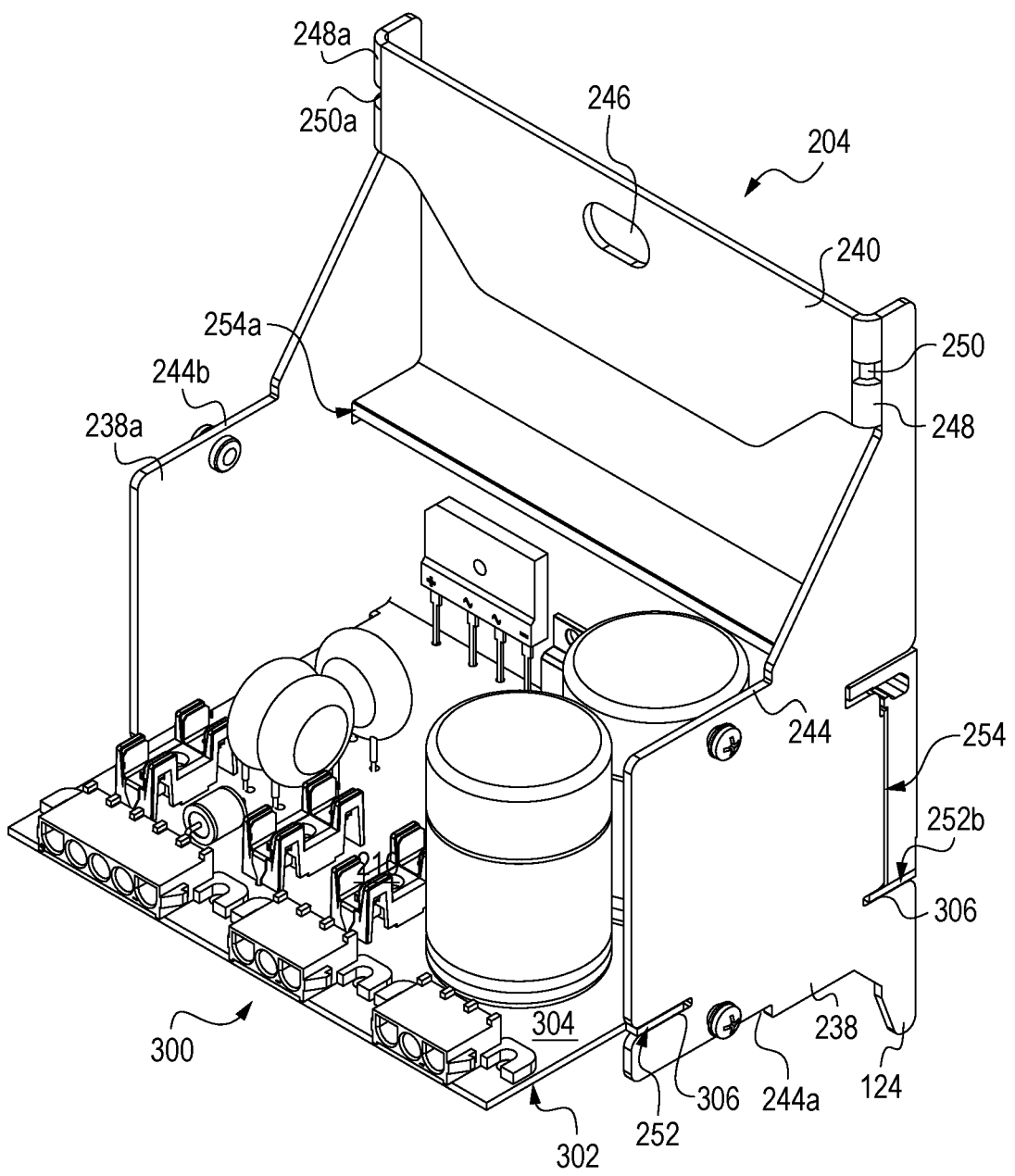
FIG. 9 shows the self-contained ballast driver assembly of FIG. 8 with its cover removed, revealing the circuit board that contains a power supply circuit according to an embodiment of the present disclosure for powering a single LED luminaire.
Figure 10:
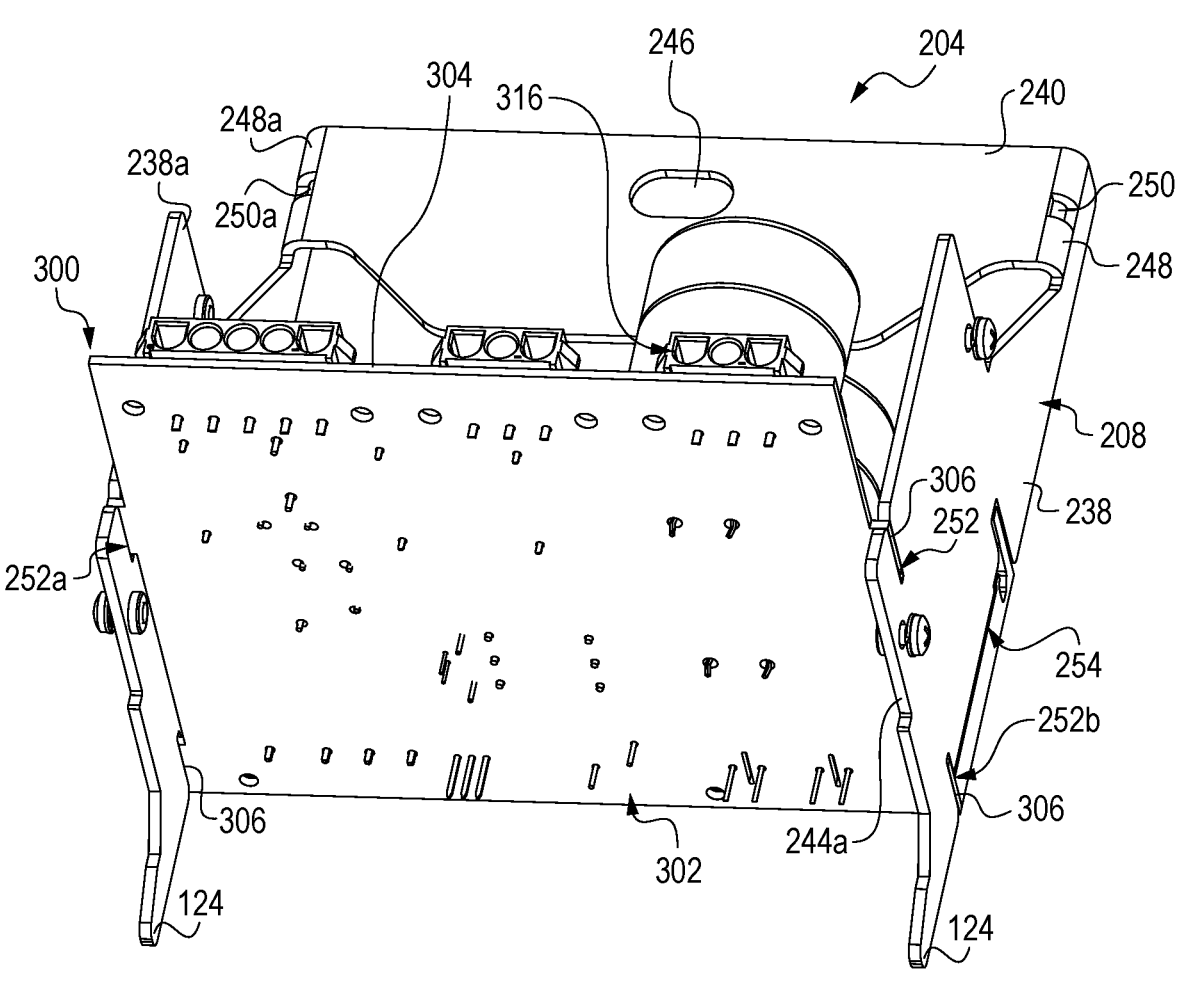
FIG. 10 is a bottom oriented perspective view of the self-contained ballast driver assembly of FIG. 9 revealing the bottom of the circuit board.
Figure 12:
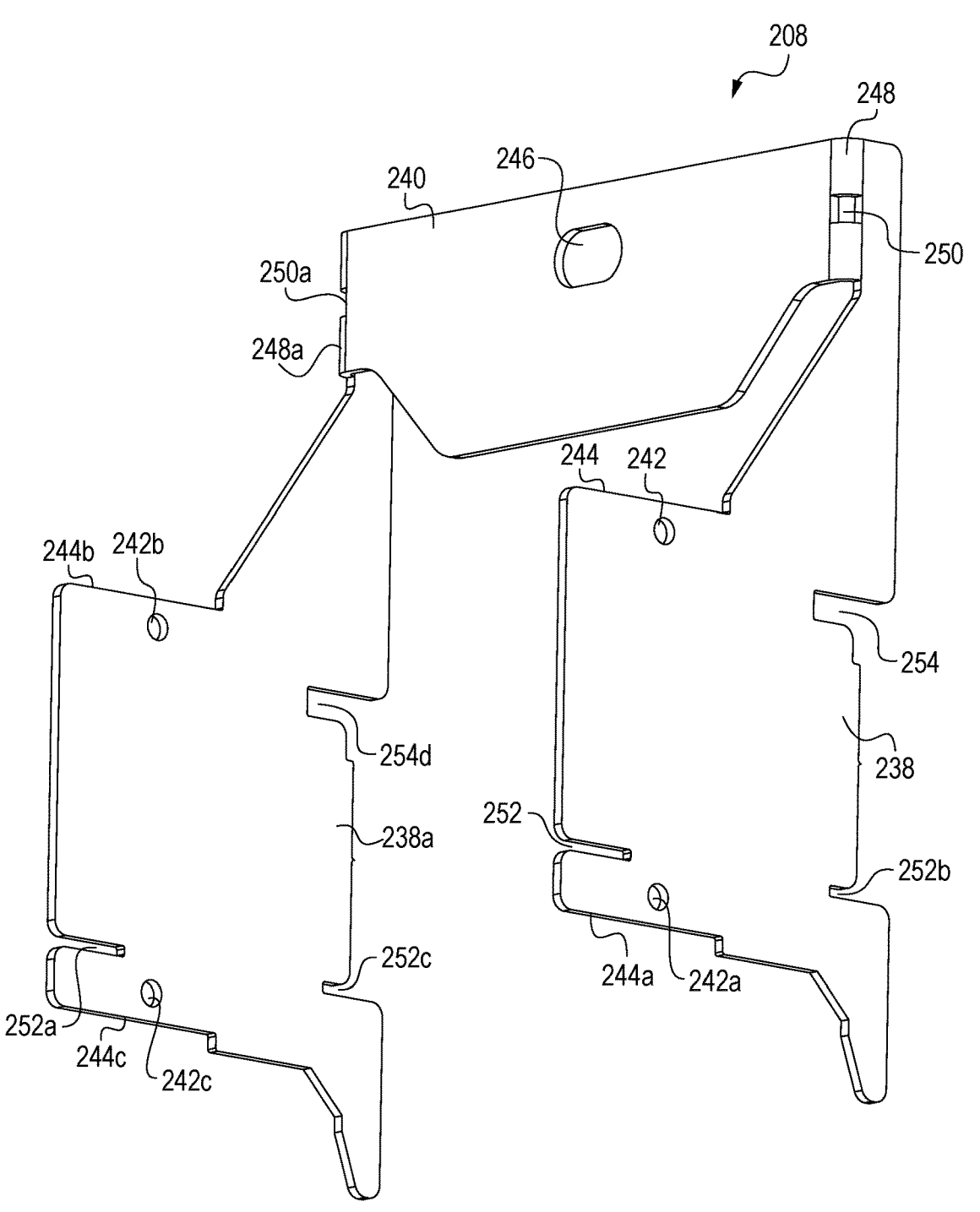
FIG. 12 is a front oriented perspective view of the mounting bracket of the self-contained ballast driver assembly of FIG. 8 shown in isolation.

Referring to FIGS. 9, 10 and 12, the three-part mounting bracket 208 may include a first side circuit board mounting portion 238, a second side circuit board mounting portion 238*a*, and a top enclosure attachment portion (may also be referred to as a handle portion 240) connecting the first side circuit board mounting portion 238 to the second side circuit board mounting portion 238*a*. The top enclosure attachment portion or handle portion 240 may include an elongated aperture 246 (racetrack or oval shaped, etc., may be used to mount to the ECE using fastener and bracket combination 120 alluded to earlier herein). The handle and this aperture may be obscured by a cover (not shown) until it is ready to be mounted. This cover may also protect the back surface of the heat sink and/or the thermally conductive and electrically insulating material before this mounting step is complete.

The handle portion 240 may be joined to the first side circuit board mounting portion 238 by a first side bend 248, and the top enclosure attachment portion or handle portion 240 may also be joined to the second side circuit board mounting portion 238*a* by a second side bend 248*a*. The first side bend 248 may be split by a first side cutout 250, while the second side bend 248*a* may be split by a second side cutout 250*a*.

More particularly, the first side circuit board mounting portion 238 may include a first pair of cover mounting holes 242, 242*a* and a first pair of attachment flange receiving notches 244, 244*a* disposed proximate to the first pair of cover mounting holes 242, 242*a*. Similarly, the second side circuit board mounting portion 238*a* may include a second pair of cover mounting holes 242*b*, 242*c*, and a second pair of attachment flange receiving notches 244*b*, 244*c* disposed proximate to the second pair of cover mounting holes 242*b*, 242*c*.

Moreover, the first side circuit board mounting portion 238 may define a first circuit board receiving slit 252, and the second side circuit board mounting portion 238*a* may define a second circuit board receiving slit 252*a*. The first side circuit board mounting portion 238 may also define a first side heat sink receiving aperture 254, and the second side circuit board mounting portion 238*a* may further define a second side heat sink receiving aperture 254*a*.

Focusing on FIG. 12, the first side heat sink receiving aperture 254 may be spaced away from the first circuit board receiving slit 252, and the second side heat sink receiving aperture 254*a* may also be spaced away from the second circuit board receiving slit 252*a*. The first side circuit board mounting portion 238 may also define a third circuit board receiving slit 252*b* that is in communication with the first side heat sink receiving aperture 254, and the second side circuit mounting portion 238*a* may also define a fourth circuit board receiving slit 252*c* that is in communication with the second side heat sink receiving aperture 254*a*. The first side heat sink receiving aperture 254 may be L-shaped, and the second side heat sink receiving aperture 254*a* may be L-shaped. These apertures are generally complementarily shaped to receive the heat sink of the circuit board. Other configurations are possible in other embodiments of the present disclosure.

As shown in FIGS. 8 thru 10, the enclosure 204 may be adapted to hold and contain a circuit board and heat sink assembly 300 that may comprise a circuit board 302 as alluded to earlier herein. The method of forming the enclosure about the circuit board and heat sink assembly will be discussed in further detail later herein.

Looking now at FIGS. 16 through 19, it can be seen that driver assembly 200*a* is similarly or identically configured as that shown in FIGS. 8 thru 10 except for at least the following differences. The enclosure 204*a* is taller than the enclosure 204 in FIGS. 8 thru 10 (may be 50% to 100% taller). More particularly, the lower edge 209 (see FIG. 17) of the mounting bracket 208*a* proximate its toe 124*a* is lower than that of enclosure 204, and the rest of the mounting bracket 208*a* and the cover 206*a* are mirrored about plane 211 in FIG. 19 so that two PCBs (see 300*a*) can be accommodated. Due to the increased height, an extra bend 234*c* and cutout 236*b* (see FIG. 16) may be provided to allow the cover to be folded during manufacturing. Also, the bottom edge 213 of the handle portion 240*a* of the mounting bracket 208*a* has been moved up to accommodate the taller cover 206*a*. Additional connector receiving windows 212*a* are also provided to allow wire connection to the top PCB.

Other changes for the cover include an additional top flange 256 that extends from the handle portion 240*a* to provide more stability when the driver assembly 200*a* is seated in the ECE 100*a*. Furthermore, the vent openings 216*a* have been moved from the top of the cover to the side panels of the mounting bracket and enlarged (may be pie or wedge shaped, see FIG. 17) to provide extra ventilation since the heat generation may be doubled due to the use of two PCBs.

The side apertures 226*a* are differently configured (round instead of polygonal) since there may be no need for a wire keeper. These apertures may also provide for additional cooling, etc. Also, a cross-brace 258 is provided connecting the toes 214*a* to provide rigidity to the enclosure after it has been assembled. The cross-brace may also help to prevent the PCB(s) from being compressed or damaged.

Circuit Board and Heat Sink Assembly

Figure 13:
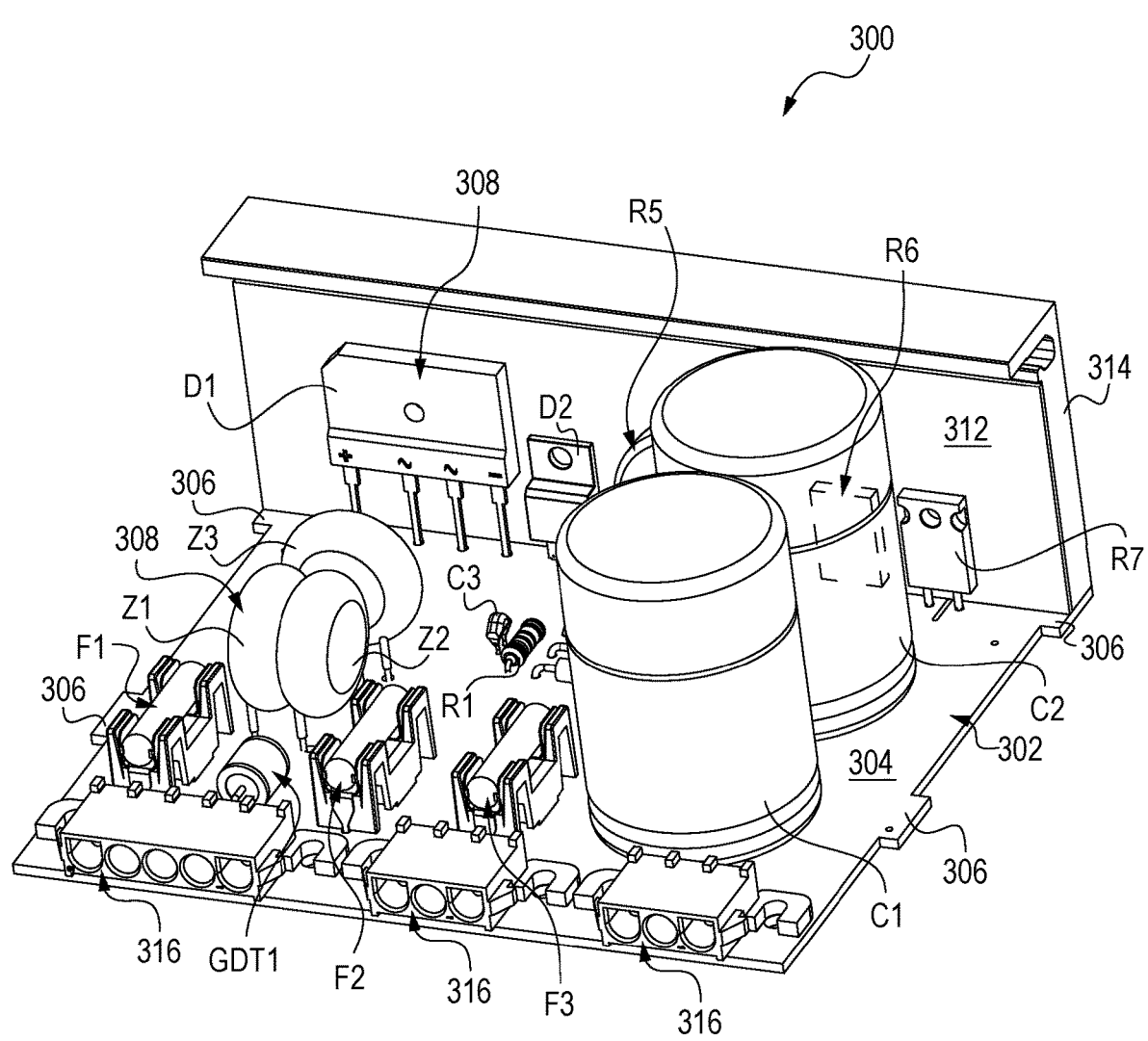
FIG. 13 is a perspective view of the circuit board assembly with its heat sink that is part of the self-contained ballast driver assembly of FIG. 8 shown by itself.
Figure 14:
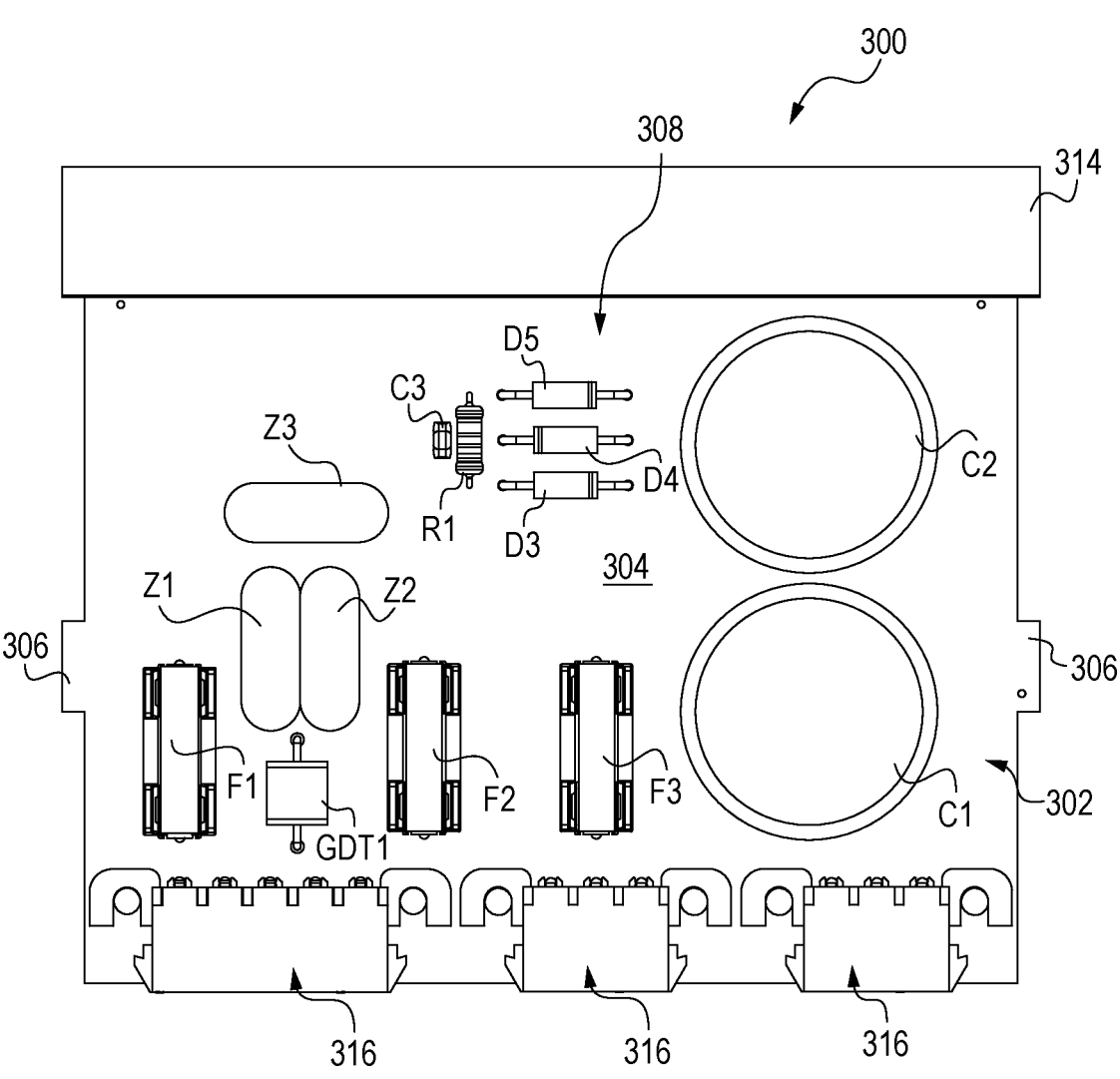
FIG. 14 is a top view of the circuit board assembly and heat sink of FIG. 13.

As depicted in FIGS. 13 and 14, the circuit board and heat sink assembly 300 may include such a circuit board 302 that has a top circuit mounting surface 304, and a plurality of side mounting tabs 306 that are configured to fit within the slits of the enclosure as alluded to earlier herein. Also, a plurality of circuitry components 308 may be attached to the top circuit mounting surface 304, as well as a heat sink 314 that is attached to the top circuit mounting surface 304 that is in thermal communication but electrical isolation with one or more of the plurality of circuitry components 308. To that end, a thermally conducting and electrically insulating material 312 may be disposed between one or more of the plurality of circuitry components 308, and the heat sink 314. Specifically, the thermally conducting and electrically insulating material may comprise silicone and alumina, etc. For example, the alumina may be AL204 with a 96% purity. Other types of thermally conducting and electrically insulating material may be used in other embodiments of the present disclosure.

As alluded to earlier herein, the heat sink 314 may be L-shaped as alluded to previously herein, and may be made from aluminum (e.g., an aluminum alloy). For example, extruded 6063-T5 aluminum may be used. Other configurations and material may be employed as long as a suitable amount of heat is removed from the electrical components, etc.

Looking at FIGS. 8 and 13, a plurality of connectors 316 may be disposed near the front of the top circuit mounting surface that are in communication with the plurality of circuitry components. This allows wires from the ballasts, etc. that are already in the ECE to be connected to the circuit board and the heat sink assembly quickly, and also allows wires leading from this assembly to the LED fixtures to also be connected easily, or vice versa.

Turning now to FIGS. 17 thru 21, a circuit board and heat sink assembly 300*a* that is similarly or identically configured as that of FIGS. 8 thru 13 except for at least the following differences will now be discussed.

Figure 20:
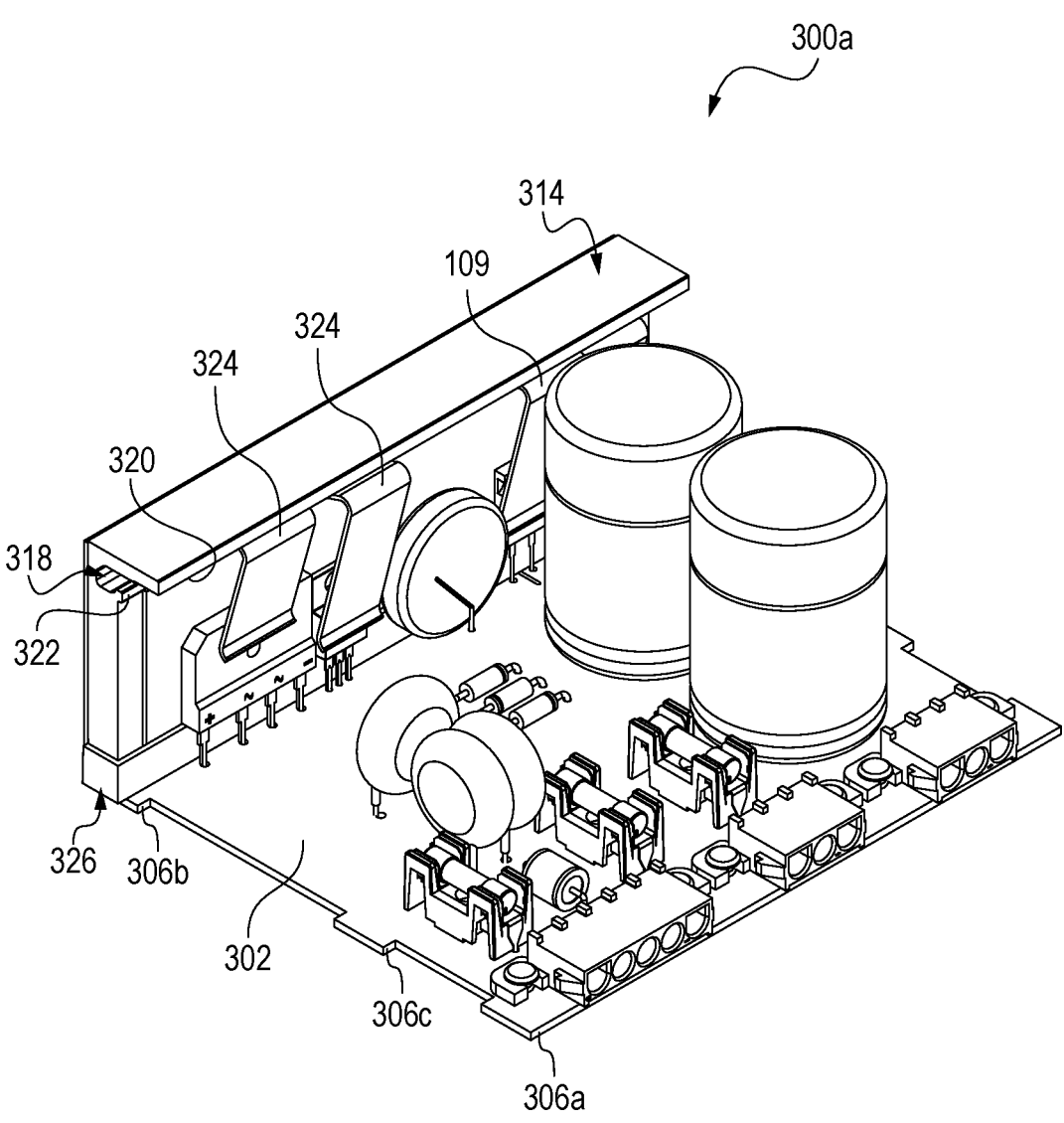
FIG. 20 contains a perspective view of a single instance of the PCB of FIGS. 17 thru 19 shown in isolation.
Figure 21:
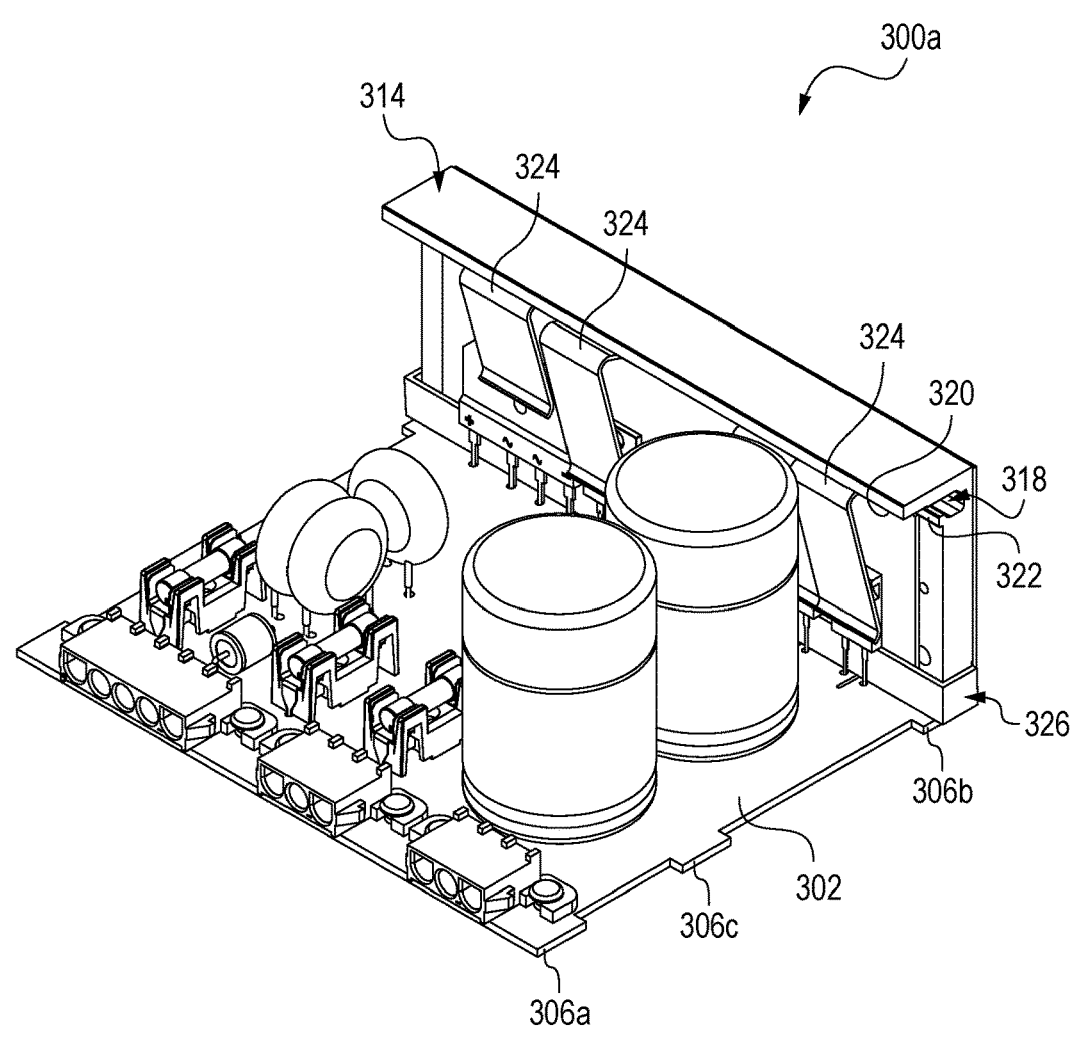
FIG. 21 is an alternate perspective view of the PCB of FIG. 20.

Focusing on FIGS. 20 and 21, the heat sink 314 may define a clip receiving groove 318 at least partially defined by a top ledge 320, and a bottom catch rib 322. One or more clips 324 that may be disposed in the clip receiving groove 318 and contacting at least one of the plurality of circuitry components to press it into contact with the electrically insulating and thermally conductive material.

The plurality of side mounting tabs includes a front mounting tab 306*a*, a rear mounting tab 306*b*, and an intermediate mounting tab 306*c* that is disposed between them. The front mounting tab has been added to provide an abutment surface against the cover so that the assembly 300*a* is not prone to twist. A pan 326 for receiving the heat sink 314 may be disposed between the heat sink 314, and the circuit board 302. The pan is fabricated from an electrically insulating material, a thermally insulating material, or both. For example, the pan may take the form of an injection molded plastic part that is electrically insulating. The specific material may be Polybutylene Terephthalate (PBT), etc.

Circuit

Figure 22:
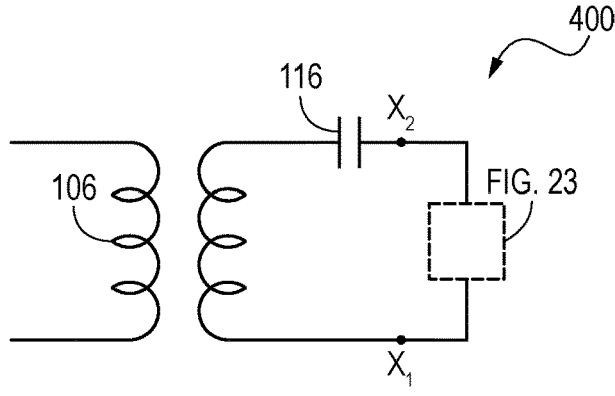
FIG. 22 is a schematic of a rectifying and power supply circuit according to an embodiment of the present disclosure that is configured to supply direct current (DC) to a LED luminaire.
Figure 23:
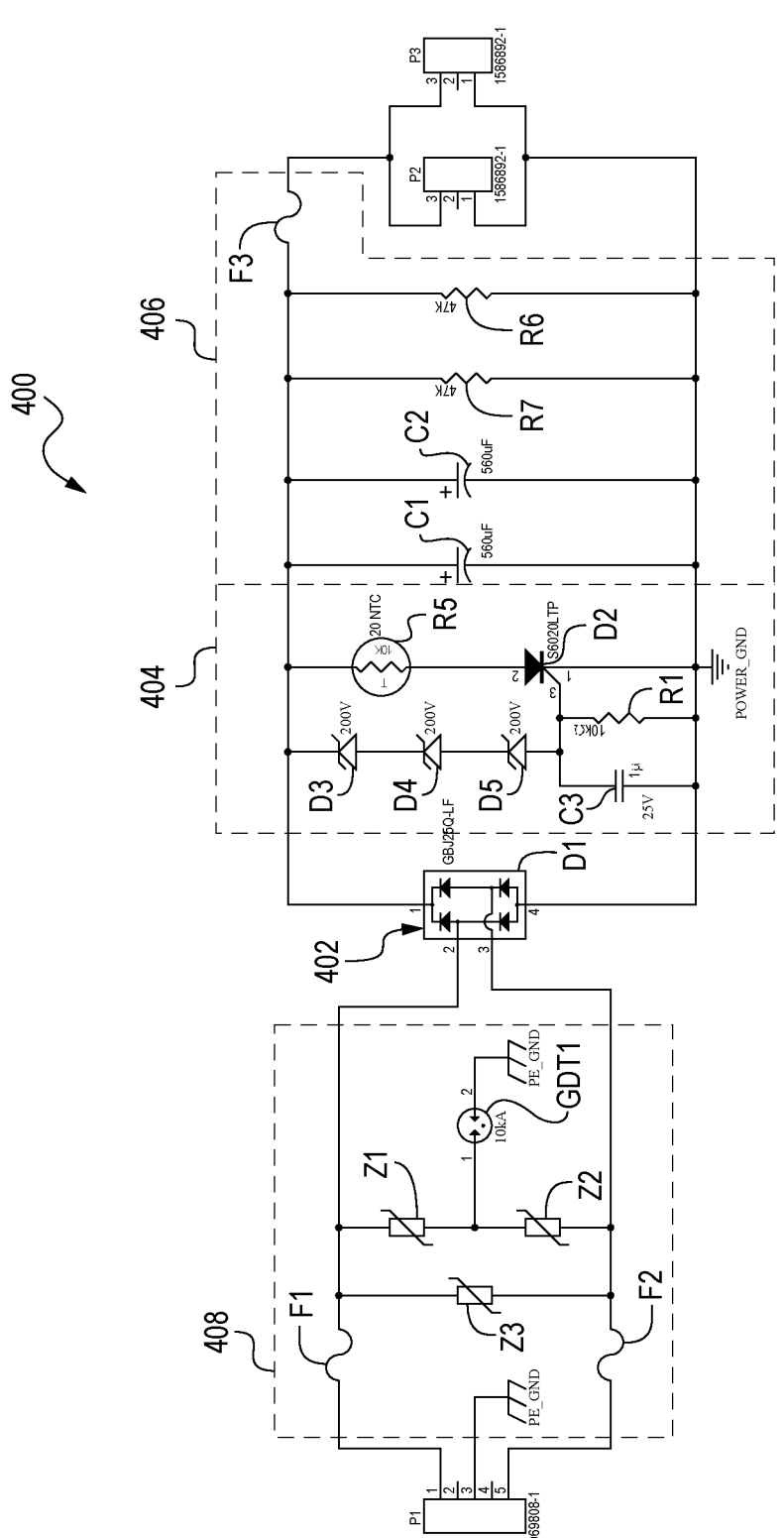
FIG. 23 shows some of the subcircuits of the rectifying and power supply circuit of FIG. 22 in greater detail.
Figure 24:
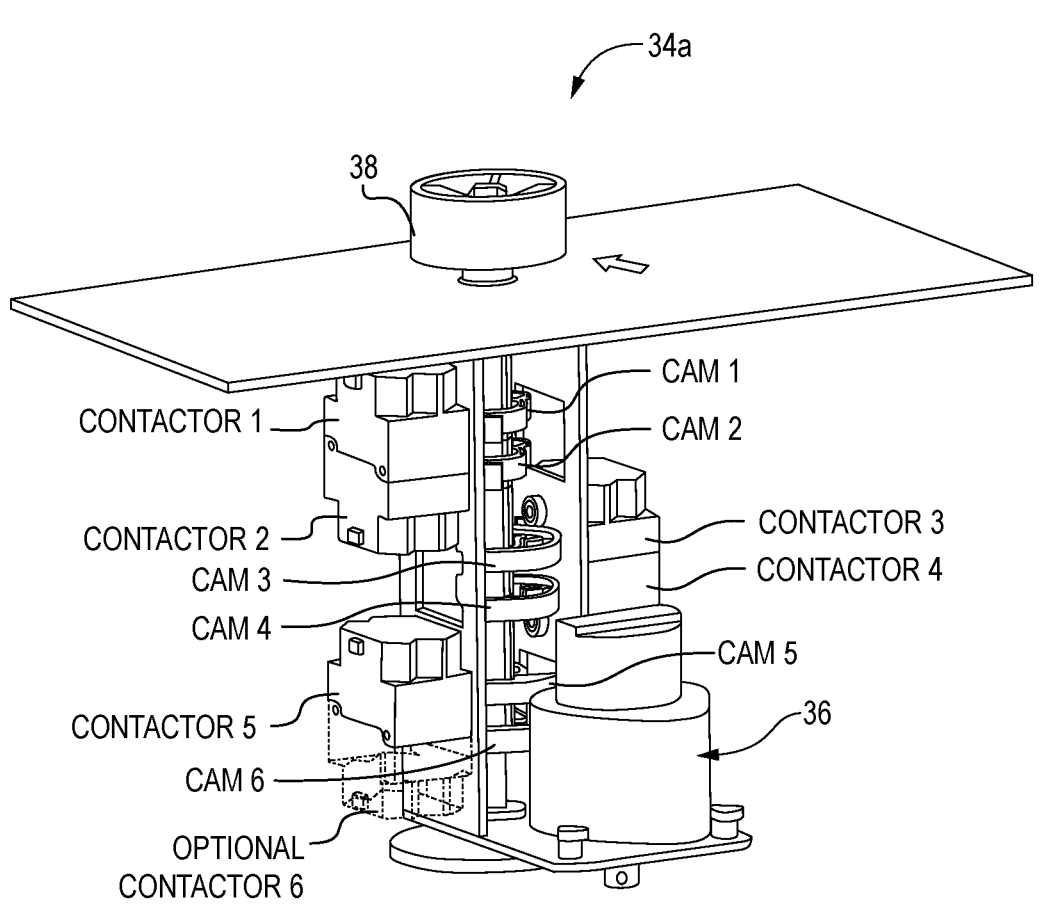
FIG. 24 discloses a cam timer assembly that is installed in some prior art HID lighting systems to gradually increase the wattage supplied to the HID lamps due to loss of luminosity over time experienced by HID lamps.

FIGS. 22 and 23 contain a circuit(s) for rectifying and supplying power to a LED luminaire. In FIG. 22, such a circuit 400 may comprise a ballast(s) 106 and a capacitor bank 116 as alluded to earlier with reference to FIG. 7.

However as shown in FIG. 23, such a circuit 400 may further include a rectifying subcircuit 402, an open circuit protection subcircuit 404, an output conditioning subcircuit 406, and a power surge protection subcircuit 408. In particular embodiments, the power surge protection subcircuit 408 may comprise a gas discharge tube GDT1 (fuses may also be provided such as F1 and F2, other external surge protection devices, etc., but not necessarily so). Also, metal oxide varistors (MOVs) designated as Z1, Z2, and Z3 are provided. Z1 and Z2 provide surge suppression when voltage in common mode reaches a maximum value whereas Z3 provides surge suppression when voltage in differential mode reaches another maximum value. The gas discharge tube has a different failure mode as compared to the MOVs to provide another level of protection or safety. Specifically, MOVs typically fail by going short circuit whereas gas diode tubes typically fail going open circuit. With the arrangement shown, it most likely current will be sent to ground, regardless if any of the MOVs or the gas discharge tube fail.

The rectifying subcircuit 402 includes a diode bridge D1 that is a commercially available full wave bridge rectifier diode bridge. Other rectifying subcircuits may be employed.

The open circuit protection subcircuit 404 may include Zener Diodes designated as D3, D4, and D5 that are electrically connected in parallel to a thermistor designated as R5 and a switching thyristor designated as D2. When the voltage is too high, the current from the rectifying subcircuit is sent to ground. The voltage values for the D3, D4, and D5 may range from 100 volts to 600 volts in some embodiments of the present disclosure.

Turning now to the output conditioning subcircuit 406, it includes a conditioning bank of capacitors C1, C2 that are designed to reduce the electrical ripple (or the resulting optical flicker) of the AC component of the direct current supplied by the rectifier D1. The values of these capacitors C1, C2 may range from 100 μF to 4000 μF in some embodiments of the present disclosure. In some embodiments, zero or nearly zero capacitance may be required, while in other embodiments an even greater value than 4000 μF may be needed to reduce the optical flicker to a desired level, etc. Resistors R6 and R7 are supplied to discharge the capacitors C1, C2 when the power is turned off to allow for safe interaction during maintenance, trouble shooting, etc. Another fuse F3 may be provided to prevent damage to the luminaire if current is too high, but not necessarily so. Also, a MOFSET (not shown) may be interposed between the open circuit protection subcircuit, and the output conditioning subcircuit to provide another level of protection.

Any of the components may be "thru-hole" components or "surface mount" (e.g., see FIGS. 13 and 14) components depending on the application, availability of components, design needs, cost, etc.

In some embodiments, an HID ballast-capacitor circuit producing a constant wattage on the order of 1500 W at a capacitance of 32 μF might be replaced with a capacitor bank having a capacitance on the order of 28 μF so as to produce a constant wattage on the order of 900 W, which may be an adequate wattage to operate the 224 XM-L LEDs (available from Cree LED, Inc., Durham, N.C.) that is wired in parallel with two strings of 112 LEDs within a LED retrofit fixture or the like.

It is further contemplated that adjustment of the power or wattage supplied to the pole(s) may be made using Smart Lamp® technology such as that disclosed in U.S. Pat. Nos. 7,675,251; 7,956,551; and 8,098,024 that may already be installed with the previous HID lighting system. For example, as understood with reference to FIGS. 7 and 24, the pole cabinet 10 may contain a cam timer assembly 34, 34a that includes various cams, and contactors to vary the capacitance and therefore the power supplied to the HID lamps over time to compensate for the loss of lumen efficiency that such lamps experience over time.

More specifically, a motor 36 is powered to rotate the cams so that certain contactors are in contact and then switched off so that different capacitors with different capacitance are in the circuit, changing the wattage.

When a retrofit LED lighting system is being created, the motor may be disconnected, and the cams may be rotated manually via a reset wheel 38 (or a lever as shown in FIG. 7, etc.) to modify the capacitance and the resulting power supplied to the pole(s). Such a system or methodology may not be available in other embodiments of the present disclosure.

Wire Keeper

As already mentioned earlier herein, the various ECEs may need to be rewired after ballasts have been removed. Those ballasts still being used will be plugged into the connectors 316 of the circuit board. However, those not being used, or other electrical or electronic components no longer being used will then have loose ends that need to be addressed to avoid shorts or the like. In some instances, wire nuts or the like may be employed to cover the exposed end of the wires. In other instances, a wire end bracket may be provided that is attached to the interior of the ECE, other cabinet, or to the enclosure of the circuit board and heat sink as will be described momentarily.

In some embodiments, right angle connectors are unplugged from the unused ballasts and secured in a wire keeper as will described in more detail momentarily herein. Bare strand wires may be disconnected from the timer motor as previously alluded to herein and may be capped off with a closed end splice that is crimped on each wire to insulate. Then, the wire ends may be secured in a wire keeper (also referred to as a wire end bracket) which may then be secured to a DIN rail of the ECE.

Figure 25:
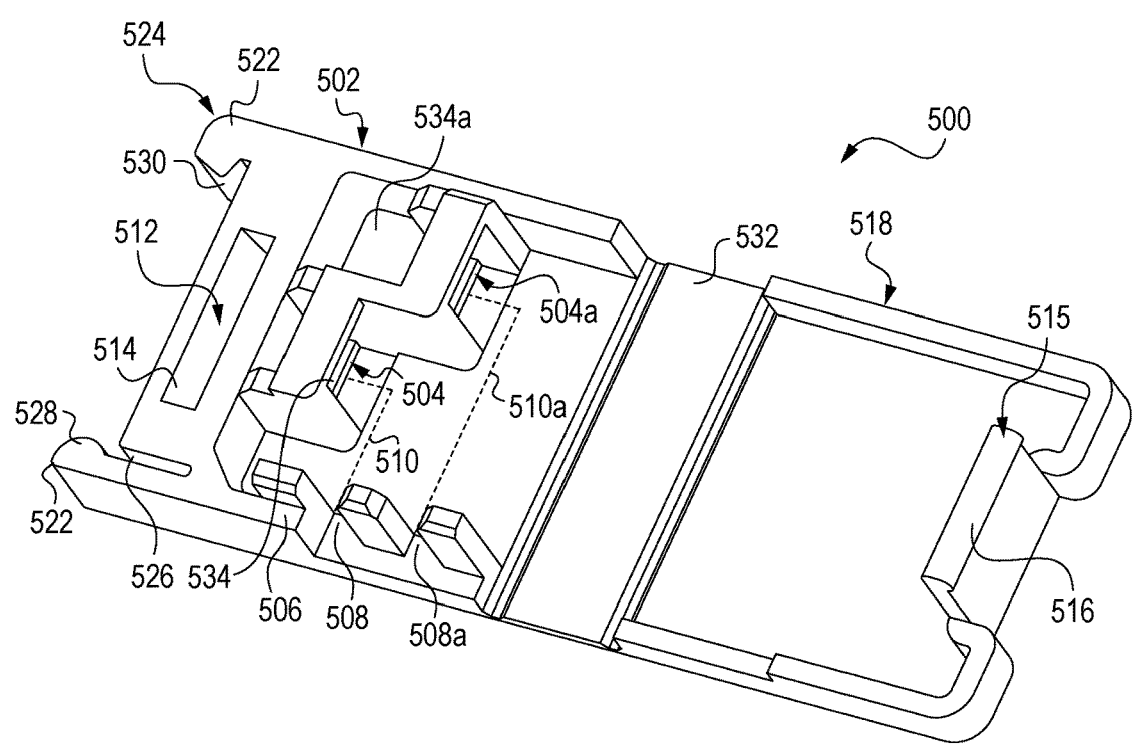
FIG. 25 is a perspective view of a wire end bracket shown in an open configuration.

Such a wire end bracket 500 as shown in FIG. 25 may comprise a first half 502 defining a first wire connector receiving cavity 504 that is disposed within an exterior wall 506. This cavity may be at least partially defined by a square or rectangular shaped entrance for receiving a crimped right angle wire connector (sometimes referred to as a faston). Also, a first wire receiving slot 508 may extend through the exterior wall 506 to allow a wire to enter the first half as its connector is placed into the first wire connector receiving cavity. As a result of this structure, the first wire connector receiving cavity forms a first L-shaped path 510 with the first wire receiving slot. This path generally represents the path the wire and connector form when stored in the wire end bracket.

The first half 502 also forms an interior snap feature 512 in the form of a snap receiving slot 514 for receiving the male snap projection 516 of the second half 518. It is contemplated that these snap features of the first half and the second half may be swapped in other embodiments of the present disclosure.

Figure 26:
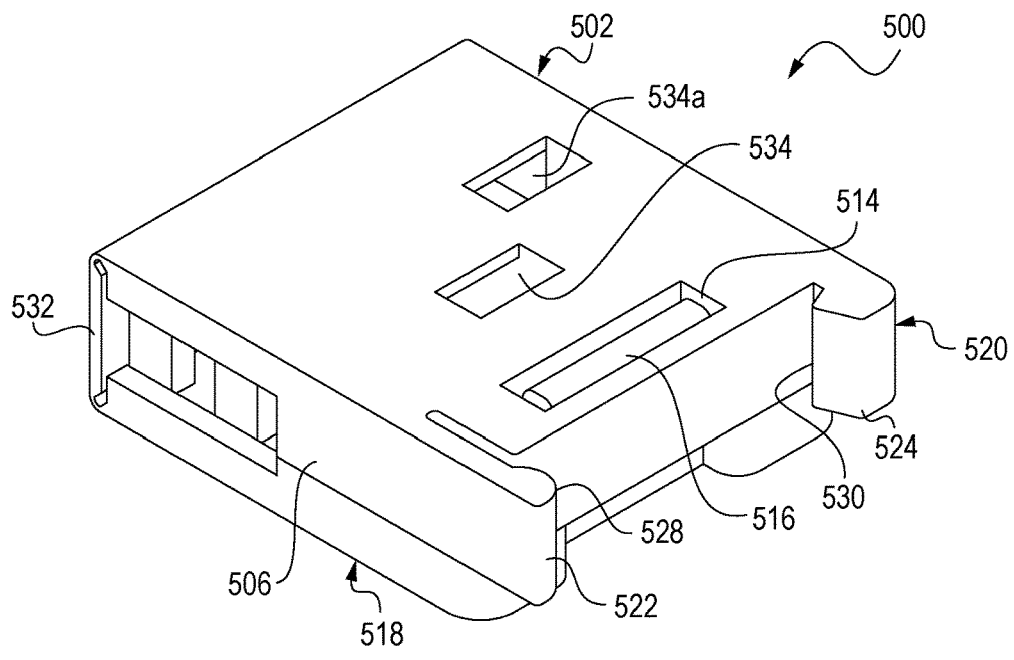
FIG. 26 is a perspective view of a wire end bracket shown in a closed configuration.
Figure 27:
FIG. 27 is a perspective view of a LED luminaire with a visor with a top surface forming a top angle with the horizontal that is about 12 degrees according to an embodiment of the present disclosure. An optional uplighting lens is shown attached to the front of the visor.

Looking at FIGS. 25 and 26 together, there is an exterior snap feature 520 extending from the exterior wall 506 of the first half 502. More specifically, the exterior snap feature 520 may include a pair of male snaps 522, 524. Male snap 522 may be configured to flex via slit 526, while male snap 524 may not be so configured. These snaps may include inwardly extending protrusions 528, 530 that are differently configured. Protrusion 528 may be rounded while protrusion 530 may be more angular so that it grabs a structural member more aggressively than protrusion 528 which is intended to be more flexible because of the slit.

Figure 47:
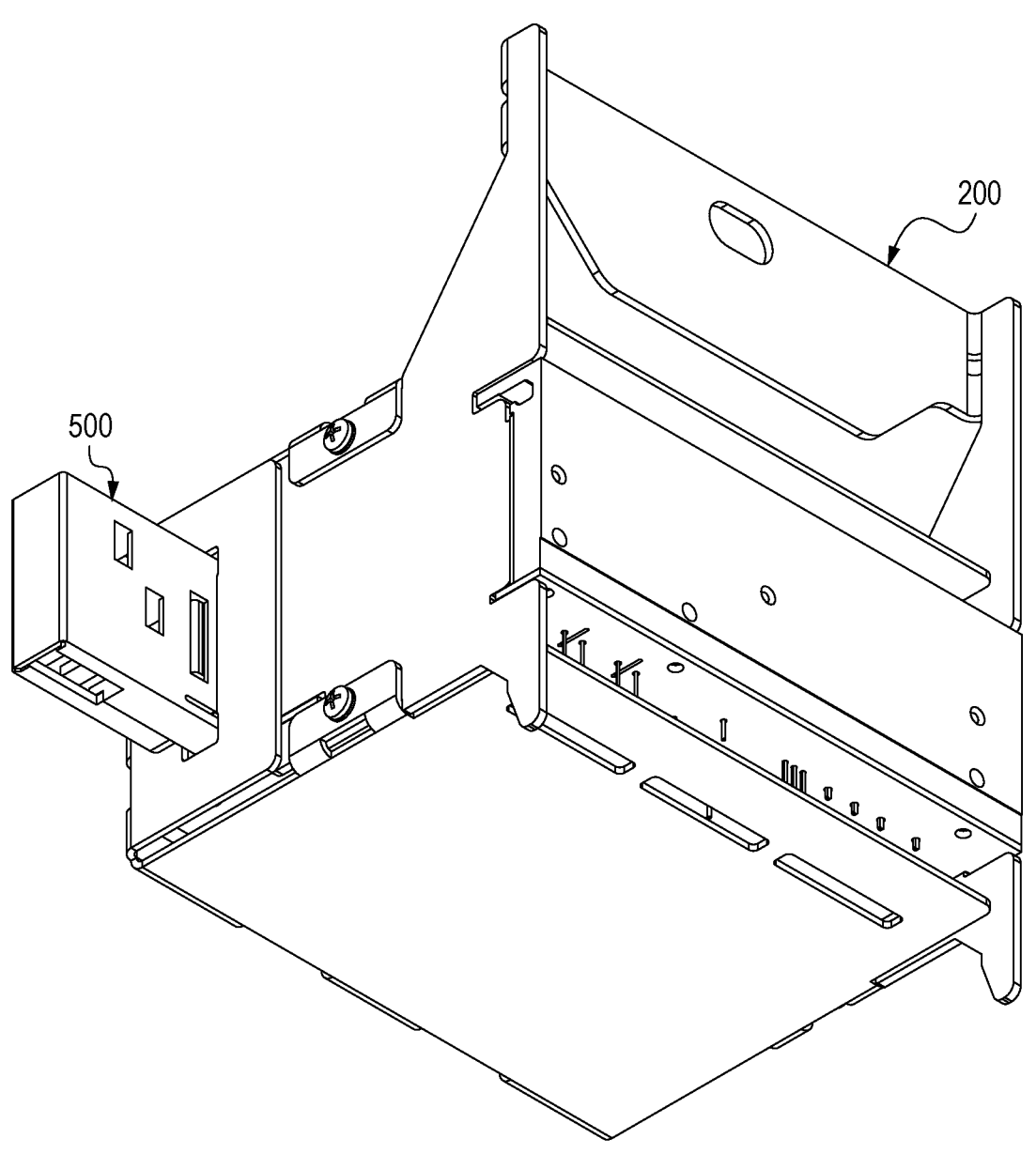
FIG. 47 is a rear oriented perspective view of a circuit board and heat sink subassembly with a wire end bracket shown attached to its side.

As a result of this structure, the wire end bracket may be attached via these snaps and their insertion into the first and second side apertures 226, 228 of the self-contained ballast drive assembly 200 as understood with reference to FIGS. 8, 11 and 47.

As just alluded to herein with reference to FIGS. 25 and 26, the second half 518 may include a second half snap feature 515 that is configured to engage the interior snap feature 512 of the first half 502. Also, the second half 518 may be joined to the first half 502 by a living hinge 532, but not necessarily so.

As best seen in FIG. 26, the first half 502 may further define a second wire connector receiving pocket 504a, as well as a second wire receiving slot 508a that forms a second L-shaped path 510a. These paths 510, 510a are nested adjacent to each other, but not necessarily so.

In FIGS. 25 and 26, the first half 502 may define a first window 534 that extends from the first wire connector receiving cavity 504 through to the exterior of the first half 502, and a second window 534a that extends from the second wire connector receiving cavity 504a to the exterior of the second half 518. These windows may allow the user to see that the connectors are in the bracket, and also allow these cavities and holding structure to be molded by mold cores that may exit through the windows after the plastic has been solidified.

The wire end bracket may be molded from any suitable thermoplastic such as nylon, polypropylene, ABS (acrylonitrile butadiene styrene), etc.

As illustrated in FIG. 7, the wire end bracket may have a feature (such as the slot disposed between the exterior snap features) so that it can be mounted on a standard DIN rail of the ECE as well as the sides of the enclosure of the ballast driver.

In some embodiments, a straight wire nut may be attached to a free end of the wire(s) that is not placed into the connector receiving cavity forming an L-shaped path but just past the exterior wall so that the general interior of the first half of the wire end bracket acts as the connector receiving cavity. Then, the second half may be attached to the first half to enclose the wire end(s), etc.

LED Luminaire

Next, a LED luminaire that may fit in the "footprint" of a previously installed HID lamp without physical and/or photometric interference as alluded to earlier herein will now be discussed starting with FIGS. 34 thru 34. These various LED luminaires may also be able to supply enough lighting so that a reduction in the number of fixtures or lamps as compared to previous HID lighting systems may be achieved. Also, these various LED luminaires may also use existing fixture components, but not necessarily so.

Figure 34:
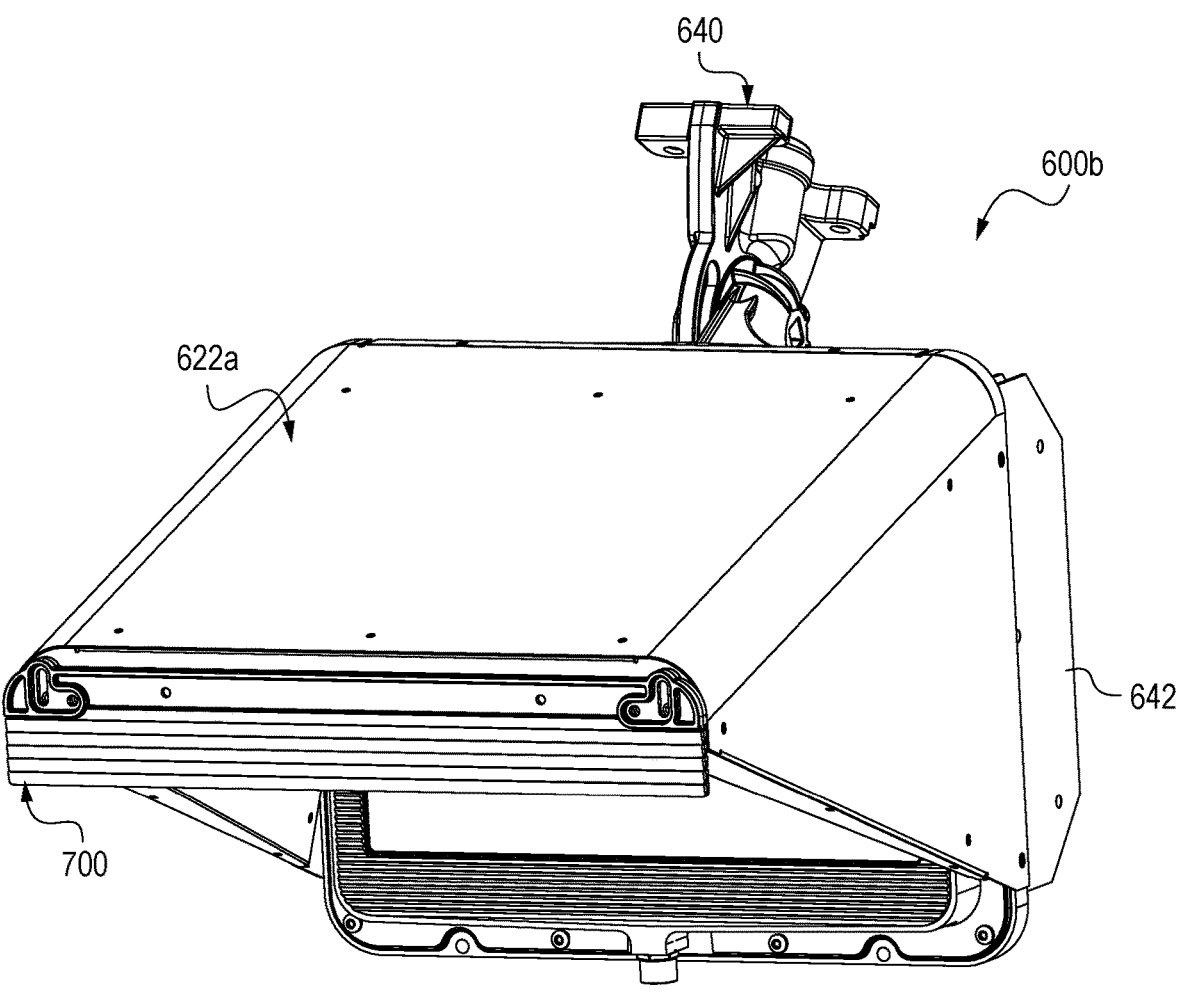
FIG. 34 is a perspective view of a LED luminaire according to yet another embodiment of the present disclosure that is similarly or identically configured as that of FIG. 32 except that the top surface of the visor forms a top angle with the horizontal that is about 18 degrees.
Figure 38:
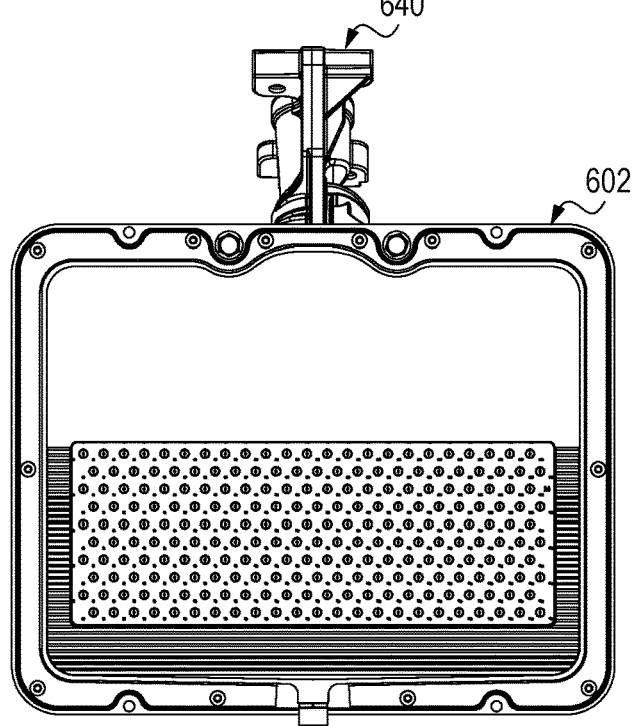
FIG. 38 depicts the LED luminaire of FIG. 37, showing that the fixture, knuckle, and heat sink, etc. are identical for all three embodiments shown in FIGS. 27 thru 34.
Figure 39:
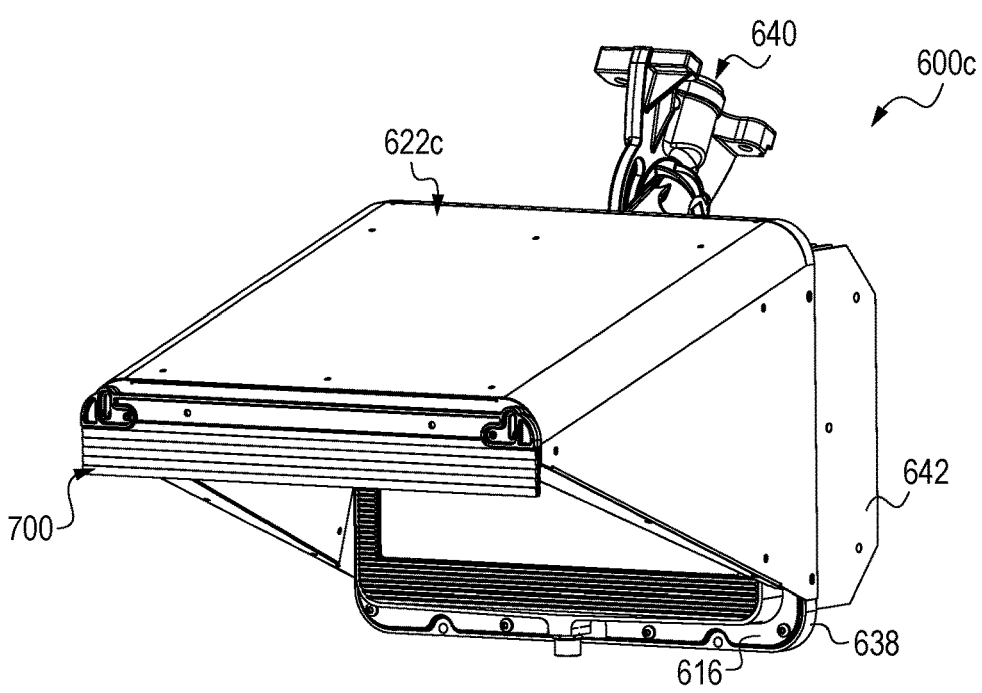
FIG. 39 is a perspective view of a LED luminaire according to yet a further embodiment that is similarly or identically configured as that of FIG. 34 except that bottom surface of the visor as shown in FIG. 40 is undulating.
Figure 40:
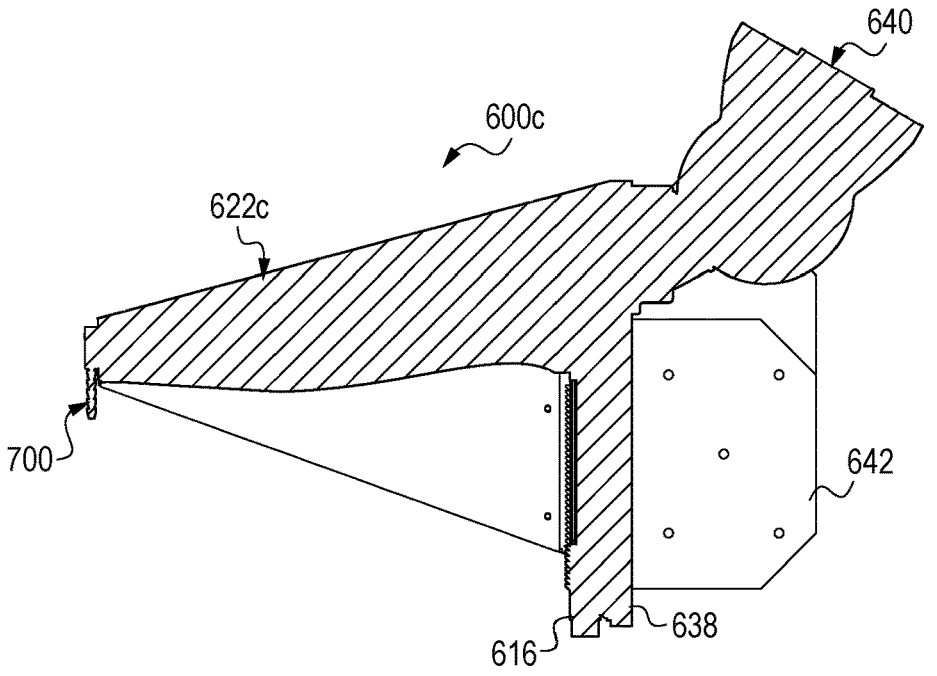
FIG. 40 is a side sectioned view of the LED luminaire of FIG. 39.

Referring now to FIGS. 34 and 38, a LED luminaire 600, 600*a*, 600*b*, 600*c* may comprise a fixture 602 defining a fixture perimeter 604 with a horizontal width 606 (measured along the X axis of the Cartesian Coordinate System shown), and a vertical height 608 (measured along the Y axis of the Cartesian Coordinate System shown). In some general embodiments, a ratio of the horizontal width 606, to the vertical height 608 may range from 0.90 to 1.25. In more specific embodiments, the ratio of the horizontal width 606 to the vertical height 608 ranges from 0.97 to 1.17. The nominal value for this ratio may be about 1.07, making the fixture perimeter almost square shaped or more generally rectangularly shaped. In an embodiment of the present disclosure, the horizontal width 606 may range from 14.0 inches to 15.5 inches (e.g., about 14.75 inches), and the vertical height may range from 11.0 inches to 13.0 inches (e.g., about 12.0 inches) in some embodiments of the present disclosure. In further embodiments of the present disclosure, the width may be about 14.25 inches to 15.25 inches (e.g., about 14.76 inches), and the height may be 11.5 inches to 12.5 inches (e.g., about 12.0 inches) These ranges may be different in other embodiments where the footprint of the preexisting HID lamp is different, if a larger knuckle is used that extends further down, etc.

Focusing on FIG. 38, the LED luminaire 600, 600*a*, 600*b*, 600*c* may include a hexagonal array 610 of LEDs including 10 horizontally extending rows 612 and 23 diagonally 614 extending rows, yielding 230 LEDs. This array may be rectangular or have other configurations in other embodiments of the present disclosure. For example, more or less LEDs may be used in other embodiments of the present disclosure.

The LED luminaire 600, 600*a*, 600*b*, 600*c* may also include a front fixture frame 616 defining a window opening perimeter 618, and a plurality of light sources (e.g., the optics and/or LEDs) disposed within the window opening perimeter 618. The plurality of light sources is spaced a maximum vertical distance 620 from the fixture perimeter 604.

In some embodiments of the present disclosure, a ratio of the vertical height 608 of the fixture perimeter 604 to the maximum vertical distance 620 ranges from 1.70 to 2.45. In more specific embodiments of the present disclosure, this ratio of the vertical height 608 of the fixture to the maximum vertical distance 620 ranges from 1.85 to 2.24. These ranges may allow the LED luminaire to fit within the "footprint" of the previous HID lamp and place the LEDs low enough so there is little to no photometric interference with nearby LED luminaires. This may not be necessary in other embodiments of the present disclosure.

Figure 28:
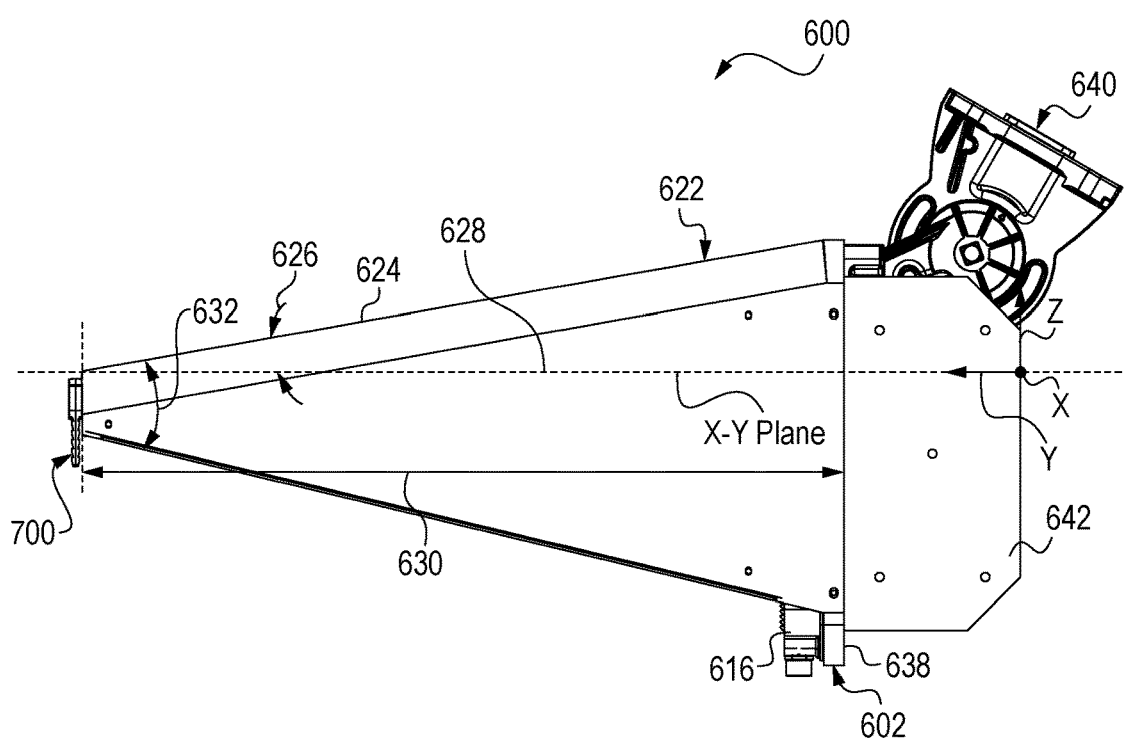
FIG. 28 is a side view of the LED luminaire of FIG. 27.
Figure 29:
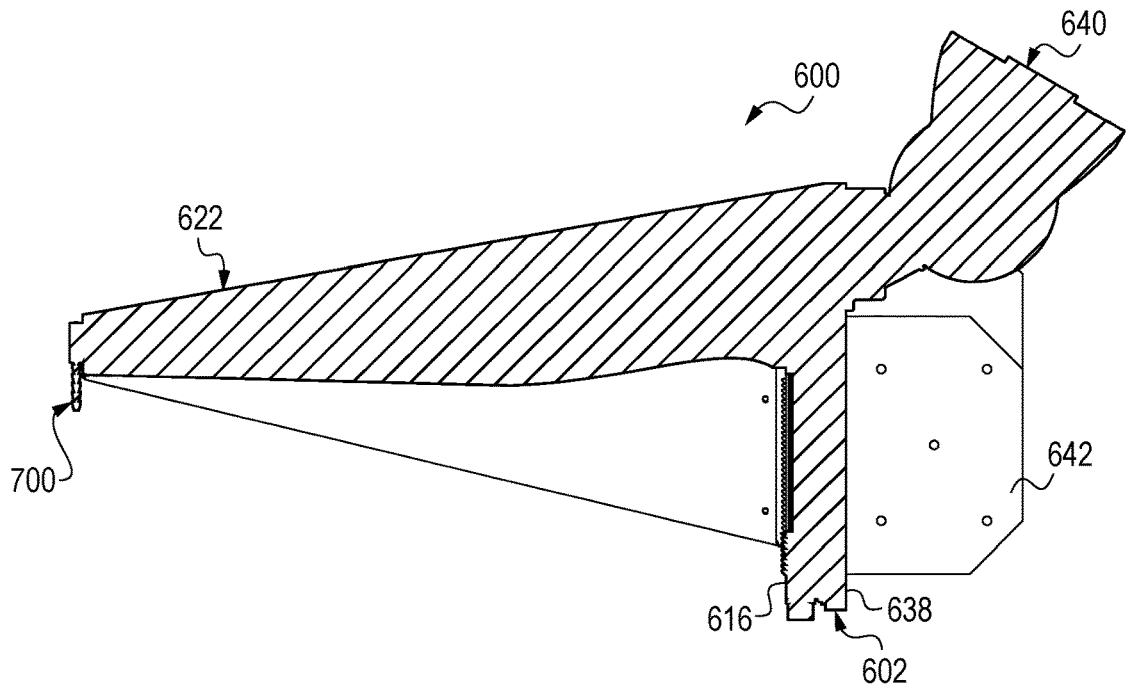
FIG. 29 is a sectioned side view of the LED luminaire of FIG. 28, revealing the curved bottom side of the visor, the optics, and the LEDs.
Figure 30:
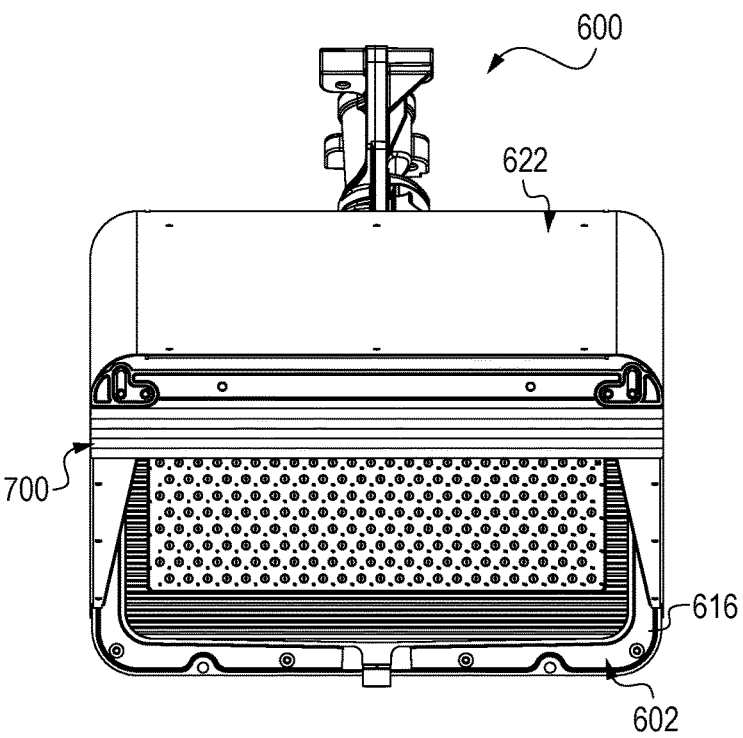
FIG. 30 is a front view of the LED luminaire of FIG. 27 with the external lens removed, revealing the secondary lens, and internal optics holder.
Figure 35:
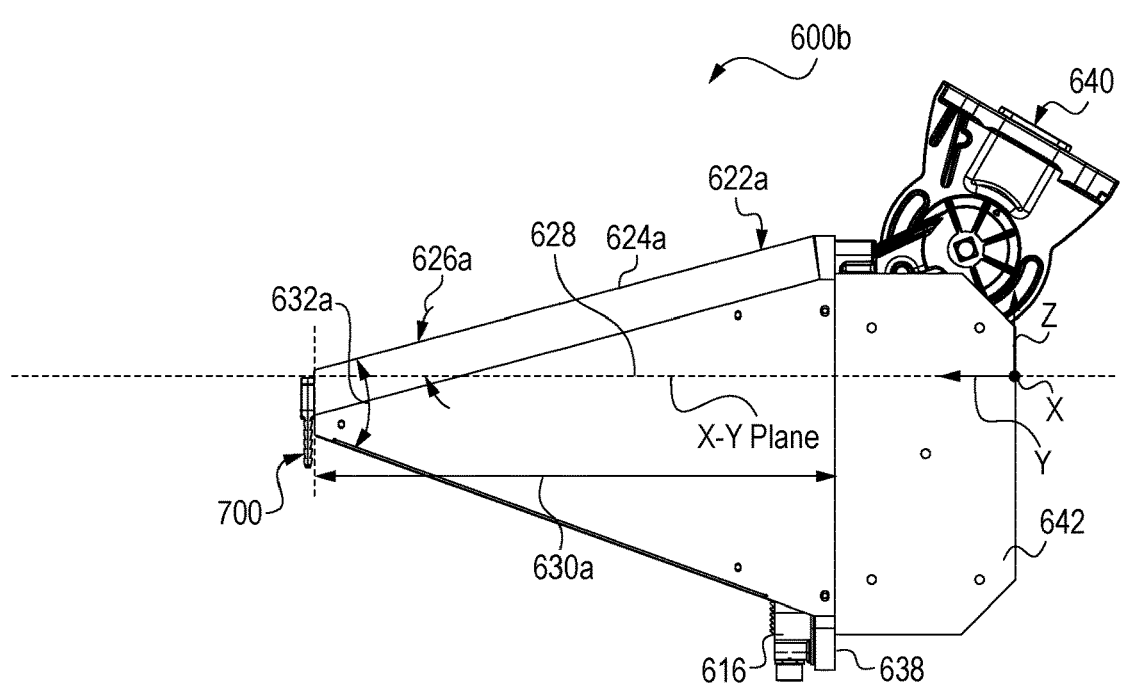
FIG. 35 is a side view of the LED luminaire of FIG. 34.
Figure 36:
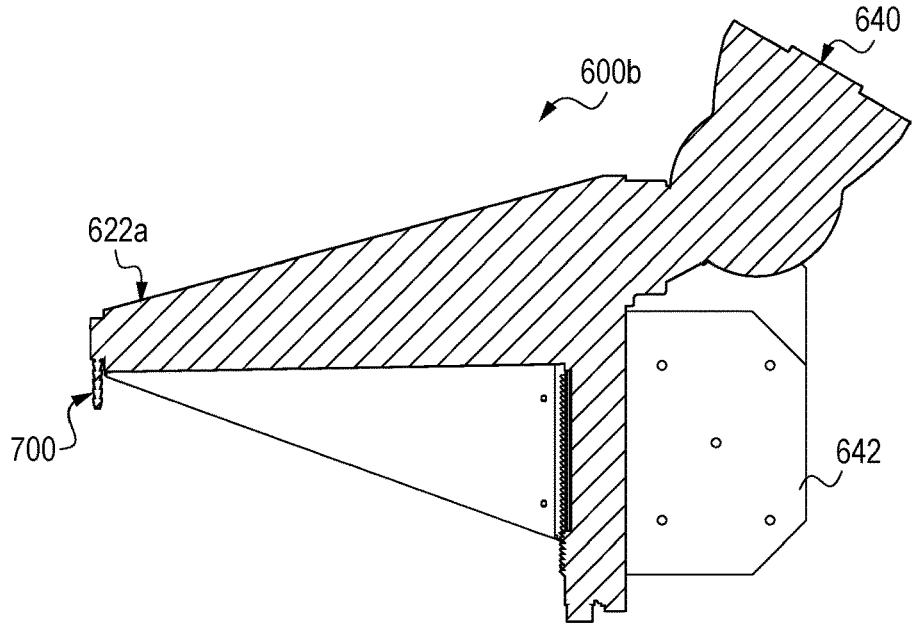
FIG. 36 is a side sectioned view of the LED luminaire of FIG. 35, revealing the optics, LEDs, internal lens, etc.
Figure 37:
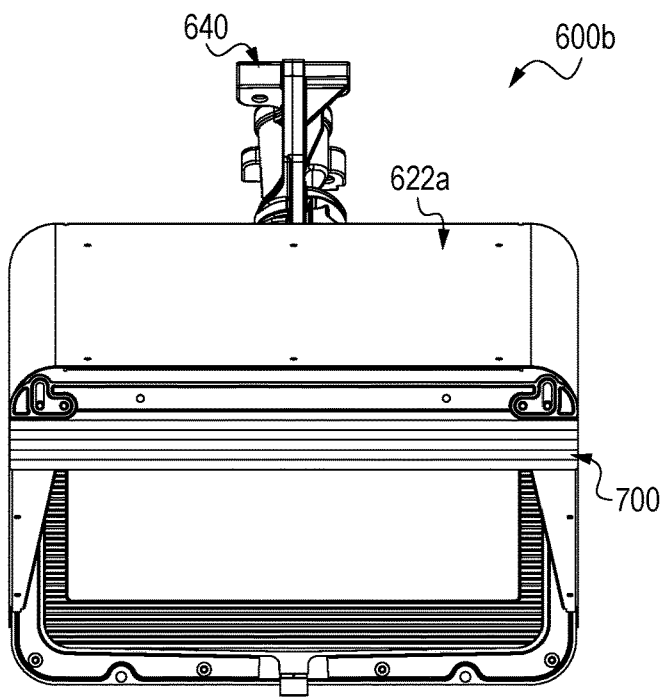
FIG. 37 is a front view of the LED luminaire of FIG. 34.

Looking at FIGS. 28 and 35, different visors 622, 622*a* that may be attached to the front fixture frame 616 may include a top surface 624, 624*a* that forms a top angle 626, 626*a* with a horizontal plane 628 (may be coincident with or parallel to the X-Y plane) that ranges from 10.0 degrees to 20.0 degrees. Specifically, the visor 622 in FIG. 35 may have a top angle 626 of about 12.0 degrees, while the visor 622*a* in FIG. 35 may have about a top angle 626*a* of about 18.0 degrees.

Figure 31:
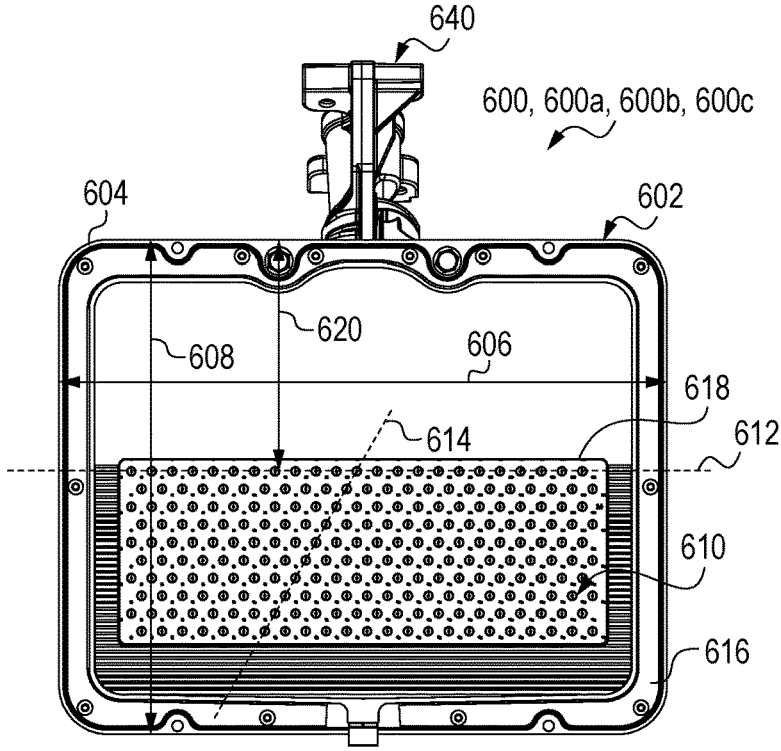
FIG. 31 illustrates the LED luminaire of FIG. 30 with the visor, and the uplighting lens removed, showing the square shaped perimeter of the fixture more clearly.
Figure 32:
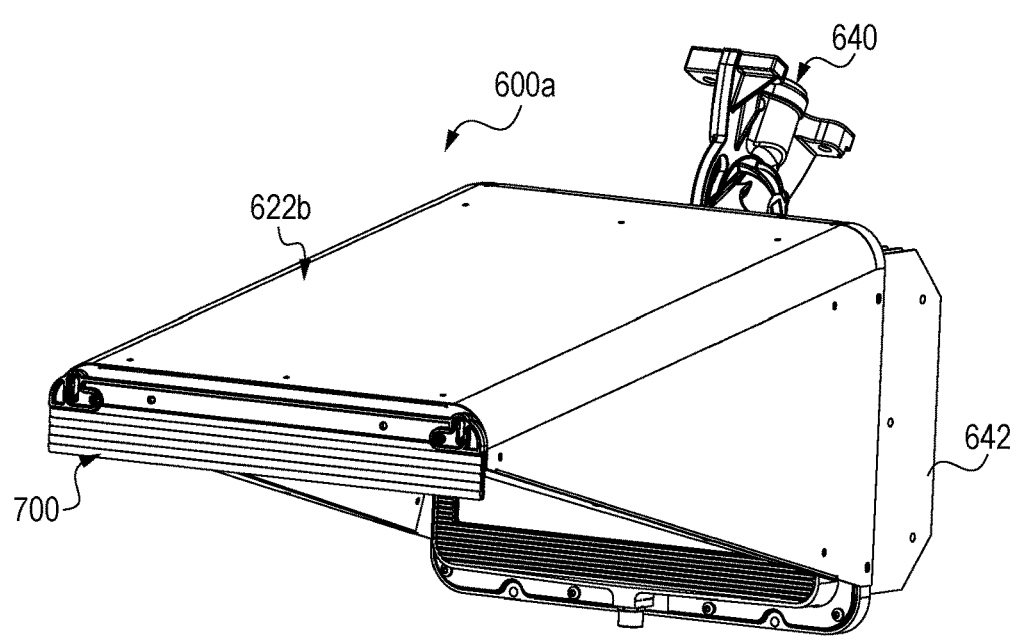
FIG. 32 is a perspective view of a LED luminaire according to another embodiment of the present disclosure that is similarly or identically configured as that of FIG. 27 except that the bottom side of the visor is straight as shown in FIG. 26.
Figure 33:
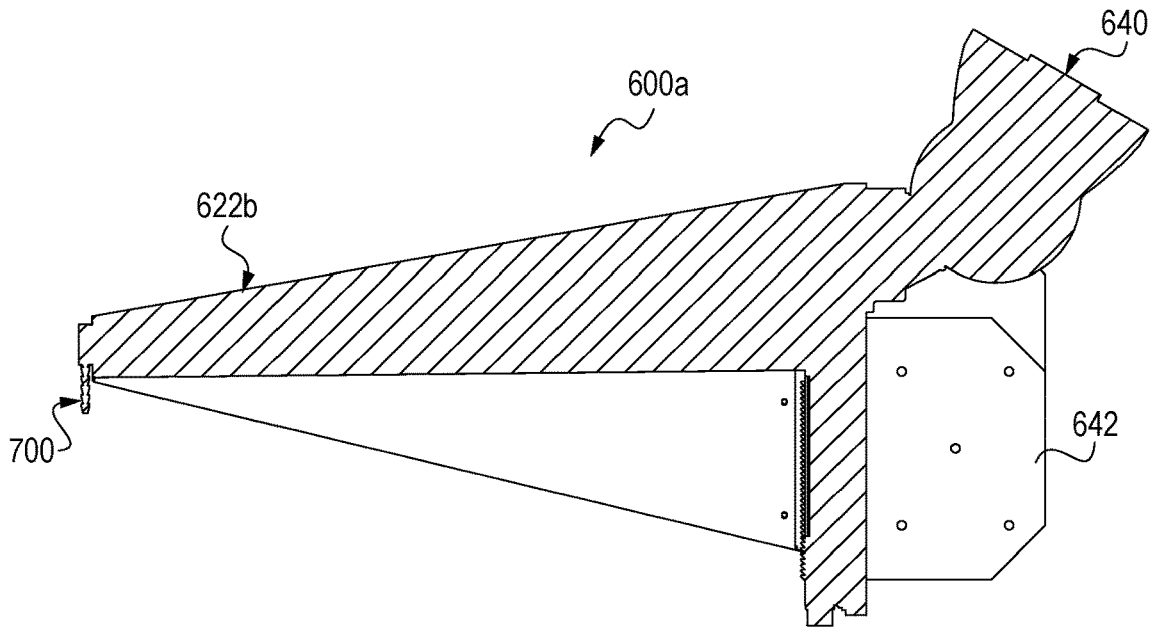
FIG. 33 is a side sectioned view of the LED luminaire of FIG. 32.

Similarly, these visors 622, 622*a* may extend a horizontal projection distance 630, 630*a* that is measured perpendicular to the horizontal width 606 (e.g., along the Y-axis), and a vertical height 608 of the fixture 602 as shown in FIG. 31. In some embodiments of the present disclosure, a ratio of the horizontal projection distance 630, 630*a* to the vertical height 608 ranges from 0.96 to 2.07. In more specific embodiments, this ratio ranges from to 1.05 to 1.90. Also, these visors 622, 622*a* may form a front included angle 632 (in the X-Z plane), 632*a* that allows the visors to extend far enough down to prevent or limit side glare, while also providing enough top clearance to avoid physical or photometric interference with adjacent luminaires/visors.

In FIG. 28, the front included angle 632 (in the Y-Z plane) may range from 20.0 degrees to 28.0 degrees (e.g., may be about 24.0 degrees), while the front included angle 632*a* may range from 32.0 degrees to 40.0 (e.g., may be about 36.0 degrees) in FIG. 35. In yet further embodiments of the present disclosure, the top angle may only be 0 to 5.0 degrees such that the top of the visor does not reach the top of the fixture. Even so, the bottom angles of the visors may be about 10.0 degrees to 20.0 degrees to limit side glare, etc.

As depicted in FIGS. 27 thru 30, 32 thru 37, 39 and 40, an uplight lens 700 may be attached to a free end of the visor 622, 622*a*, 622*b*, 622*c*.

As best seen in FIGS. 29, 30, 33, 36, 37, and 40, the uplight lens 700 may vertically cover 0% to 40% (e.g., about 30% to 40%) of the series of top rows of the hexagonal array 610 of LEDs when the uplight lens 700 is lowered (along the Z-axis) to its bottommost position as shown when viewed along the Y-axis. The diffuser may spread light upward to provide uplight to see a sports ball(s) when they are in the air. In some embodiments of the present disclosure, the uplight lens may be moved all the way upwards to minimize the upward direction of light and maximize the amount of light put down on the sports field or may be omitted altogether.

Figure 41:
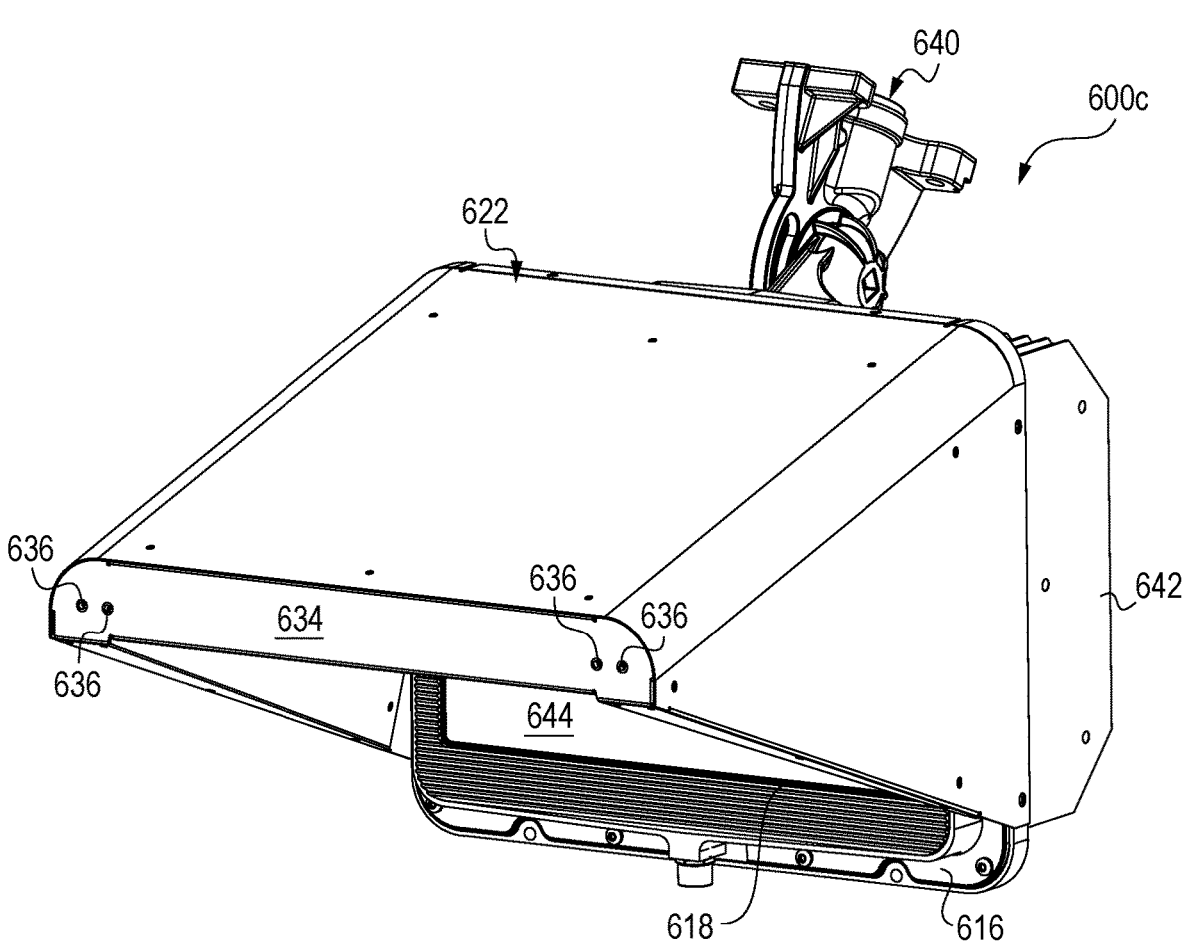
FIG. 41 shows the LED luminaire of FIG. 39 with the uplighting lens removed, revealing the mounting holes in the front panel of the visor. It is to be understood that the uplighting lens, an optic, or a diffuser may be used with every embodiment of a visor disclosed herein such that the front panels of each of the visors have the same mounting holes.

As shown in FIG. 41, the visor 622, 622*a*, 622*b*, 622*c* may include a front panel 634 with a plurality of mounting apertures 636. Also, the uplight lens 700 may include a plurality of mounting holes 702 (see also FIGS. 44 and 45) that are configured to align with the plurality of the mounting apertures 636.

Turning to FIGS. 27, 28, 29, 31, 35, 39 and 405, the LED luminaire 600, 600*a*, 600*b*, and 600*c* may include a fixture backplate 638, and a front fixture frame 616 attached to the fixture backplate 638. Also, a knuckle 640 (or armature, e.g., model nos. LED-3875-1, LED-5454-1, etc. that is sold by Musco Sports Lighting, LLC may be used) and a heat sink 642 that are attached to the fixture backplate 638.

Figure 42:
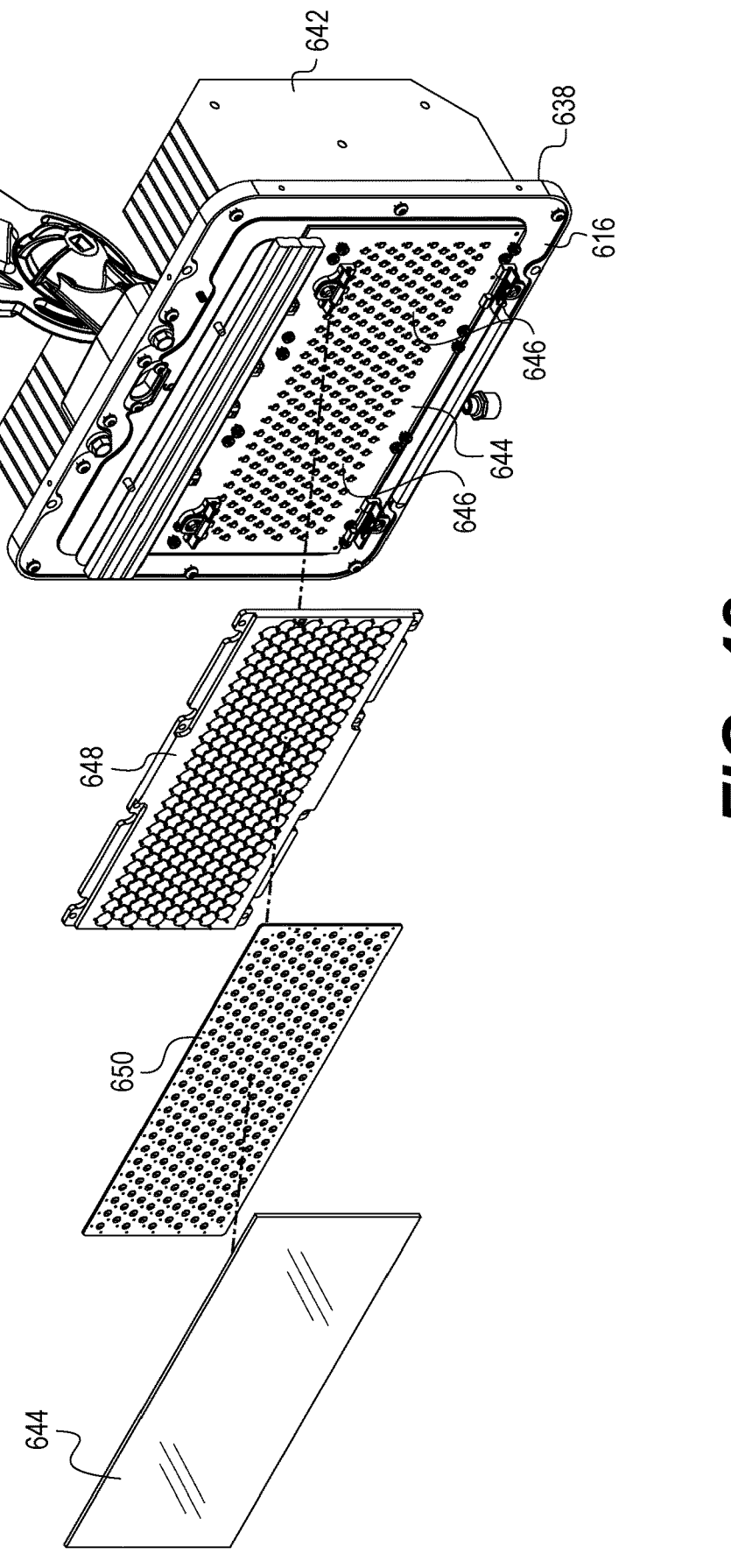
FIG. 42 is a partially exploded assembly view of the fixture of the LED luminaires disclosed herein.

Looking at FIGS. 31, 41 and 42, the front fixture frame 616 defines a window (see window opening perimeter 618) that is configured to receive an exterior lens 644. Also, a LED plate 644 with a plurality of LEDs 646 may be attached to the fixture backplate 638. An optics holder 648 with a plurality of apertures or recesses may be provided that are disposed about the LEDs once assembled and trapped between the front fixture frame 616 and the LED plate 644. Also, an optics plate 650 may be disposed in the optics holder 648 adjacent the LED plate 644 once assembled.

Figure 43:
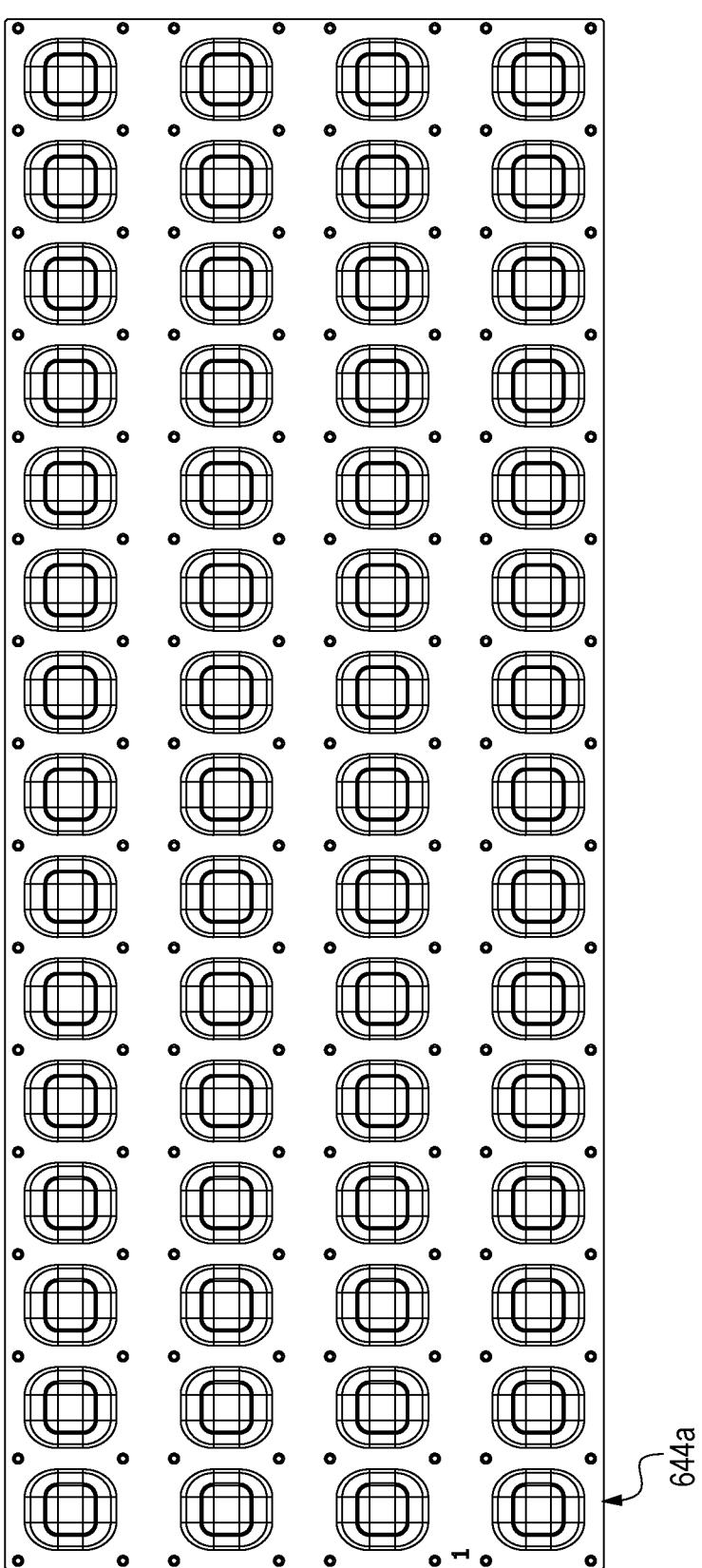
FIG. 43 is a perspective view of an optic with an array of quad LEDs to produce wide beams that may be used with the fixture of FIG. 42.

An alternative design for the LED plate 644*a* is shown in FIG. 43. There a quad LED optic for wide beams is illustrated that includes 4 horizontally extending rows and 15 vertically extending columns. Other arrangements, layouts, and configurations are possible in other embodiments of the present disclosure.

Uplight Lens

Figure 44:
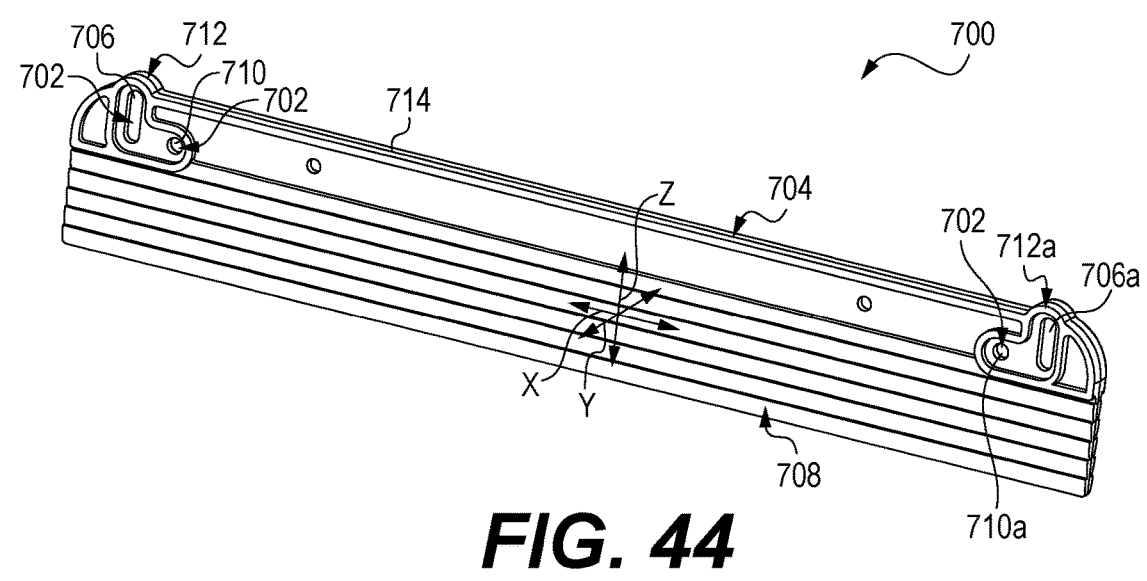
FIG. 44 is a perspective view of a lens configured according to an embodiment of the present disclosure shown in isolation.
Figure 45:
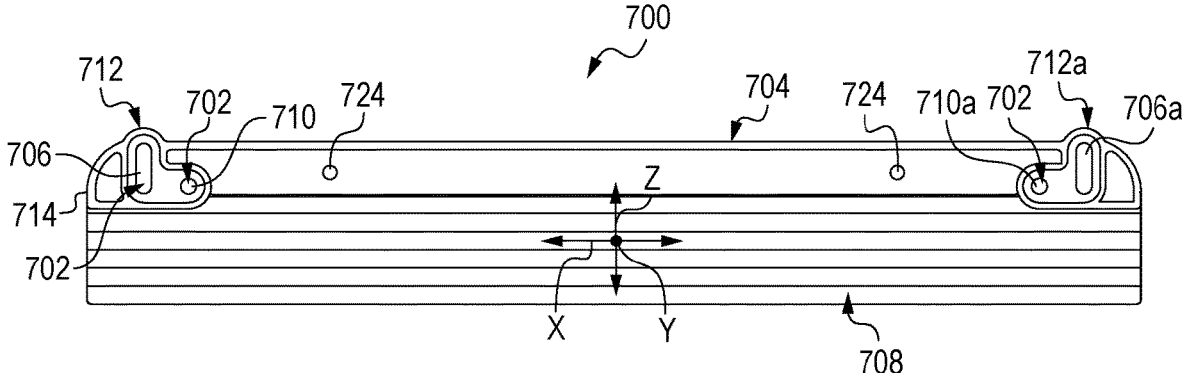
FIG. 45 is a front view of the lens of FIG. 44.

In FIGS. 44 and 45, the uplight lens 700 will be discussed in further detail. The uplight lens 700 may comprise an attachment portion 704 including a first elongated aperture 706, and a light directing portion 708 that is elongated along a direction that is non-parallel (e.g., along the X-axis or horizontal direction) to the first elongated aperture 706 (which is elongated along the Z-axis or vertical direction).

Figure 46:
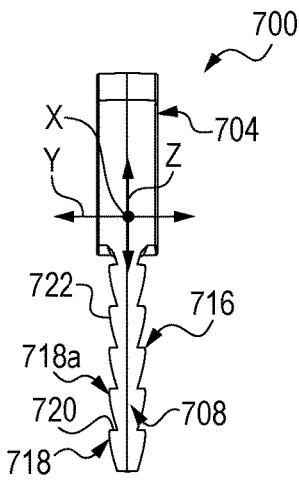
FIG. 46 is a side view of the lens of FIG. 44.

In FIG. 46, it can be seen that the attachment portion 704 and the light direction portion 708 are thinnest along a direction that is perpendicular to the horizontal and the vertical directions (e.g., along the Y-axis). This may not be the case for other embodiments of the present disclosure.

Referring again to FIGS. 44 and 45, the attachment portion 704 includes a second elongated aperture 706*a* that is elongated along the vertical direction (e.g., along the Z-axis), and the second elongated aperture 706*a* is spaced away from the first elongated aperture 706 along the horizontal direction (e.g., along the X-axis). Also, the attachment portion 704 may further define a first round aperture 710 that is disposed horizontally adjacent to the first elongated aperture 706. More particularly, the first round aperture 710 may be disposed horizontally between the first elongated aperture 706, and the second elongated aperture 706*a*.

Likewise, the attachment portion 704 may further define a second round aperture 710*a* that is disposed horizontally between the first round aperture 710 and the second elongated aperture 706*a*. Also, the attachment portion 704 may include a first protuberance 712 extending vertically that defines the first elongated aperture 706, and a second protuberance 712*a* that defines the second elongated aperture 706*a*. These protuberances may be omitted in other embodiments of the present disclosure.

Moreover, a wall or rib 714 may extend about the first elongated aperture 706, and the first round aperture 710 as well as the second elongated aperture 706*a*, and the second round aperture 710*a*. This may not be the case for other embodiments of the present disclosure. For example, the wall or rib may not extend across the top of the lens from one lateral side to the other.

As illustrated in FIG. 46, the light directing portion 708 may define a sawtooth pattern 716 or barbed tooth pattern in a plane that is perpendicular to a horizontal direction (e.g., the Y-Z plane). A double-sided sawtooth pattern is shown on both the front and rear of the lens, but this may not be the case for other embodiments of the present disclosure. The sawtooth pattern may include a first arcuate portion 718, a second arcuate portion 718*a*, and a straight portion 720 that connects the first arcuate portion to the second arcuate portion. The first and second arcuate portions may be similarly or identically configured as shown, but not necessarily so. For example, within a manufacturing tolerance of +/−0.005 of an inch.

In some embodiments, the first arcuate portion 718 is defined by a spline 722 (or a polynomial) that extends predominately along a vertical direction (along the Z-axis), and the straight portion 720 extends predominately along a direction that is perpendicular to the horizontal and the vertical directions (e.g., along the Y-axis). In FIGS. 45 and 46, a first plane of symmetry (e.g., the Y-Z plane) that is perpendicular to a horizontal direction, and a second plane of symmetry (e.g., the X-Z plane, may also be the mold parting line when molded) that is perpendicular to a direction that is perpendicular to the horizontal direction, and a vertical direction. One or more of these planes of symmetry may be omitted in other embodiments of the present disclosure.

FIGS. 48 thru 50 show another embodiment of the lens 700*a* that is similarly or identically configured as that shown in FIGS. 44 thru 46 except for the following difference(s).

The elongated aperture(s) 706*b*, 706*c* and the rib(s) 714*a* surrounding them is longer extending down into the light directing portion 708*a*. This allows more adjustment of the vertical placement of the lens relative to the LEDs or other light sources, giving the user more flexibility when adjusting how much uplight is created when attached to a luminaire. For example, this embodiment may allow for an inch of travel while the previous embodiment of the lens may only allow for half an inch of travel. When in a fully upward position, little to no uplight may be created.

Also, the number of construction holes 724, 724*a* is increased as compared to the first embodiment. These construction holes allow the lens to be created in subparts if so desired and attached to each other using a spline or the like. Of course, if a large enough mold or 3D printer, etc. is used to create the lens, then these construction holes may be omitted.

Turning now to FIG. 51, the light directing portion 708*a* include defines a polynomial curve in a plane that is perpendicular to the direction along which the light directing portion 708 (i.e., the planes of FIGS. 50 and 51) is elongated. It is to be understood that the curve in FIG. 51 is turned onto its side as compared to what is shown in FIG. 50.

More specifically, the polynomial curve may take the form of a parametrically defined degree=(n−1) Bezier curve 726, controlled by a set of (n) discrete control points, and by the following equation: $P(t)=(1-t)^2 Pr + {}^2t(1-t)P_q + t^2 P_p$ where $P_r$ and $P_p$ are predetermined endpoints, and $P_q$ is a center point that is varied to change spread angles from incoming light rays to a desired target.

For example, as shown in FIGS. 52 and 53, changing the position of $P_q$ results in different profiles, light refraction in the lens, and the resulting outgoing direction of the light.

In various embodiments of the present disclosure, a point on the Bezier curve may be defined by the following equation: $y(t)=(1-t)^2 y_r + {}^2t(1-t)y_q + t^2 y_p$, while the z coordinate of a point on the Bezier curve may be defined by the following equation: $z(t)=(1-t)^2 z_r + {}^2t(1-t)z_q + t^2 z_p$.

For the specific example shown in FIG. 51 using the coordinate system shown in FIG. 44, a Y coordinate of $P_r$ is 0, and a Z coordinate of $P_r$ is 0, a Y coordinate of $P_p$ is 0.046 inches, and a Z coordinate of $P_p$ is 0.259 inches, and a Y coordinate of $P_q$ is 0.582 inches, and a Z coordinate of $P_q$ is 0.184 inches.

Other types of curves may be used in other embodiments of the present disclosure.

It should be noted that the lens may be used in other applications other than uplighting, and may be made from various materials including glass, acrylate, polystyrene, polycarbonate, silicone, etc. Also, other devices for directing or redirecting light beam(s) such as diffusers and optics may be employed. For example, the inventors have tested a 60×1 holographic light shaping diffuser, a 40×0.2 holographic light shaping diffuser, a 30×30 holographic light shaping diffuser, and about a 30 degree ribbed asymmetric glass lens, etc.

Figure 54:
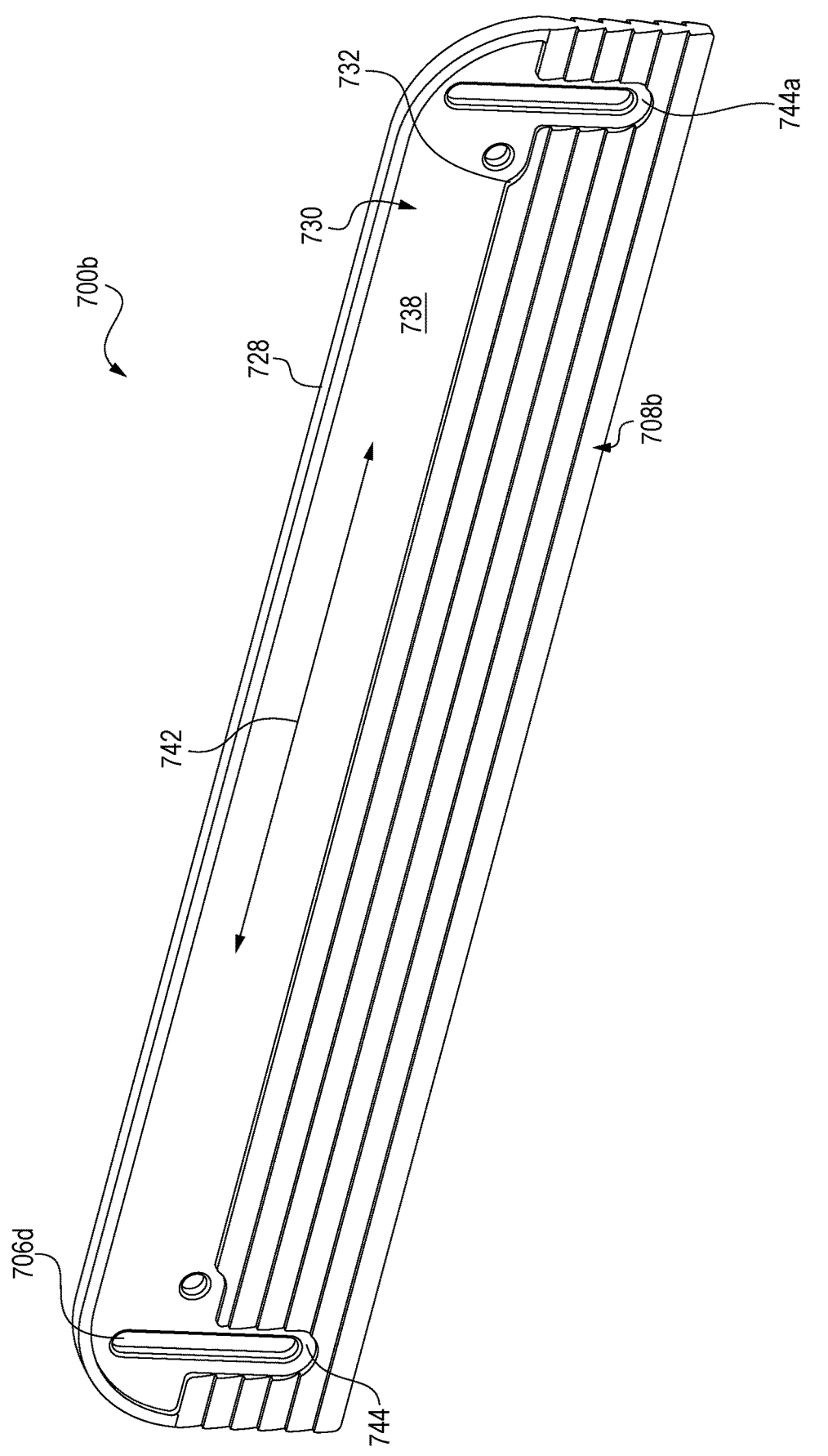
FIG. 54 depicts a front perspective view of yet another embodiment of the lens of the present disclosure.
Figure 55:
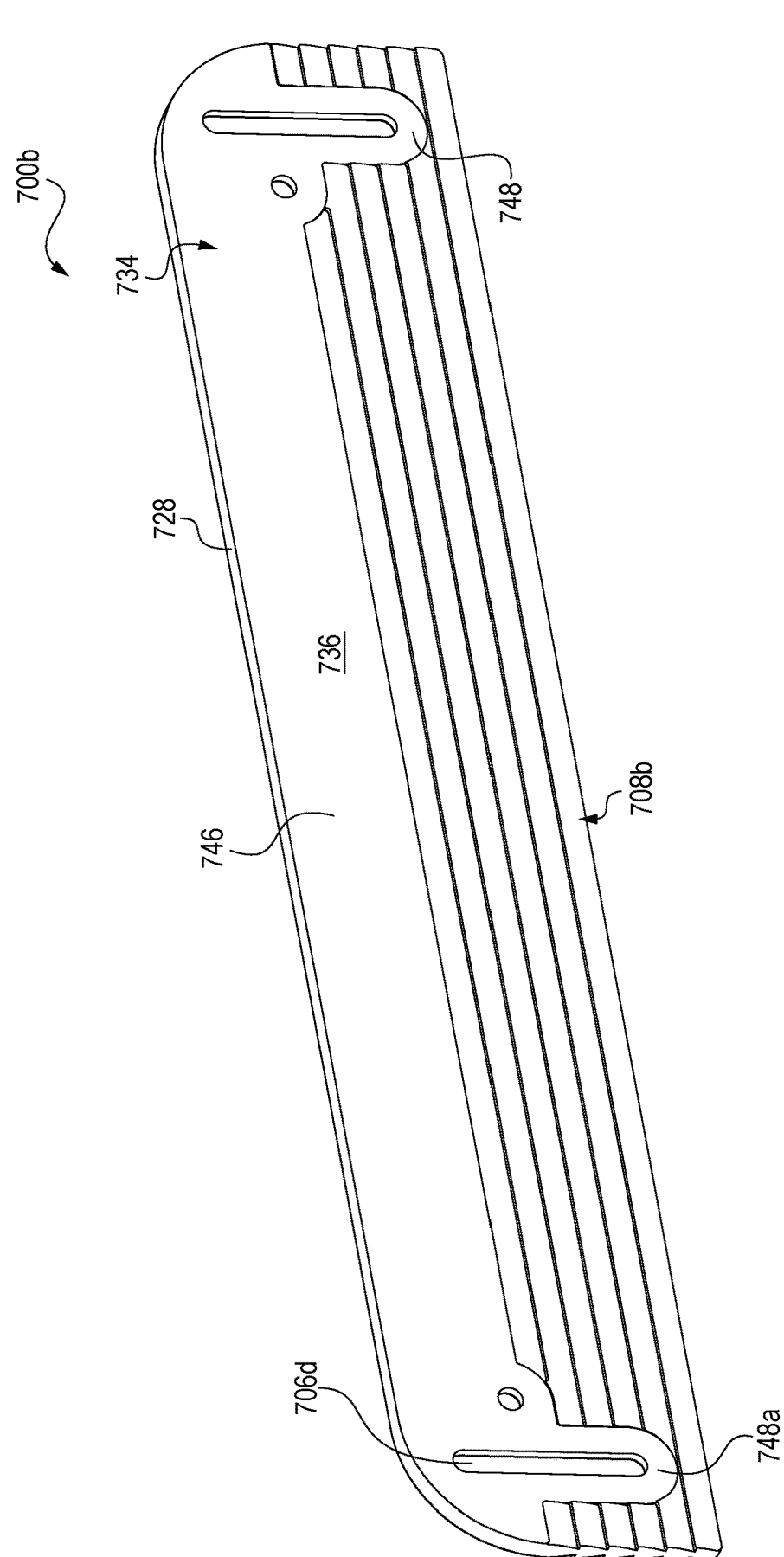
FIG. 55 contains a rear perspective view of the lens of FIG. 54 showing the mounting pad(s) of the lens.
Figure 56:
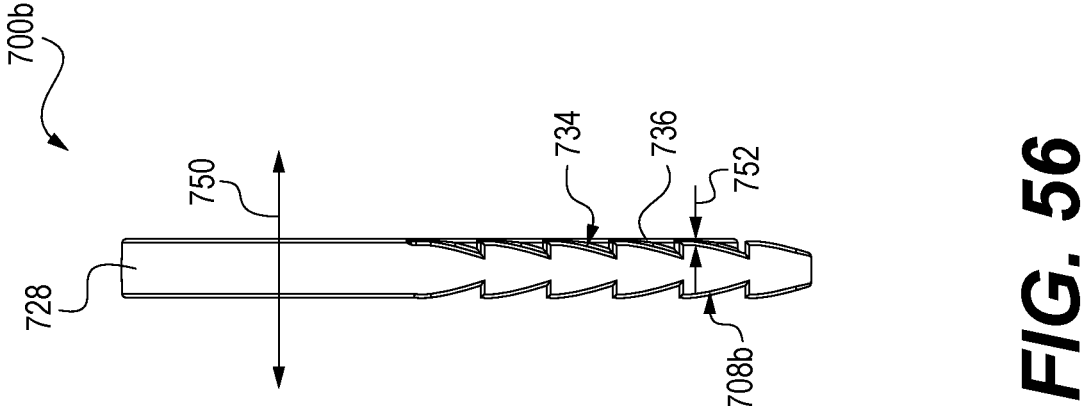
FIG. 56 is a right side view of the lens of FIG. 54.

Looking at FIGS. 54 thru 56, another embodiment of a lens 700b similar or identical to those (e.g., see lens 700, 700a) discussed earlier herein with reference to FIGS. 44 and 48 is shown except lens 700b has at least some of the following differences.

The protuberances 712, 712a shown in FIG. 44 are subsumed in FIGS. 54 thru 56 by providing a wall 728 that extends tangentially from the protuberances such that the attachment portion 704a is larger (taller) and is more robust.

Also, there is no longer a rib 714, 714a shown in FIGS. 44 and 48 on the front of the lens surrounding each set of the elongated apertures 706, 706a, 706b, and 706c and/or round apertures 710, 710a used for mounting. Instead, these mounting apertures are all disposed in a single front pocket 730 (see FIG. 54) that is surrounded by a continuous sidewall 732. It is contemplated that the pocket may be split in other embodiments of the present disclosure. The pocket 730 may allow the head of a fastener to be seated therein and be somewhat protected.

Furthermore, the rear of the lens 700b as seen in FIG. 55 now has a mounting pad 734 that may serve as a platform contacting the front of a visor of the luminaire (e.g., see front panel 634 in FIG. 41). The mounting pad 734 may have a substantially flat surface 736 (i.e., within a suitable manufacturing tolerance of +/−0.010″) so that stresses are not induced when the lens is fastened to the front panel of the luminaire. Like the pocket 730, the mounting pad 734 may also be split. The mounting apertures (or at least one mounting aperture) may extend through the rear mounting pad to the front pocket to allow a fastener to pass through it.

In either case, whether split or not, the mounting pad 734 may be commensurate or coextensive in size with the pocket so that it provides support and a consistent nominal wall thickness (may also limit flexing). This too may help ensure that the lens is robust enough to withstand any stresses exerted or induced upon it when fastened to the front panel of the luminaire. In fact, the pad may be slightly larger in surface area as compared to the bottom surface 738 of the pocket 730.

For example, the substantially flat surface 736 may define a surface area that is at least 3.75 in.² in some embodiments, and at least 7.5 in.² in further embodiments of the present disclosure. In particular embodiments of the present disclosure, the substantially flat surface 736 may have a surface area of 15.0 in.² (+/−10%). These ranges may be different in other embodiments of the present disclosure such as when the design is scaled up or down, or split into several separate mounting pads, etc. In any embodiment, the surface area may be large enough so that the head of a fastener is properly supported to prevent flexing or the induction of bending stresses.

Furthermore, the substantially flat surface 736 may be proud (see FIG. 56) of the light directing portion 708b along another direction 750 that is non-parallel to the first elongated aperture 706d a suitable amount 752 that is at least 0.002 of an inch or at least 0.005 of an inch in some embodiments of the present disclosure. In actuality, it may be proud by about 0.007 of an inch. Other amounts are possible in other embodiments of the present disclosure.

More specifically, the front pocket 730 (see FIG. 54) may include an elongated portion 740 that extends along the direction 742 that is non-parallel to the first elongated aperture 706d, and a pair of downwardly extending slot portions 744, 744a that are in communication with the elongated portion 740. In addition, the rear mounting pad 734 may include an elongated pad portion 746 that is at least coextensive with the elongated portion 740 of the front pocket 730, and a pair of downwardly extending leg portions 748, 748a that are at least coextensive with the pair of downwardly extending slot portions 744, 744a. This may not be the case in other embodiments of the present disclosure.

As a result of this construction, this lens 700b may not be reversible unlike lens 700, 700a that may be. It is further contemplated that a movable or slidable cutoff visor or plate such as disclosed in FIGS. 17 and 30 of U.S. Pat. No. 10,344,948 owned by the Applicant of the present disclosure may be used in lieu of the lens (lens typically used for a golf application) discussed herein in many industrial applications.

Aiming Plate

Figure 57:
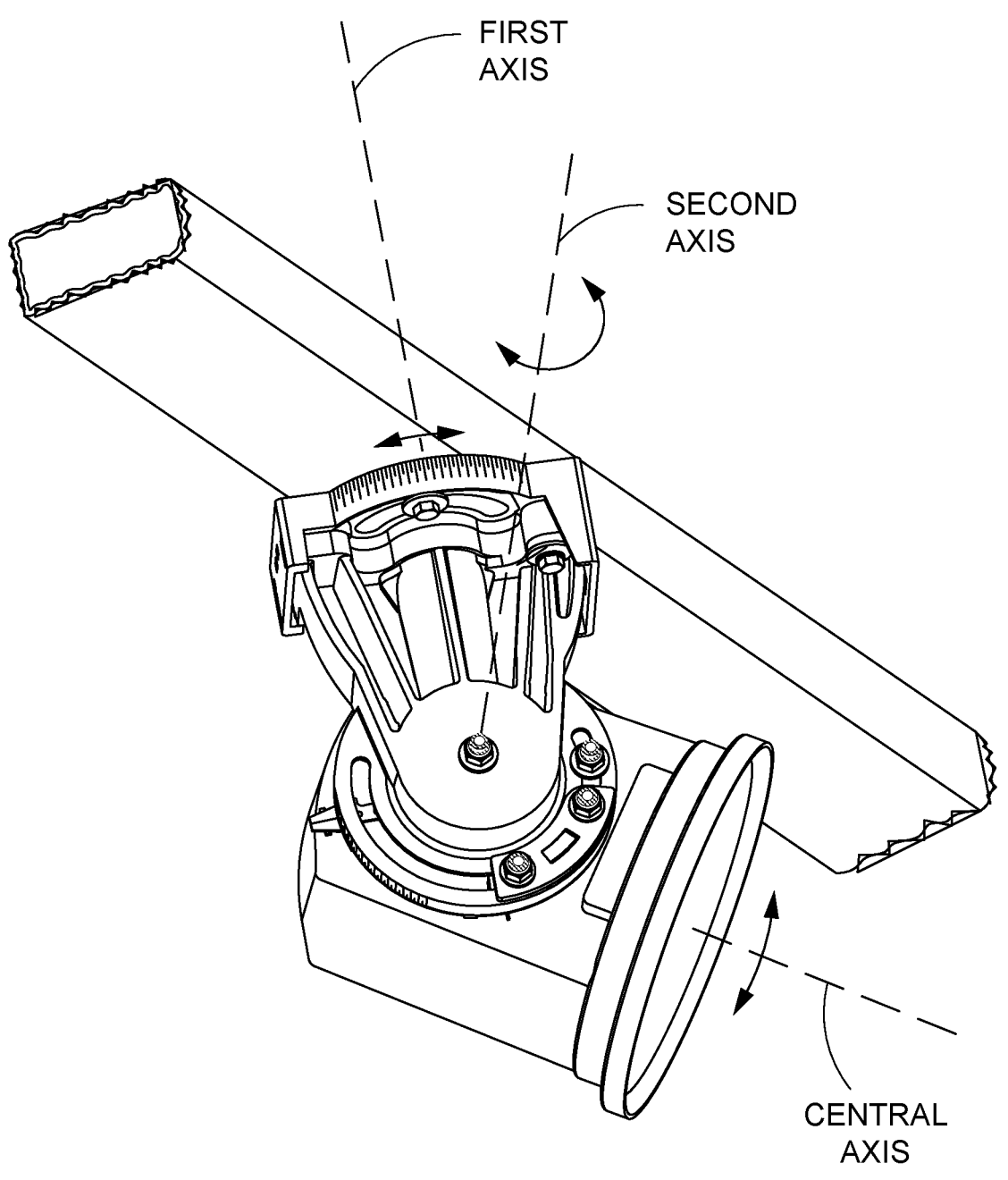
FIG. 57 illustrates the use of a horizontal aiming bracket employed on some HID lighting systems, as well as some LED lighting systems found in the field.

Turning now to FIG. 57, a horizontal aiming plate that is used in a factory aiming method as disclosed in U.S. Pat. No. 8,717,552 owned by the assignee of the present application is disclosed. The horizontal aiming plate includes angular markings to indicate to the user at what angle relative to a crossarm a fixture, or a luminaire is pointing. Using the method disclosed in the '552 patent, it is possible to pre-aim the fixture or the luminaire relative in both a horizontal plane and a vertical plane so that the fixture is pointing the appropriate direction when the pole and crossarm are installed in the field. If the luminaire or fixture is removed in the field, the angular orientations in both the horizontal plane and vertical plane may be reestablished reliably using the angular markings.

However, not all lighting systems in the field including HID lighting systems sold under the tradename of SportsCluster® use such a horizontal aiming plate having angular markings. As a result, once the fixture or the luminaire is removed from the crossarm, the knuckle also becomes loose such that the horizontal aiming direction is lost. However, many of these systems have the appropriate horizontal aiming direction or orientation recorded in plans, or the appropriate horizontal aiming direction of the fixture or the luminaire may be measured using a laser or the like and determined before the fixture or luminaire is removed.

Figure 58:
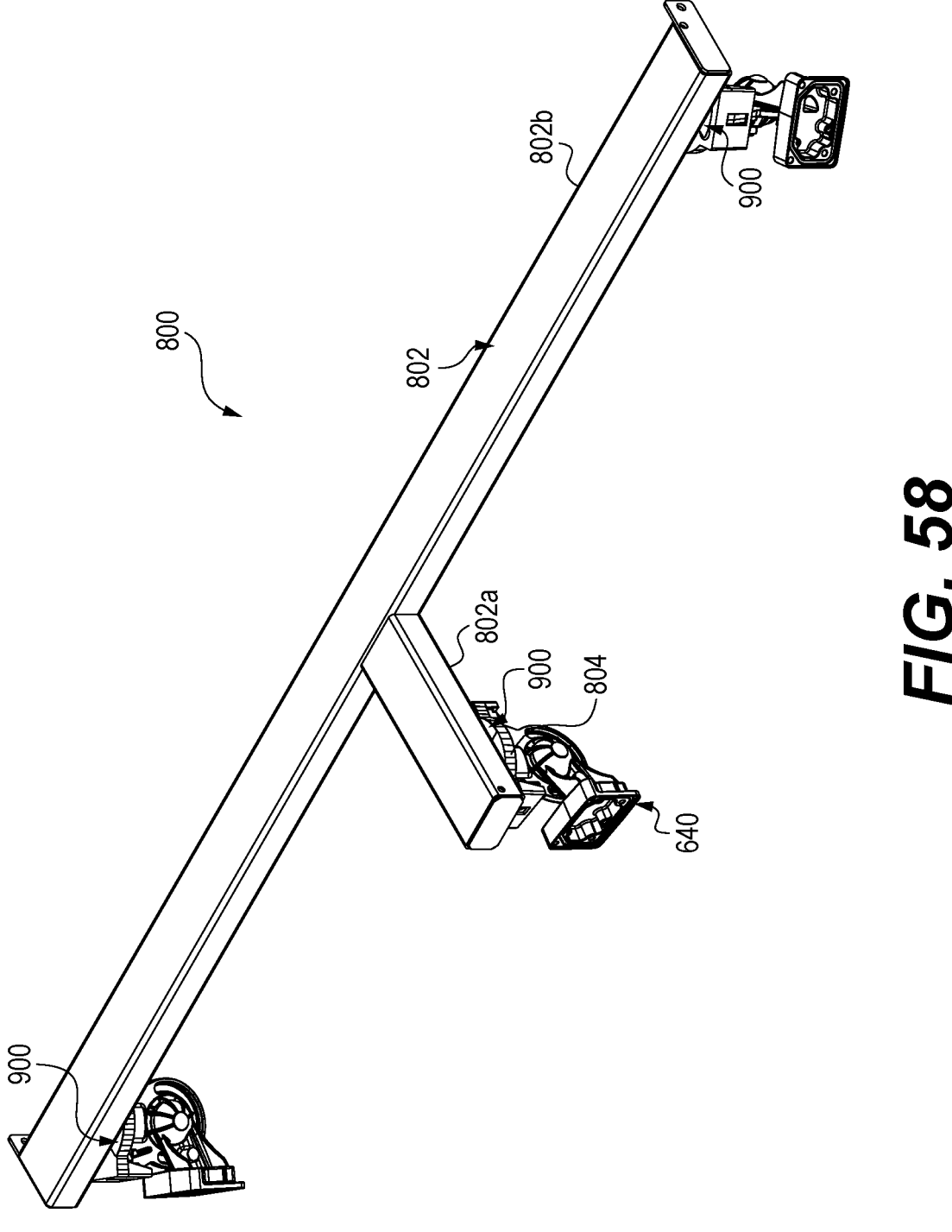
FIG. 58 is a perspective view of a main crossbeam and an auxiliary crossbeam attached to the main crossbeam with aiming brackets and aiming plates (may also be referred to as an aiming shim) according to an embodiment of the present disclosure. One aiming bracket and aiming plate is attached adjacent to each end of the main crossbeam while one aiming bracket and aiming plate is attached adjacent to the end of the auxiliary crossbeam.

This may allow the following apparatus to be employed to reestablish the appropriate aiming direction or orientation at the factory before the LED luminaire or the LED fixture is sent out to the field to replace a HID luminaire or a HID fixture. In some applications, this may be done for a new lighting system before it is sent out into the field. In FIGS. 47 and 48, a lighting system 800 that may allow appropriate horizontal aiming of a luminaire and/or its knuckle may comprise a first crossarm member 802, a first aiming bracket 804, and a first aiming plate 900 disposed between the first crossarm member 802 and the first aiming bracket 804. The first crossarm member 802 may be an auxiliary crossarm 802a (so called since it is shorter and extends from a longer main crossarm 802b), but may be a main crossarm 802b, etc. While not shown in FIGS. 58, 59 and onward, it is to be understood that the fasteners shown in FIG. 57 would be employed to attach the portions of the knuckle together as well as the knuckle to the aiming plate, and the aiming plate to the crossarm, etc.

As best seen in FIGS. 60 thru 63, a first knuckle 640 may be attached to the first aiming bracket 802 that includes a lower electrical receptable portion 806, and an upper knuckle portion 808 that is rotatably attached to the lower electrical receptable portion 806 about a first axis 810. This may set the vertical orientation or aiming direction, and may be fixed by tightening fasteners, etc. Also, the upper knuckle portion 808 of the first knuckle 640 is in fixed relation to the first aiming bracket 804 about a second axis 812 that is perpendicular to the first axis 810 once the upper knuckle portion is inserted into the aiming bracket and attached thereto.

Even so, the upper knuckle portion 808 of the first knuckle and the aiming bracket 804 are rotatable about the second axis 812 relative to the first crossarm member 802. In order to facilitate the horizontal aiming, the first aiming bracket 804 includes a periphery 814 with angle markings 815 at least partially disposed about the periphery 814. In such a case, the first aiming plate 900 may include a first angle indicator 902 that extends to the periphery 814 of the first aiming bracket 804 so that a user can read the relative angular orientation of the first aiming bracket to the first aiming plate. Alternatively, the angular markings may extend from the periphery to the angle indicator.

Figure 72:
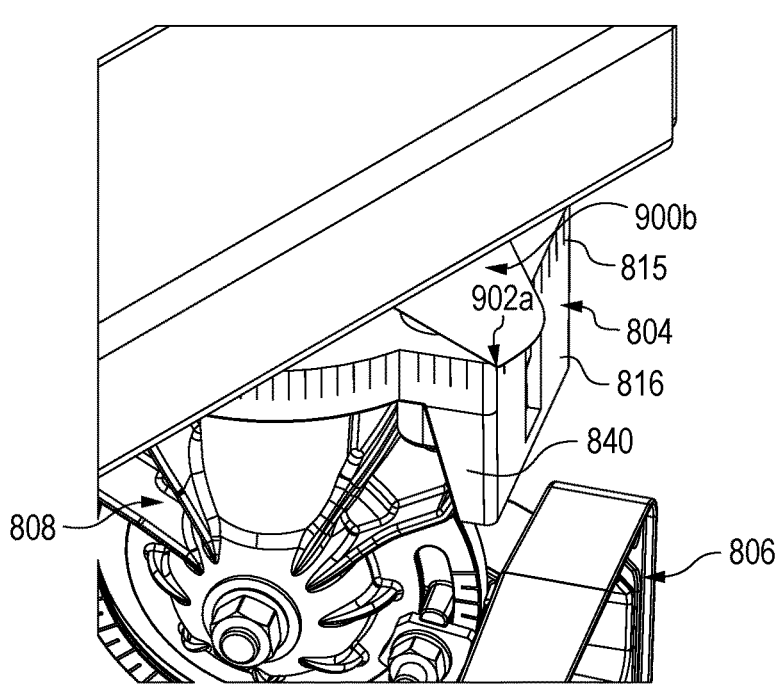
FIG. 72 is a perspective view of an aiming bracket used in conjunction with an aiming plate with an extending angle indicator portion so that a smaller angle may be more easily read along the front flat portion of the aiming bracket according to yet another embodiment of the present disclosure.

The angle indicator and the angle markings may be omitted in other embodiments of the present disclosure, or the angle markings and the angle indicator may be switched between the aiming plate and the aiming bracket, etc. As shown in FIG. 72, the periphery 814 of the first aiming bracket 804 may include a front flat portion 816, and the first angle indicator 902a may extend to the front flat portion of the first aiming bracket. This may not be the case in other embodiments of the present disclosure. For example, the first angle indicator 902 may not extend that far as will be discussed in further detail momentarily herein. In such a case, a straight edge, a magnetic compass, etc. may be employed to read the angle or the angle markings may extend to or on the top surface of the aiming bracket to the angle indicator.

Referring back to FIG. 59, the first crossarm member (e.g. see 802a) may define a round swivel aperture 818 defining an axis of rotation (may be the same as the second axis 812 when the knuckle is attached to the crossarm member), and a first mounting aperture 820 disposed away from the round swivel aperture 818 about the axis of rotation. More specifically, a second mounting aperture 820a may be disposed about the axis of rotation, forming a circular array with the first mounting aperture 820 about the axis of rotation (e.g., a 180 degrees interval between the first and second mounting apertures may be provided). Similarly, a third mounting aperture 820b, and a fourth mounting aperture 820c may define a rectangular pattern 822 (see center instance of mounting apertures) centered about the axis of rotation along with the first and second mounting apertures 820, 820a. The side instances of the mounting apertures have a square pattern 824. Other patterns and arrays are possible. As shown, only two diagonally oriented mounting apertures are typically used but more or less mounting apertures may be used with fasteners for securing the aiming bracket and the aiming plate to a structural member such as a crossarm member, etc.

Figure 59:
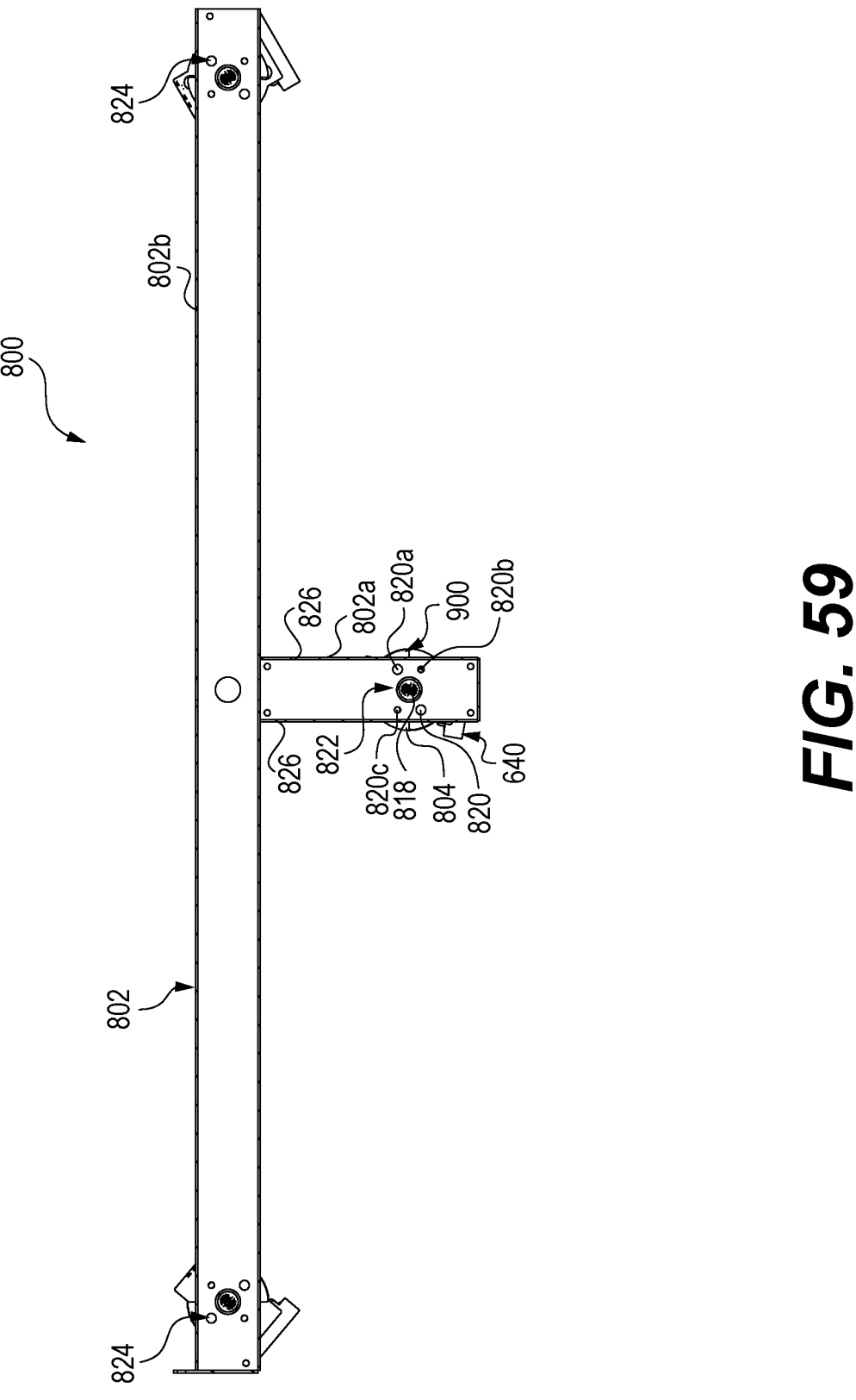
FIG. 59 is a top sectional view of the main crossbeam and the auxiliary crossbeam of FIG. 58, revealing the mounting holes and the mounting hardware used to attach the aiming brackets to the crossbeams. The middle aiming bracket is disposed at about a 10 degree angle relative to a direction that is orthogonal to the main crossbeam, the right aiming bracket is at about a 30 degree angle relative to a direction that is orthogonal to the main cross beam, and the left aiming bracket is at about a 40 degree angle relative to a direction that is orthogonal to the main crossbeam.

As understood by looking at FIG. 59 together with FIG. 60, the first aiming plate 900 may define a pair of parallel sides 904 that are flush to recessed relative to a pair of side surfaces 826 of the first crossarm member. Similarly, statements may be made concerning the second aiming plate 900a and the main cross arm 802b, etc.

Figure 61:
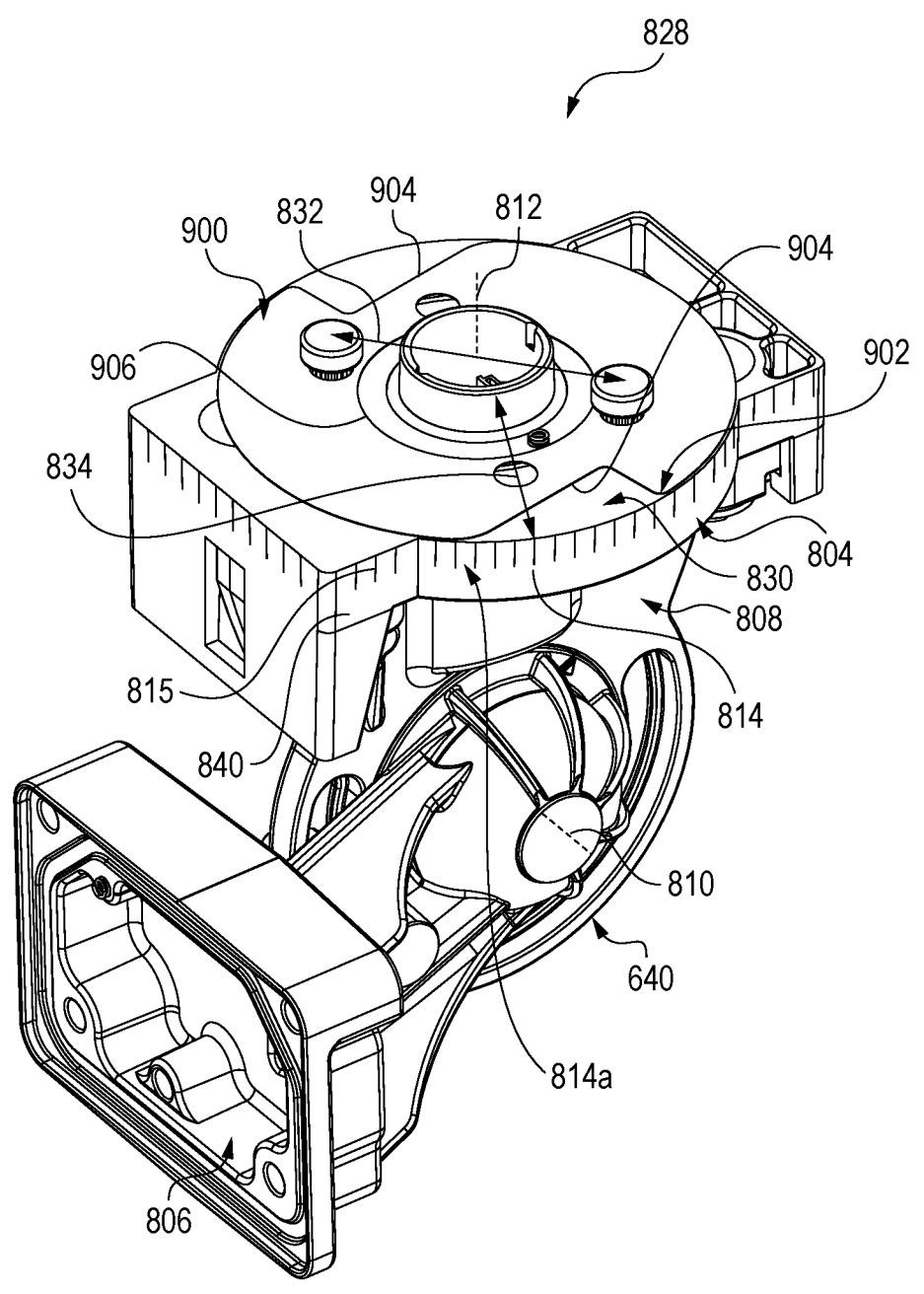
FIG. 61 is a perspective view of the middle aiming bracket, the knuckle, the mounting hardware, and the middle aiming plate shown in isolation.
Figure 62:
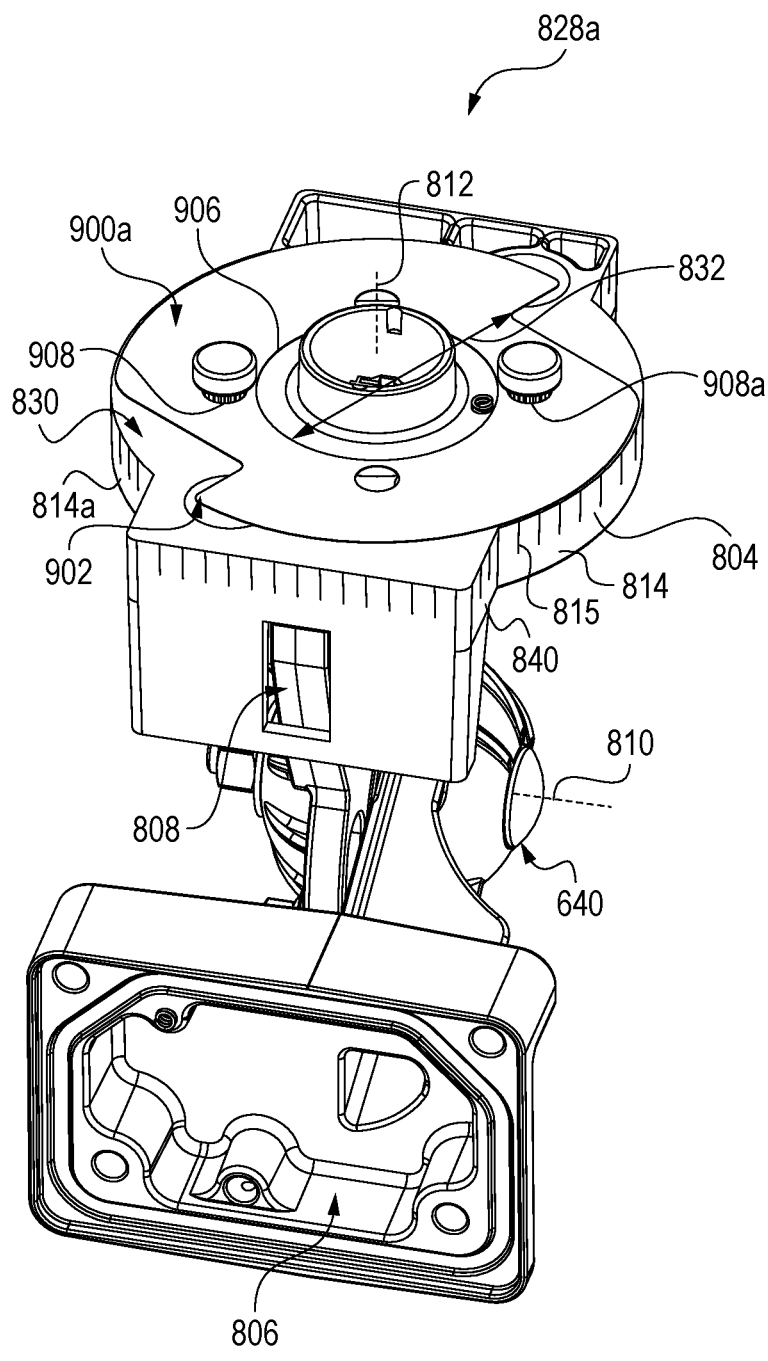
FIG. 62 is a perspective view of the right aiming bracket, the knuckle, the mounting hardware, and the right aiming plate shown in isolation.
Figure 63:
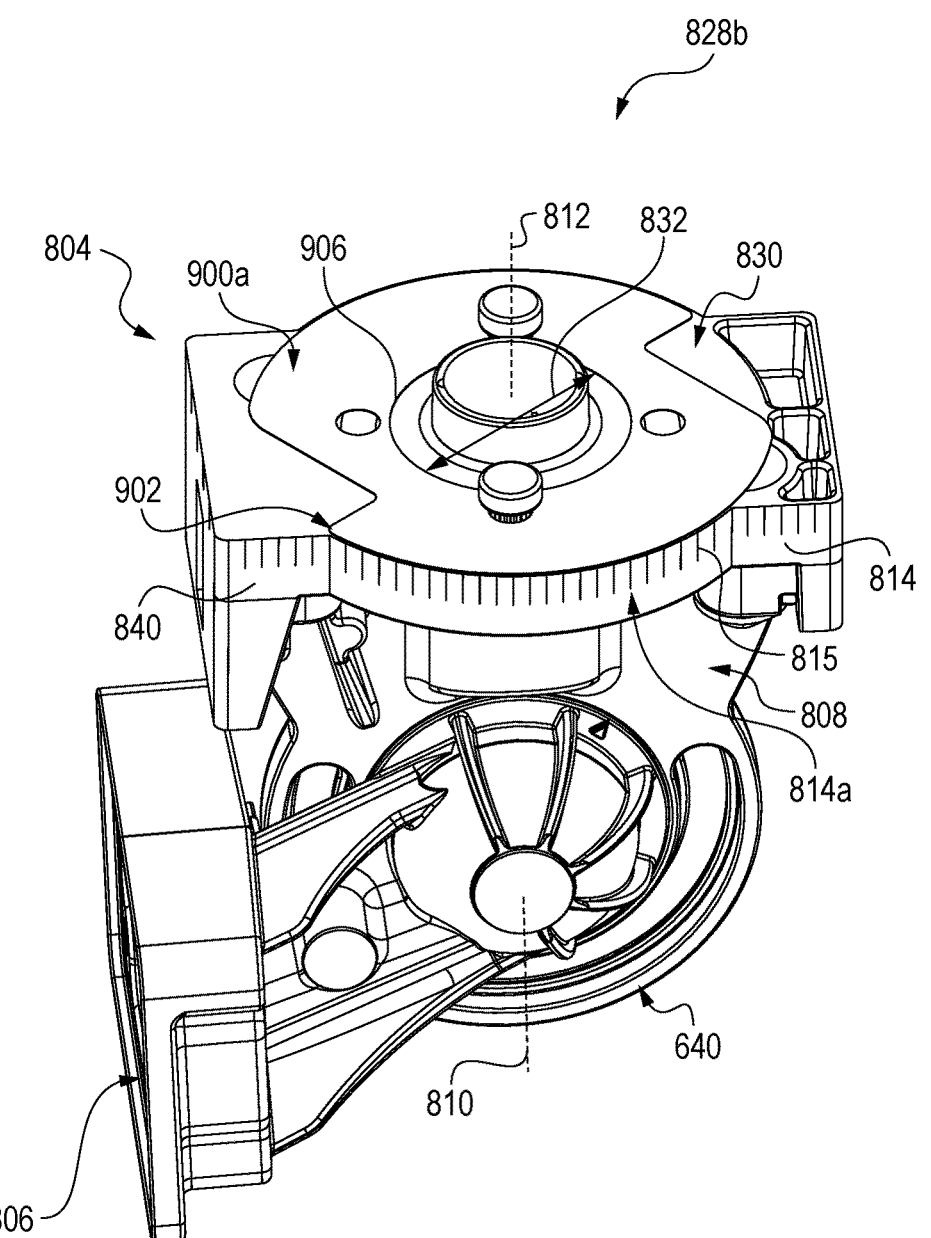
FIG. 63 is a perspective view of the left aiming bracket and the left aiming plate shown in isolation.

An aiming bracket and an aiming plate assembly 828, 828a, 828b that may be provided for a retrofit in the field will now be described with reference to FIGS. 60 thru 73. As best seen in FIGS. 61 thru 63, this assembly 828, 828a, 828b may comprise an aiming bracket 804 including an outer circular portion 830 defining a circular axis (may be coincident with the second axis 812), and a radial direction 832. The outer circular portion 830 may include a circular periphery 814a that is spaced a first radial distance 834 (see also FIG. 64) from the circular axis.

Figure 64:
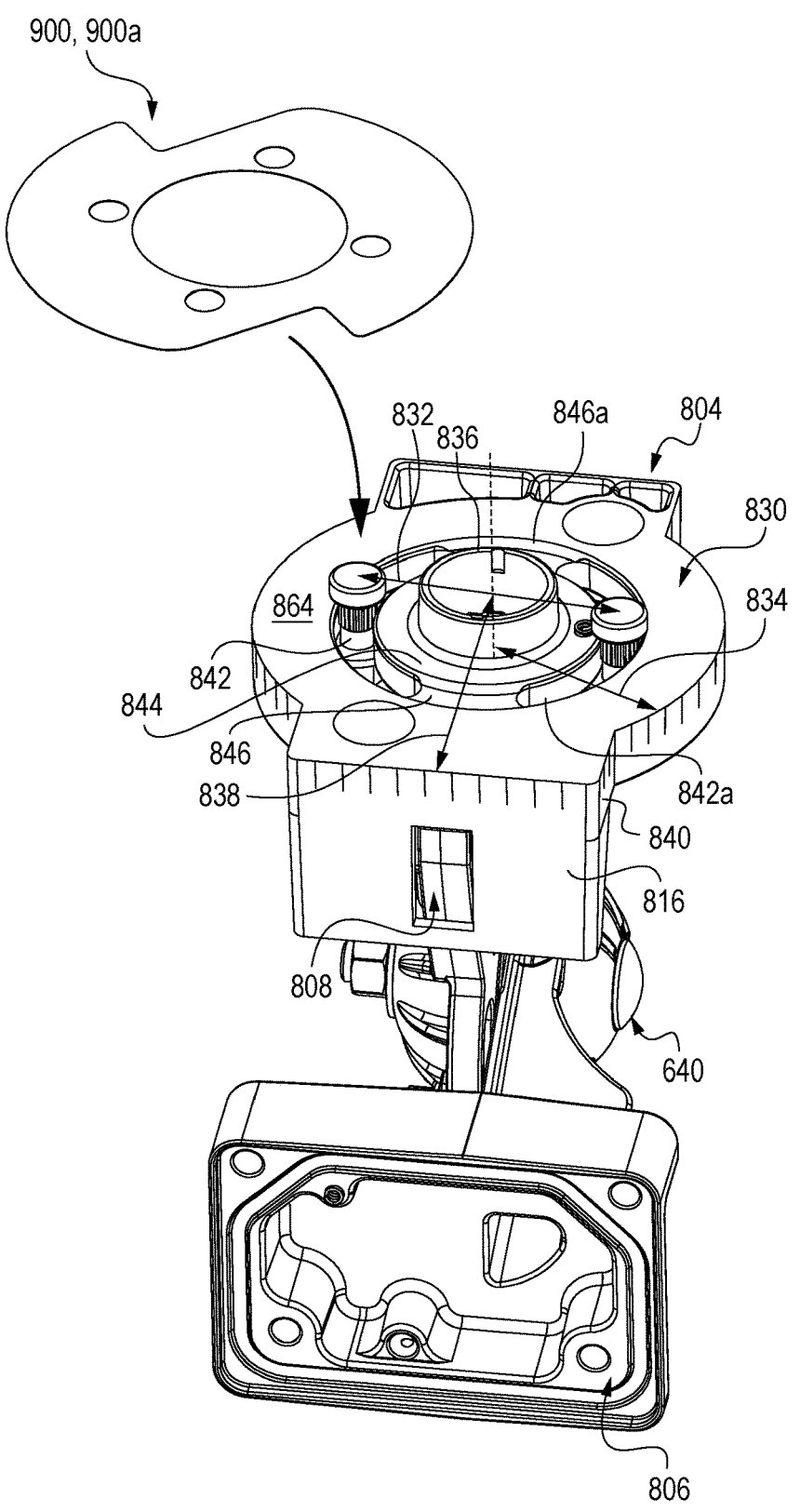
FIG. 64 is a perspective view of the middle aiming bracket and the middle aiming plate of FIG. 61 shown in isolation.

Still referring to FIG. 64, an annular boss 836 may be centered on the circular axis, while the front flat portion 816 may be spaced a second radial distance 838 from the circular axis that is greater than the first radial distance 834. As seen in FIGS. 61 thru 63, the aiming plate 900, 900a may define an annular boss receiving aperture 906, and a first fastener receiving aperture 908, 908a that is spaced radially away from the annular boss receiving aperture 906.

Still referring to FIGS. 61 thru 63, the circular periphery 814a may include a plurality of angle markings 815 as mentioned earlier herein, and the aiming plate 900, 900a may include an angle indicator 902 extending to the circular periphery 814a. In addition, the front flat portion 816 may include a plurality of angle markings 815. To facilitate use of these angle markings, the angle indicator 902a of aiming plate 900b may extend all the way to the flat front portion 816 in FIG. 72, but not necessarily so. Also, a flank surface 840 may join the outer circular portion 830 to the front flat portion 816 that also includes a plurality of angle markings 815 so that a full range of angles from 0 to 90 degrees or from 0 to 180 degrees may be measured. This may not be the case in other embodiments of the present disclosure. Also, the angle markings may be on the top surface of the aiming bracket.

Looking at FIGS. 62 and 64 together, the aiming bracket 804 may define a first arcuate slot 842, and the first fastener receiving aperture 908 of the aiming plate 900a may be disposed above the first arcuate slot 842 to allow a fastener to pass therethrough. Likewise, the aiming bracket 804 defines a second arcuate slot 842a, and the aiming plate 900a further defines a second fastener receiving aperture 908a that is disposed above the second arcuate slot 842a.

In FIG. 64, the aiming bracket 804 may include a central hub 844 at least partially defined by the first arcuate slot 842 and the second arcuate slot 842a. The annular boss 836 may extend form the central hub 844. The central hub 844 may be joined to the front flat portion 816, and the outer circular portion 830 by a first web portion 846, and a second web portion 846a. Both the first web portion 846, and the second web portion 846a may at least partially define the first arcuate slot 842, and the second arcuate slot 842a. This may not be the case in other embodiments of the present disclosure.

Figure 65:
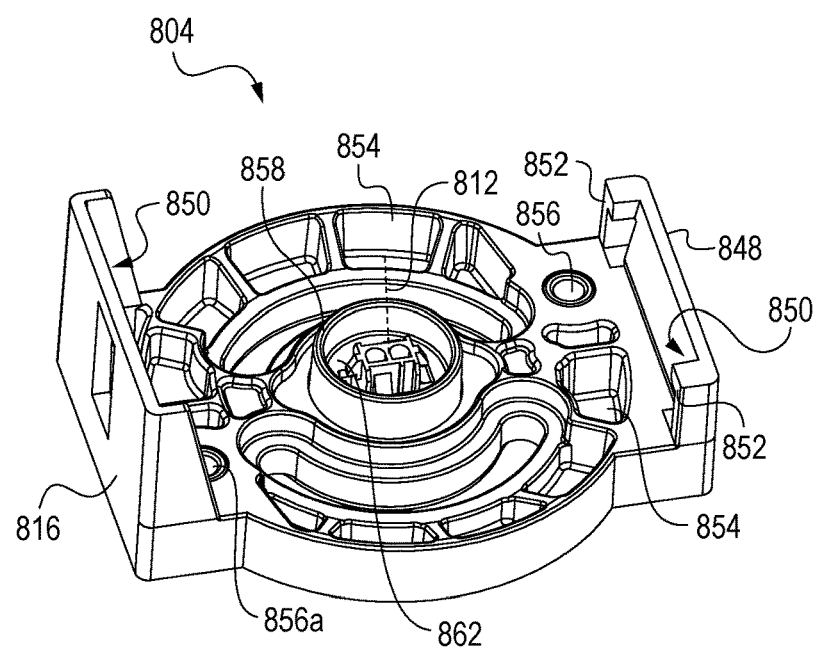
FIG. 65 is a bottom oriented perspective view of the aiming bracket of FIG. 61 shown by itself.
Figure 66:
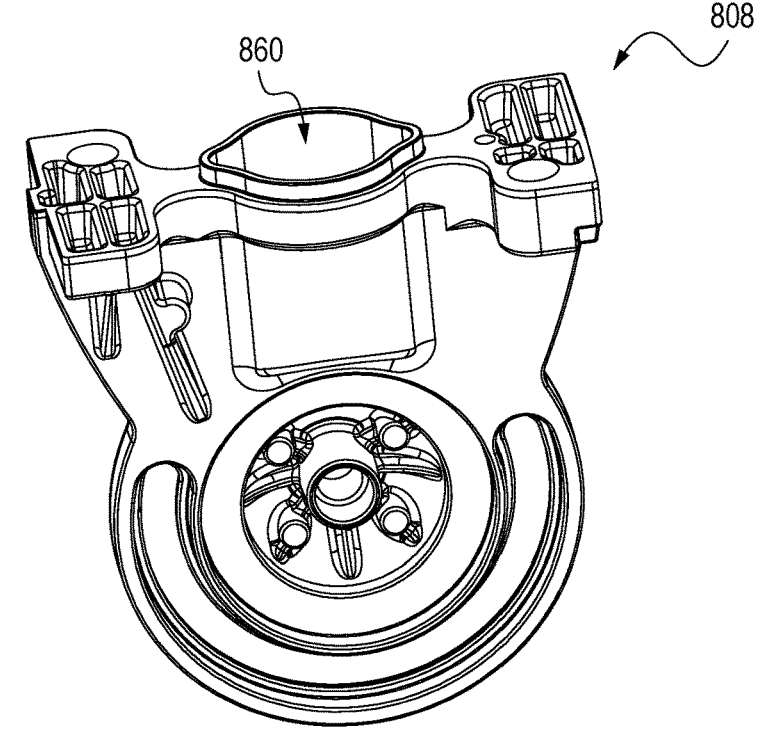
FIG. 66 is a top oriented perspective view of the top portion of the knuckle of FIG. 61 shown in isolation.

Turning now to FIG. 65, the aiming bracket 804 may further comprise a rear flat portion 848 that together with the front flat portion 816 may define a rectangular pocket 850 that is configured to receive the upper knuckle portion 808 of the knuckle 640. More particularly, the rear flat portion 848 of the aiming bracket may define an undercut(s) 852 that is configured to receive and vertically trap the upper knuckle portion 808 of the knuckle 640. This may not be present in other embodiments of the present disclosure. Also, the aiming bracket 804 may define a plurality of core out recesses 854 that are disposed radially about the first arcuate slot 842, and the second arcuate slot 842*a*. This may allow the nominal wall thickness of the aiming bracket to be suitably maintained to avoid porosity, voids, or other manufacturing issues associated with the casting process.

In order to fasten the knuckle to the aiming bracket, the aiming bracket 804 may define a first fastener receiving hole 856, and a second fastener receiving hole 856*a* spaced 180 degrees from the first fastener receiving hole 856 about the circular axis (or second axis 812). While these holes are shown to be smooth and empty, it is be understood that a threaded inserted may be pressed into these holes for allowing the knuckle to be fastened to the aiming bracket. An annular cylindrical pilot portion 858 may be provided that is configured to fit within a cavity 860 (see FIG. 66) of the upper knuckle portion 808 of the knuckle 640. An electrical connector receiving aperture 862 may be disposed inside the annular cylindrical pilot portion 858 for receiving a female connector (not shown) that mates with a male connector (not shown), or vice versa of the knuckle that allow for a quick electrical connection.

In some embodiments, the aiming plate 900, 900*a* is affixed to a top surface 864 (see FIG. 64) of the aiming bracket 804 by fastening, adhering (e.g., by a weak glue that is commonly sold for non-industrial applications such as white glue, wood glue, etc.). In such a case, the angle indicator(s) may be omitted but not necessarily so.

Various embodiments of an aiming plate will now be discussed with reference to FIGS. 67 thru 71, and 73. The plate may be manufactured from sheet metal such as aluminum, stainless steel, etc. and may have a thickness ranging from 0.010 of an inch (similar to a shim) to 0.125 of an inch.

Figure 67:
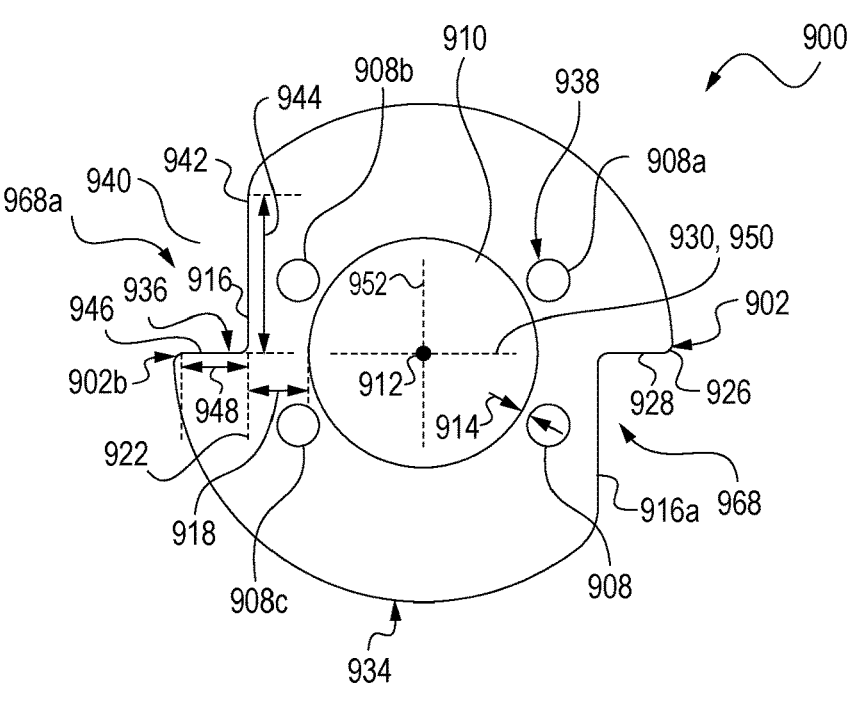
FIG. 67 is a top view of an aiming plate such as the one used with the middle aiming bracket of FIG. 61 shown by itself.
Figure 68:
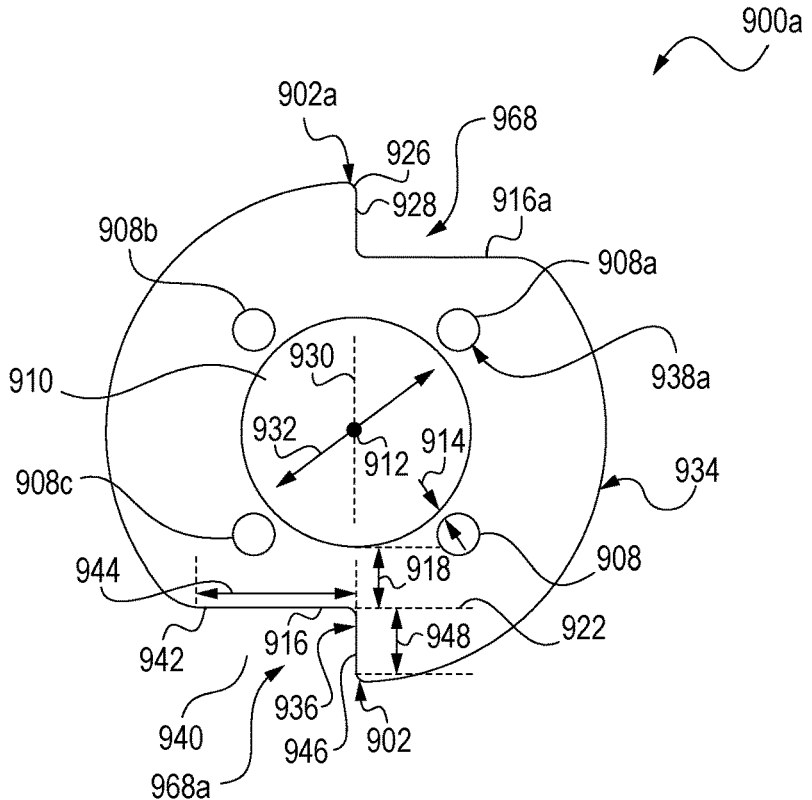
FIG. 68 is a top view of an aiming plate such as used with the right and left aiming brackets of FIGS. 62 and 63 shown by itself.
Figure 73:
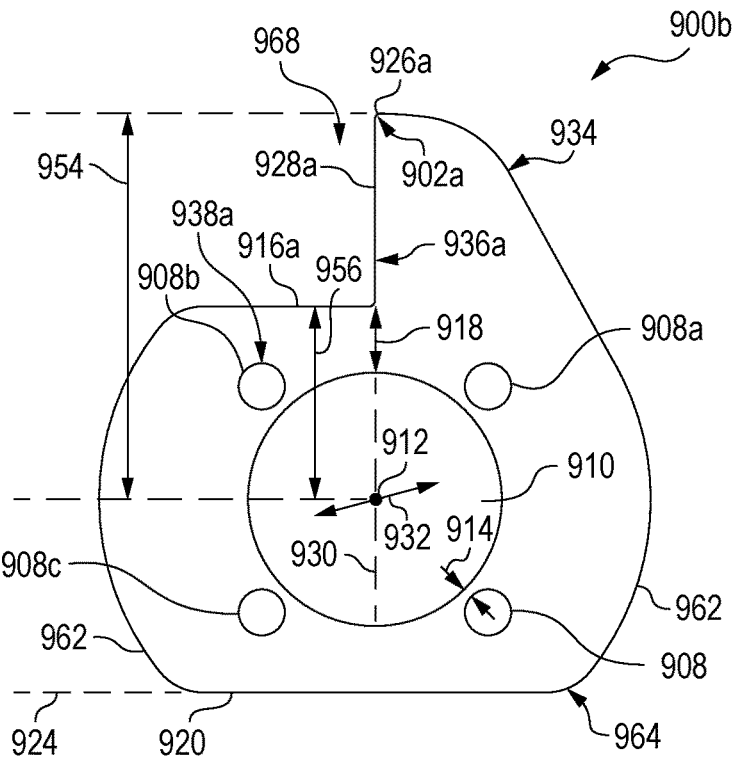
FIG. 73 is a top view of the aiming plate of FIG. 72 shown by itself.

An aiming plate 900, 900*a*, 900*b* according to an embodiment of the present disclosure in FIGS. 67, 68, and 73, etc. may comprise a central hole 910 defining a central axis 912 as well as a mounting hole (e.g., see first fastener receiving aperture 908) disposed about the central axis 912 and away from the central hole 910 a first minimum distance 914. A first straight surface 916, 916*a* that is spaced away from the central hole 910 a second minimum distance 918 that is larger than the first minimum distance 914. Also, a second straight surface 920 may be provided that is parallel to the first straight surface 916. The first straight surface 916 and the second straight surface 920 may define a first plane 922 and a second plane 924 respectively that do not intersect the central axis 912.

As alluded to earlier herein, FIGS. 67, 68 and 72 shows an angle indicator 902, 902*a* that extends from the first straight surface 916, 916*a* to a radial extremity 926, 926*a* of the aiming plate. Furthermore, the first angle indicator 902, 902*a* includes a third straight surface 928, 928*a* that defines a plane 930 that intersects the central axis 912.

In FIGS. 67 and 68, a second angle indicator 902*b* may be provided that extends from the second straight surface 920 to a radial extremity of the aiming plate 926. The second angle indicator may also include a fourth straight surface 928*a* that defines the same plane 930 as the third straight surface 928 (but not necessarily so) that intersects the central axis 912. The first and second angle indicators may be arranged as a circular array about the central axis, having the same configuration but not necessarily so.

As illustrated in FIGS. 67, 68, and 73, an aiming plate 900, 900*a*, and 900*b* configured according to another embodiment of the present disclosure may define a central circular hole (e.g., see central hole 910) defining a central axis 912, and a radial direction 932, a first mounting hole (e.g., see first fastener receiving aperture 908) disposed about the central axis 912 and away from the central circular hole a first minimum distance 914, and a second mounting hole (e.g., see second fastener receiving aperture 908*a*) disposed about the central axis 912 and away from the central circular hole the same first minimum distance 914 (i.e., within a manufacturing tolerance of 0.010 of an inch). The aiming plate 900, 900*a*, 900*b* may further define a radially varying outer perimeter 934 including an angle indicator 902, 902*a*, 902*b* with a substantially radially extending surface 936, 936*a*. That is to say, this surface 936, 936*a* may form an angle with the radial direction that is less than 45 degrees but may approach more or less purely radially extending (+/−5.0 degrees) in some embodiments of the present disclosure.

In many embodiments of the present disclosure, a third mounting hole (e.g., a third fastener receiving aperture 908*b*), as well as a fourth mounting hole (e.g., a fourth fastener receiving aperture 908*c*), forming a rectangular array 938 (e.g., see FIGS. 67, 69, etc.) centered about the central axis 912. In further embodiments, the rectangular array is actually a square array 938*a* as shown in FIGS. 68, 70, and 73.

In FIGS. 67 and 68, the radially varying outer perimeter 934 may include a first notch 940 defined by a first segment 942 defining a first segment length 944, and a second segment 946 defining a second segment length 948 that is less than the first segment length 944. In FIG. 67, the rectangular array 938 may define a major axis 950, and a minor axis 952 with the minor axis 952 being parallel to the first segment 942. In other embodiments, the minor axis may be parallel to the second segment, etc.

In FIG. 73, the radially varying outer perimeter 934 may include a first angle indicator 902*a* defining a radial extremity 926*a* that is spaced a first minimum radial distance 954 from the central axis 912, and a first flat surface (e.g., see 916*a*) that is spaced a second minimum radial distance 956 from the central axis 912. A ratio of the first minimum radial distance 954 to the second minimum radial distance 956 may range from 1.75 to 2.25 (e.g., about 2.0). In FIGS. 67 and 68, this ratio may range from 1.2 to 1.6 (e.g., about 1.4).

An aiming plate 900*c*, 900*d*, and 900*e* configured according to yet another embodiment of the present disclosure may be described as follows starting with FIGS. 69 thru 71. Such an aiming plate 900*c*, 900*d*, and 900*e* may comprise a central circular hole 910*a* defining a central axis 912, and a radial direction 932. Also, an array of mounting holes 958 (e.g., see FIG. 71) may be disposed about the central circular hole 910*a*. An outer perimeter 960 of the aiming plate may including a pair of arcuate surfaces 962, and a pair of parallel surfaces 964. A similar description may be made for the aiming plates of FIGS. 67, 68, and 73.

Figure 71:
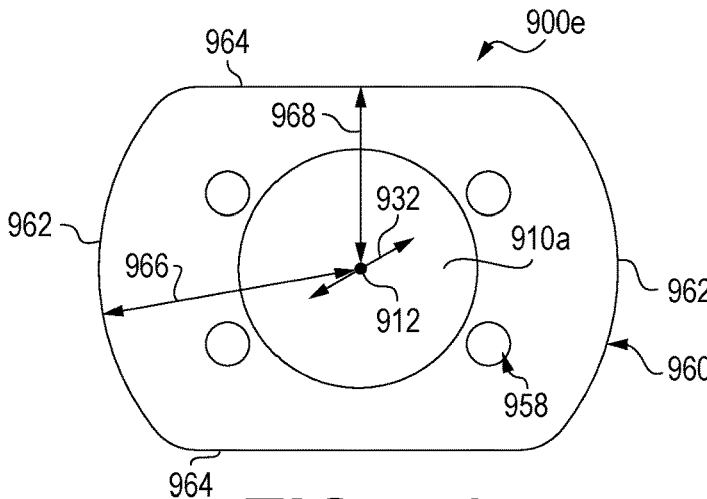
FIG. 71 is yet another embodiment of an aiming plate lacking an angle indicator that may be used with other vintage crossarms or at other locations of a crossarm not explicitly disclosed herein.

As best seen in FIG. 71, the pair of arcuate surfaces 962 may define a radius of curvature 966 measured from the central axis 912 to the pair of arcuate surfaces 962, and the pair of parallel surfaces 964 may be spaced away from the central axis a minimum radial dimension 968. A ratio of the radius of curvature to the minimum radial dimension ranges from 1.1 to 1.4 (e.g., about 1.25) in some embodiments of the present disclosure. In such a case, the radius of curvature may range from 2.25 inches to 2.75 inches in some embodiments. Again, similar statements may be made for the aiming plates of FIGS. 67, 68, and 73 in certain embodiments of the present disclosure.

Figure 69:
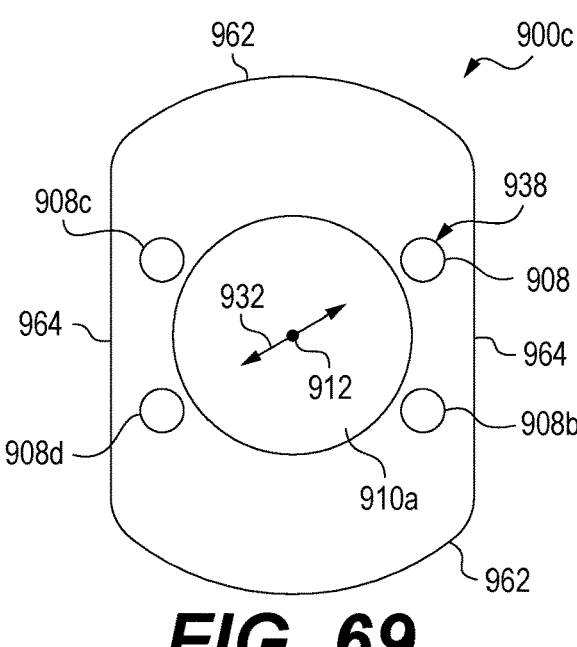
FIG. 69 is a top view of an aiming plate that is similarly or identically configured as that of FIG. 67 except that the angle indicator has been removed according to another embodiment of the present disclosure.
Figure 70:
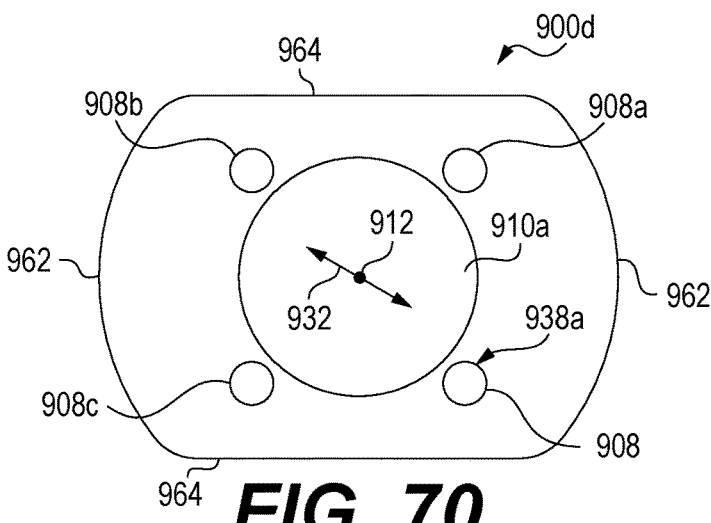
FIG. 70 is a top view of an aiming plate that is similarly or identically configured as that of FIG. 68 except that the angle indicator has been removed according to another embodiment of the present disclosure.

In FIGS. 69 thru 71, the pair of parallel surfaces 964 extend past the central circular hole 910*a* from one of the pair of arcuate surfaces 962 to or toward the other of the pair of arcuate surfaces 962.

This is not the case for the embodiments of FIGS. 67, 68, and 71. Instead, the outer perimeter (e.g., see 934) includes a first L-shaped cutout 968 and/or a second L-shaped cutout 968a. These cutouts may form a circular array about the central axis 912, but not necessarily so.

In FIG. 73, one of the pair of parallel surfaces 964 extends past the central circular hole 910 from one of the pair of the arcuate surfaces 962 to or toward the other of the pair of arcuate surfaces 962 while the other of the pair of parallel surfaces (e.g., see 916a) extends to an angle indicator 902a. The angle indicator may include a flat surface (e.g., see 928a) extending to a radial extremity 926a of the outer perimeter as alluded to earlier herein.

In FIG. 73, the radial extremity 926a is spaced away from the central axis 912 a maximal radial distance that is greater than the radius of curvature of the pair of arcuate surfaces. This is not the case in FIGS. 67 and 68.

INDUSTRIAL APPLICABILITY

In practice, one or more of the following components, assemblies, or subassemblies may be provided initially at the first point of sale in an original equipment manufacturer (OEM) context, or as a replacement part or substitutable part in an aftermarket context: a self-contained ballast drive assembly, a circuit board and heat sink assembly, a loose wiring end bracket, a LED luminaire, a lens, an optic, a diffuser, a visor, an electrical/electronic component enclosure, an aiming plate, an aiming bracket and aiming plate assembly, and an aiming plate, etc.

Before the retrofitting process, it may be desirable to check to see if older components are still working properly or if they are within desirable operating parameters. FIG. 74 illustrates such a method 6000 that may include the steps of testing the ballast(s) to see if it has an open circuit 6002, and/or if the capacitor(s) (e.g., the capacitor bank 116 in FIG. 7) have the desired capacitance 6004. Other vintage components may also be tested, horizontal and/or vertical aiming directions of the luminaires may be determined and recorded, etc.

During the retrofitting process or the initial installation, various methods may be employed. For example, with reference to FIGS. 5, 7 and 24, the power supplied to the LED luminaires may be adjusted using an apparatus already installed for adjusting the power to the previous HID luminaires to compensate for loss of luminosity associated with such HID lights over time.

As shown in FIG. 75, a method 1000 of retrofitting a HID lighting system with a LED lighting system may comprise disconnecting a motor of a cam motor assembly from a power source 1002. For example, the motor may be disconnected from an incoming power line, a battery, etc. Since LED lights are not prone to a substantial decrease in luminosity over time, it is not necessary for the motor to rotate the cams to adjust the capacitance and the resulting power supplied to the LED lights. Instead, the user may rotate a wheel, slide a switch, rotate a lever as mentioned earlier herein, switch out capacitors, etc. to change the capacitance supplied to a power supply line 1004. This may be done manually by the user depending on the needed wattage for the LED lights, etc. A LED luminaire may also be connected to the power supply line 1006, etc. This method and apparatus may not be used or present in other embodiments of the present disclosure. Also, the order of these steps may vary.

Figure 76:
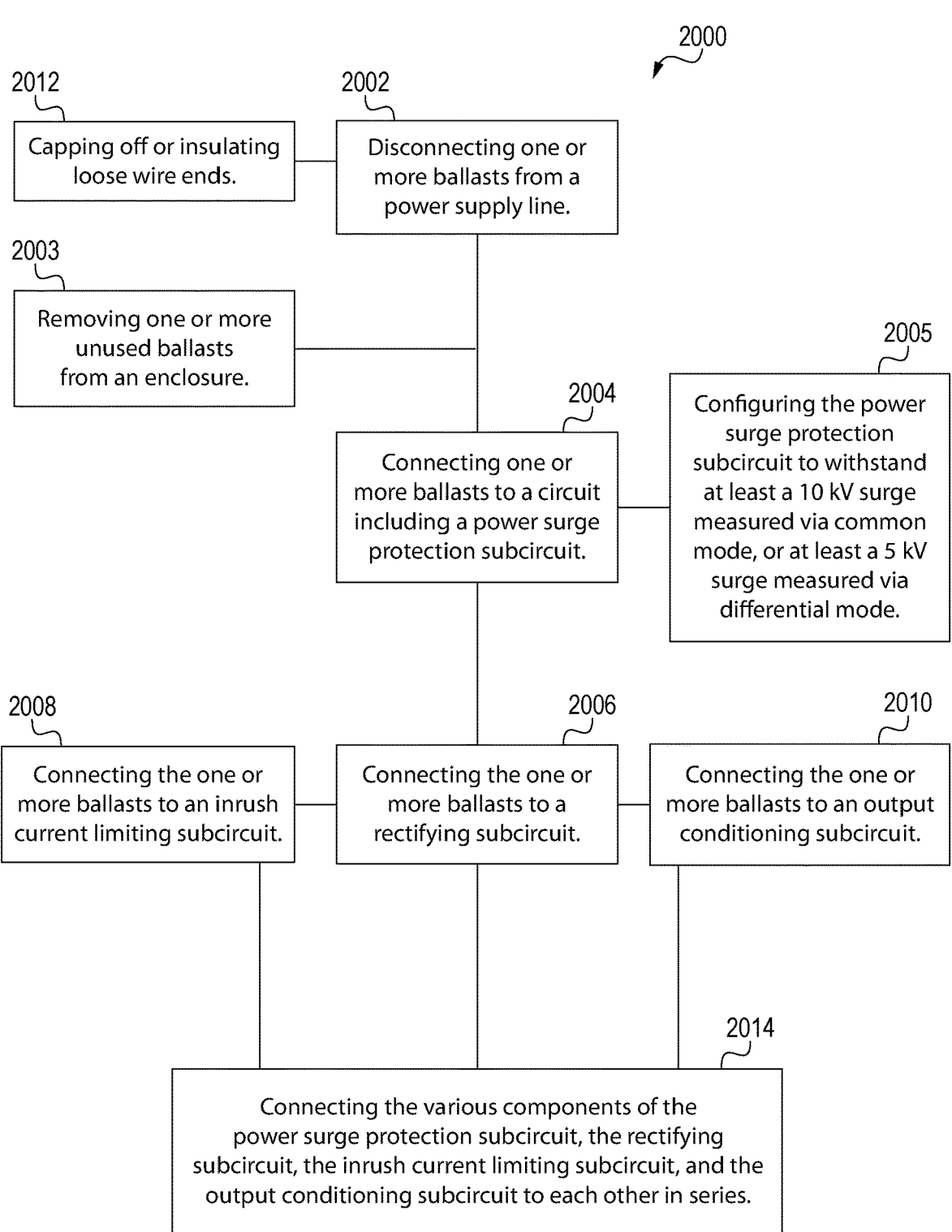
FIG. 76 illustrates a method of retrofitting a HID lighting system with a LED lighting system according to an embodiment of the present disclosure.

In various embodiments, the method 2000 of retrofitting a HID lighting system with a LED lighting system such as disclosed in FIG. 76 may be used. The method 2000 may comprise disconnecting one or more ballasts from a power supply line 2002 such as those already in an ECE, etc. Loose wires may result, so the ends of these wire wires may be capped off 2012 using a wire end bracket as disclosed earlier herein, a wire nut, etc. so as to insulate or otherwise prevent a short circuit, etc. Unused ballasts may be removed 2003.

Also, the method 2000 may comprise connecting one or more ballasts to a circuit including a power surge protection subcircuit 2004. In certain embodiments, the power surge protection subcircuit may be configured to withstand a 10 kV surge measured via a common mode, or a 5 kV surge measured via a differential mode (or at least a 6 kV surge measured via a differential mode, see 2005). This may protect the circuit from a near lightning strike or the like, etc. This may not be the case in other embodiments of the present disclosure. In yet further embodiments, a 10 kV surge measured via a differential mode may be withstood. This may not be the case in other embodiments of the present disclosure.

Similarly, the method 2000 may further comprise connecting the one or more ballasts to a rectifying subcircuit 2006 (so as to convert from AC current to essentially DC current), connecting the one or more ballasts to an open circuit protection subcircuit 2008 (so as to protect the various components of the circuit from being overloaded, burnt out, etc.), and connecting the one or more ballasts to an output conditioning subcircuit 2010 (so as to reduce ripple, which in turn reduces the flicker effect that some LED lighting systems experience upon startup). One or more of these subcircuits may be omitted in other embodiments of the present disclosure.

In some embodiments, the power surge protection subcircuit, the rectifying subcircuit, the open circuit protection subcircuit, and the output conditioning subcircuit are connected to each other in series 2014. This may not be the case in other embodiments of the present disclosure.

Turning now to FIG. 77, a method for assembling an enclosure about a circuit board with a heat sink is disclosed. Such a method 3000 may comprise creating a flat pattern of a first enclosure member that includes at least one aperture that is configured to receive a portion of the heat sink or the circuit board 3002, and folding the first flat pattern of the first enclosure member until the heat sink or the circuit board are received into the at least one aperture and/or sliding the circuit board and the heat sink until the circuit board and the heat sink are received into the at least one aperture 3004. In some embodiments, the first enclosure member is first folded, and then the circuit board and heat sink are slid into the appropriate slits or apertures.

For example, the folding may first occur forming ears (such as the first side circuit board mounting portion, and the second side circuit board mounting portion previously discussed herein) that are flexible and then sliding the circuit board until the circuit board with its mounting tab(s) and the heat sink are received into one or more apertures of these ears.

Then, a second enclosure member may be attached to the first enclosure member 3006. For example, the second enclosure member may be attached to the outside of the first enclosure member, removing the flexibility of the ears so that the circuit board and/or heat sink are now trapped in the first enclosure member securely.

To aid in manufacturing, the second enclosure member may also be a folded member 3008. Also, the second enclosure member may first be manufactured as a second flat pattern with a plurality of apertures stamped out of the second flat pattern 3010. After this enclosure is assembled, the heat sink may be proud of the enclosure to maximize heat transfer after being installed into the ECE. That is to say, contact between the heat sink and the enclosure (with possibly a thermally conductive but electrically insulating material disposed therebetween) is with a slight gap between the enclosure and the ECE. Other forms of manufacture other than forming sheet metal may be employed.

Figure 78:
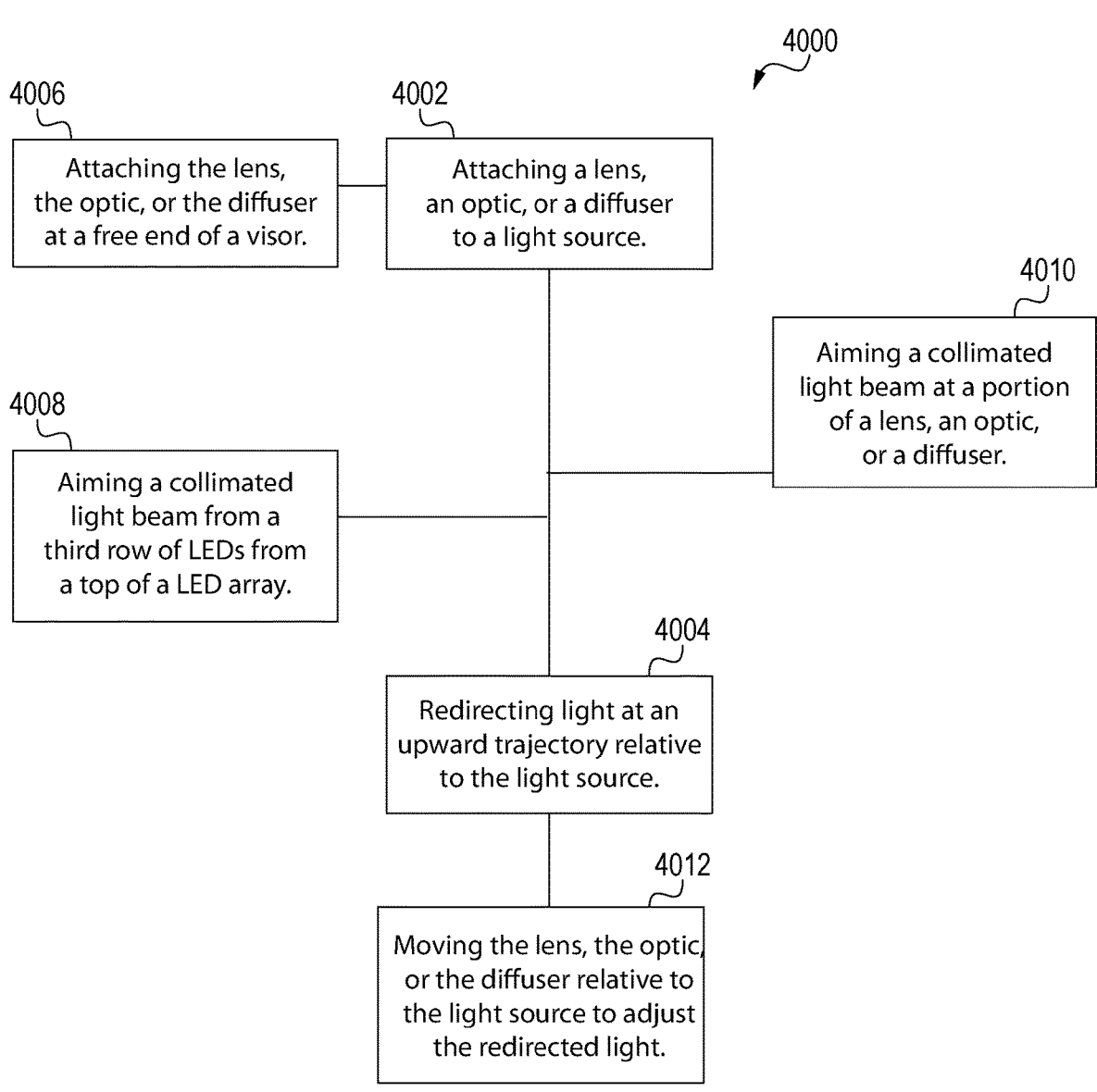
FIG. 78 shows a method for creating uplight using a lens, an optic, or a diffuser according to an embodiment of the present disclosure.

When uplight is desired, then another method as depicted in FIG. 78 may be employed to provide that uplight so that sports balls or the like can be seen at night.

Such a method 4000 may comprise attaching a lens, an optic, or a diffuser to a light source 4002 (e.g., a laser, a LED(s) but not necessarily so) and redirecting light at an upward trajectory relative to the light source 4004.

Attaching the lens, optic, or diffuser may involve attaching the lens, optic, or diffuser at a free end of a visor 4006, and the method may further comprise aiming a collimated light beam (e.g., a NEMA type 3 standard light beam) at a portion of a lens, an optic, or a diffuser 4008. In specific embodiments of the present disclosure, a collimated light beam may be emitted or aimed from a third row of LEDs from a top of a LED array 4010. Other rows or locations for the collimated light beam may be used in other embodiments of the present disclosure. Also, the method may further include moving the lens, the optic, or the diffuser relative to the light source to adjust the redirected light 4012. For example, the lens, the optic, or the diffuser may be lowered to redirect more light upwardly, or if less uplighting is desired, the lens, the optic, or the diffuser may be raised. The angle of the lens, the optic, or the diffuser relative to the light may also be adjusted to vary the uplighting, etc. If a lens or diffuser is used, there may not be a gap between downlighting and uplighting. Rather, a gradual transition may be provided between the downlighting and the uplighting.

In some embodiments, there may be a combination of LED retrofit luminaires with existing HID lighting systems. For example, in some cases it may be easier or more economical to replace failed HID lamps with LED luminaires which are less prone to be relamped. This may be done in lieu of using screwed in LED lamps because the light level and distribution from a LED luminaire can more readily match that of a HID lamp, whereas a screwed in LED lamp cannot.

In other variants of the present disclosure, instead of using a lens, an optic, or a diffuser, a reflector such as disclosed in U.S. Pat. No. 10,337,693 may be employed. In addition, an uplight fixture such as disclosed in U.S. Pat. No. 8,952,628 or U.S. Pat. No. 10,337,680 may be used (in such a case, one of the ballast drivers may be used to power the fixture), a sharp cutoff LED lighting fixture such as disclosed in U.S. Pat. Nos. 10,267,491 and 10,378,732, etc.

In some applications, it is desirable or needed to set the horizontal aiming angle of a knuckle and/or a light luminaire. It may be easier to aim the knuckle first and attach the light fixture later, but not necessarily so.

Such a method 5000 is depicted in FIG. 79 and may comprise rotating an aiming plate having a mounting hole relative to an aiming bracket until a desired relative angular orientation is established between the aiming plate and the aiming bracket 5002. This may be accomplished manually or automatically, at the factory or in the field.

In some embodiments, the method 5000 may further comprising affixing the aiming plate to the aiming bracket 5004. For example, the plate may be fastened to the bracket. Alternatively, this could include adhering the aiming plate to the aiming bracket 5006. These steps may allow the use of an angle indicator to be omitted, but not necessarily so.

In some embodiments of the present disclosure, the method 5000 may further comprising measuring the relative angular orientation using an angle indicator to read an angle measurement on the aiming bracket 5008.

At some point, the method 5000 may further include inserting a fastener that is engaging a structural member through the mounting hole of the aiming plate and a slot of the aiming bracket 5010. As understood with reference to FIGS. 59 and 62, the fasteners may have a knurled profile that engages the holes of the crossarm or other structural member, preventing their rotation.

After the free end of the fastener extends through the aiming plate and the aiming bracket, the method of FIG. 79 may further comprise tightening the fastener, securing the aiming bracket and the aiming plate to the structural member 5012. For example, a nut may be rotated onto the threads extending from a free end of the bolt until sufficient torque has been attached.

Once the appropriate angle of the aiming bracket has been set, then the method 5000, may further comprise attaching a knuckle and/or a light luminaire to the aiming bracket 5014. The knuckle and/or the light luminaire may already be attached to the aiming bracket while the angle is being set, or not.

In some applications, the purpose of the aiming plate is to preaim the fixture at the factory. This may make installation easier and may improve accuracy to the lighting design intended by the application engineer.

Further variants or embodiments of the present disclosure may include providing or using an ECE using a Musco® LED driver, a Schiedewerks LED driver, or an Inventronics® 880 W LED driver.

In such a case, a self-contained ballast driver and/or associated circuit(s) may not be needed. Also, with one or more of these commercially available drivers, extra functionality may be available such as light shows, and/or light with audio shows, Control-Link®, light dimming, etc.

It is to be recognized that depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially.

An LED driver or controller may be programmed to provide various theatrical and lighting effects. In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples of the disclosure have been described. Any combination of the described systems, operations, or functions is contemplated. These and other examples are within the scope of the following claims.

What is claimed is:

1. A self-contained ballast driver assembly comprising:
a circuit board; and
an enclosure surrounding the circuit board, the enclosure including
a five-sided cover; and
a three-part mounting bracket;
wherein the five-sided cover includes a front panel defining a plurality of connector receiving windows, a top panel defining a plurality of vent openings, a bottom panel defining a plurality of vent apertures, a first side panel defining a plurality of first side apertures, and a second side panel defining a plurality of second side apertures.

2. The self-contained ballast driver assembly of claim 1, wherein the top panel includes a first pair of attachment flanges extending down from the top panel defining a first pair of attachment apertures, and the bottom panel includes a second pair of attachment flanges extending upwardly from the bottom panel defining a second pair of attachment apertures.

3. The self-contained ballast driver assembly of claim 1, wherein the top panel is connected to the front panel by a plurality of top bends.

4. The self-contained ballast driver assembly of claim 3, wherein each of the plurality of top bends are separated by a top cutout.

5. The self-contained ballast driver assembly of claim 1, wherein the bottom panel is connected to the front panel by a plurality of bottom bends.

6. The self-contained ballast driver assembly of claim 5, wherein each of the plurality of bottom bends are separated by a bottom cutout.

7. The self-contained ballast driver assembly of claim 1, wherein the three-part mounting bracket includes a first side circuit board mounting portion, a second side circuit board mounting portion, and a top enclosure attachment portion connecting the first side circuit board mounting portion to the second side circuit board mounting portion.

8. The self-contained ballast driver assembly of claim 7, wherein the first side circuit board mounting portion includes a first pair of cover mounting holes and a first pair of attachment flange receiving notches disposed proximate to the first pair of cover mounting holes, and the second side circuit board mounting portion includes a second pair of cover mounting holes and a second pair of attachment flange receiving notches disposed proximate to the second pair of cover mounting holes.

9. The self-contained ballast driver assembly of claim 7, wherein the top enclosure attachment portion includes an elongated aperture and is joined to the first side circuit board mounting portion by a first side bend, and the top enclosure attachment portion is joined to the second side circuit board mounting portion by a second side bend.

10. The self-contained ballast driver assembly of claim 9, wherein the first side bend is split by a first side cutout, and the second side bend is split by a second side cutout.

11. The self-contained ballast driver assembly of claim 7, wherein the first side circuit board mounting portion defines a first circuit board receiving slit, and the second side circuit board mounting portion defines a second circuit board receiving slit.

12. The self-contained ballast driver assembly of claim 11, wherein the first side circuit board mounting portion defines a first side heat sink receiving aperture, and the second side circuit board mounting portion defines a second side heat sink receiving aperture.

13. The self-contained ballast driver assembly of claim 12, wherein the first side heat sink receiving aperture is spaced away from the first circuit board receiving slit, and the second side heat sink receiving aperture is spaced away from the second circuit board receiving slit.

14. The self-contained ballast driver assembly of claim 13, wherein the first side circuit board mounting portion defines a third circuit board receiving slit that is in communication with the first side heat sink receiving aperture, and the second side circuit mounting portion defines a fourth circuit board receiving slit that is in communication with the second side heat sink receiving aperture.

15. The self-contained ballast driver assembly of claim 13, wherein the first side heat sink receiving aperture is L-shaped, and the second side heat sink receiving aperture is L-shaped.

16. The self-contained ballast driver assembly of claim 13, further including at least a first toe that is disposed beneath the first side heat sink receiving aperture.

\* \* \* \* \*